(12) United States Patent
Yu et al.

(10) Patent No.: US 9,547,589 B2
(45) Date of Patent: Jan. 17, 2017

(54) ENDURANCE TRANSLATION LAYER (ETL) AND DIVERSION OF TEMP FILES FOR REDUCED FLASH WEAR OF A SUPER-ENDURANCE SOLID-STATE DRIVE

(71) Applicant: Super Talent Technology Corp., San Jose, CA (US)

(72) Inventors: Frank Yu, Palo Alto, CA (US); Abraham C. Ma, Fremont, CA (US); Shimon Chen, Los Gatos, CA (US)

(73) Assignee: Super Talent Technology, Corp., San Jose, CA (US)

( * ) Notice: Subject to any disclaimer, the term of this patent is extended or adjusted under 35 U.S.C. 154(b) by 120 days.

(21) Appl. No.: 14/575,872

(22) Filed: Dec. 18, 2014

(65) Prior Publication Data
US 2015/0106556 A1    Apr. 16, 2015

Related U.S. Application Data

(60) Continuation-in-part of application No. 12/475,457, filed on May 29, 2009, now Pat. No. 8,266,367, and a
(Continued)

(51) Int. Cl.
*G06F 12/00* (2006.01)
*G06F 13/00* (2006.01)
(Continued)

(52) U.S. Cl.
CPC ......... *G06F 12/0246* (2013.01); *G06F 3/0616* (2013.01); *G06F 3/0656* (2013.01);
(Continued)

(58) Field of Classification Search
CPC .. G06F 12/0246; G06F 12/08; G06F 13/1694; G06F 2212/7203; G06F 2212/7208; G06F 2212/7211; G06F 3/0608; G06F 3/0631; G06F 3/0688
(Continued)

(56) References Cited

U.S. PATENT DOCUMENTS 5,519,831 A * 5/1996 Holzhammer ...... G06F 11/1441
                                                        365/228
5,774,133 A * 6/1998 Neave ..................... G06T 17/00
                                                        345/441
(Continued)

*Primary Examiner* — Sheng-Jen Tsai
(74) *Attorney, Agent, or Firm* — Stuart T. Auvinen; gPatent LLC

(57) ABSTRACT

A flash drive has increased endurance and longevity by reducing writes to flash. An Endurance Translation Layer (ETL) is created in a DRAM buffer and provides temporary storage to reduce flash wear. A Smart Storage Switch (SSS) controller assigns data-type bits when categorizing host accesses as paging files used by memory management, temporary files, File Allocation Table (FAT) and File Descriptor Block (FDB) entries, and user data files, using address ranges and file extensions read from FAT. Paging files and temporary files are never written to flash. Partial-page data is packed and sector mapped by sub-sector mapping tables that are pointed to by a unified mapping table that stores the data-type bits and pointers to data or tables in DRAM. Partial sectors are packed together to reduce DRAM usage and flash wear. A spare/swap area in DRAM reduces flash wear. Reference voltages are adjusted when error correction fails.

10 Claims, 52 Drawing Sheets

Related U.S. Application Data continuation-in-part of application No. 12/347,306, filed on Dec. 31, 2008, now Pat. No. 8,112,574, and a continuation-in-part of application No. 12/141,879, filed on Jun. 18, 2008, now abandoned, which is a division of application No. 13/540,569, filed on Jul. 2, 2012, now Pat. No. 8,959,280.

(51) Int. Cl.
  *G06F 13/28* (2006.01)
  *G06F 12/02* (2006.01)
  *G11C 16/34* (2006.01)
  *G06F 13/16* (2006.01)
  *G06F 3/06* (2006.01)
  *G11C 29/00* (2006.01)
  *G06F 12/08* (2016.01)

(52) U.S. Cl.
  CPC ........ *G06F 3/0679* (2013.01); *G06F 13/1694* (2013.01); *G11C 16/349* (2013.01); *G06F 12/08* (2013.01); *G06F 2212/7203* (2013.01); *G06F 2212/7208* (2013.01); *G06F 2212/7211* (2013.01); *G11C 29/765* (2013.01)

(58) Field of Classification Search
  USPC .......................................................... 711/103
  See application file for complete search history.

(56) References Cited

U.S. PATENT DOCUMENTS

| | | | | | |
|---|---|---|---|---|---|
| 6,000,006 | A * | 12/1999 | Bruce | ................. | G06F 11/1068 711/103 |
| 6,121,903 | A * | 9/2000 | Kalkstein | ............ | H03M 7/3086 341/106 |
| 6,141,238 | A * | 10/2000 | Forbes | ................. | G11C 11/005 257/E27.104 |
| 6,411,302 | B1 * | 6/2002 | Chiraz | ................. | G06F 3/1431 345/531 |
| 6,434,685 | B1 * | 8/2002 | Sexton | ................... | G06F 12/10 711/206 |
| 7,185,017 | B1 * | 2/2007 | Cauvin | ............. | G06F 17/30569 |
| 7,190,617 | B1 * | 3/2007 | Harari | ................... | G06F 3/0614 365/185.11 |
| 8,631,181 | B2 * | 1/2014 | Feehrer | ................... | G06F 13/24 710/260 |
| 2002/0184559 | A1 * | 12/2002 | Qin | ..................... | G06F 11/1458 714/13 |
| 2004/0123282 | A1 * | 6/2004 | Rao | ........................ | G06F 8/665 717/168 |
| 2005/0066130 | A1 * | 3/2005 | Rudelic | ............... | G06F 12/0646 711/117 |
| 2007/0033341 | A1 * | 2/2007 | Hashimoto | ........... | G06F 12/084 711/113 |
| 2007/0112812 | A1 * | 5/2007 | Harvey | ............... | H04L 61/1517 |
| 2007/0150791 | A1 * | 6/2007 | Gross | .................. | G06F 11/1044 714/763 |
| 2007/0180328 | A1 * | 8/2007 | Cornwell | .............. | G06F 11/073 714/42 |
| 2008/0037332 | A1 * | 2/2008 | Ohta | ................... | G11C 16/0441 365/185.23 |
| 2008/0243966 | A1 * | 10/2008 | Croisettier | ........ | G06F 17/30315 |
| 2009/0150599 | A1 * | 6/2009 | Bennett | ............... | G06F 11/1441 711/103 |
| 2009/0235181 | A1 * | 9/2009 | Saliba | ..................... | G06Q 10/10 715/753 |
| 2009/0248957 | A1 * | 10/2009 | Tzeng | ................. | G06F 13/4239 711/103 |
| 2009/0248958 | A1 * | 10/2009 | Tzeng | ..................... | G06F 12/08 711/103 |
| 2009/0248959 | A1 * | 10/2009 | Tzeng | ..................... | G06F 12/08 711/103 |
| 2009/0249015 | A1 * | 10/2009 | Tzeng | ................. | G06F 12/0866 711/165 |
| 2012/0063191 | A1 * | 3/2012 | Norman | .................. | G06F 3/061 365/100 |
| 2012/0096233 | A1 * | 4/2012 | Chen | ................. | G06F 12/0292 711/165 |
| 2012/0284587 | A1 * | 11/2012 | Yu | ........................ | G06F 3/0608 714/773 |
| 2013/0145085 | A1 * | 6/2013 | Yu | ........................ | G06F 12/0246 711/103 |
| 2014/0281151 | A1 * | 9/2014 | Yu | ............................. | G06F 1/30 711/103 |
| 2014/0310574 | A1 * | 10/2014 | Yu | ....................... | G06F 11/1072 714/773 |
| 2015/0106557 | A1 * | 4/2015 | Yu | ........................ | G06F 3/0608 711/103 |

\* cited by examiner

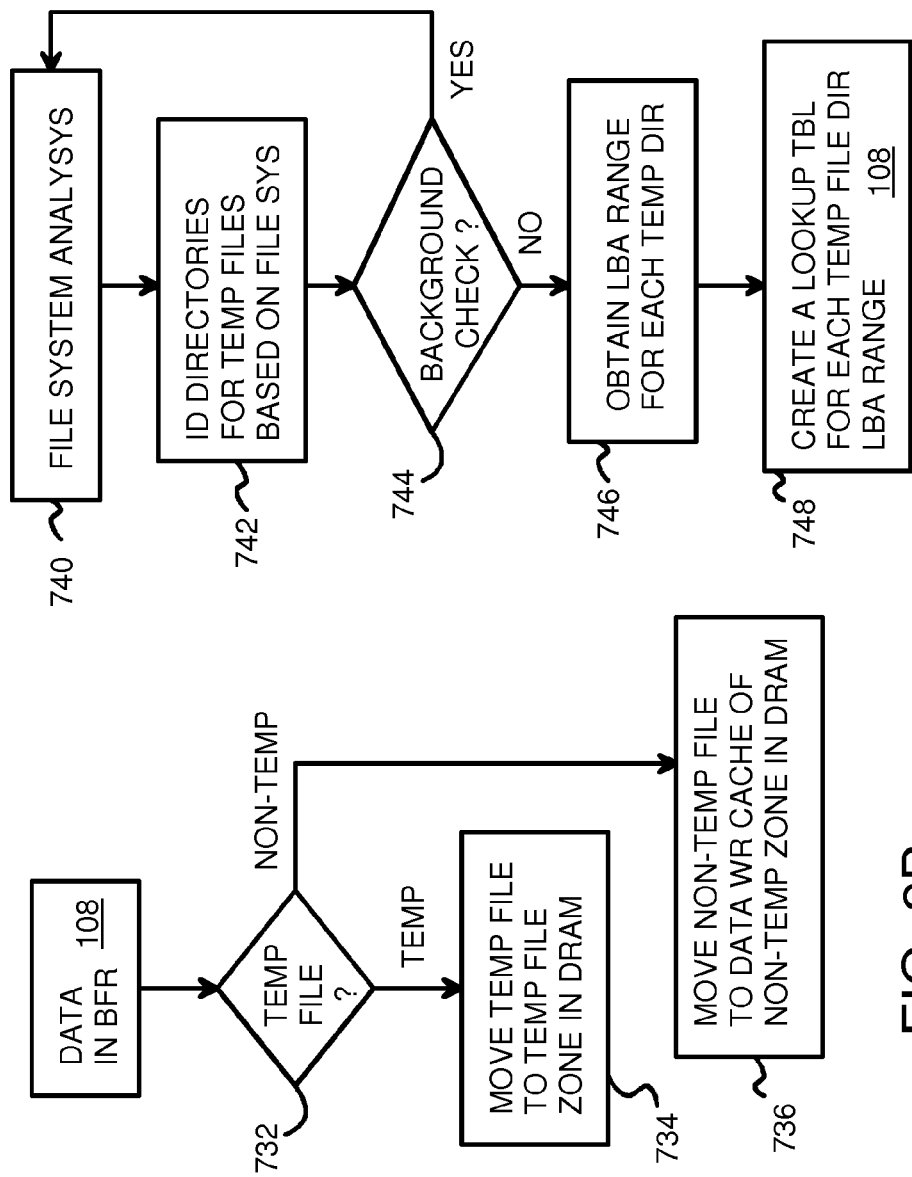

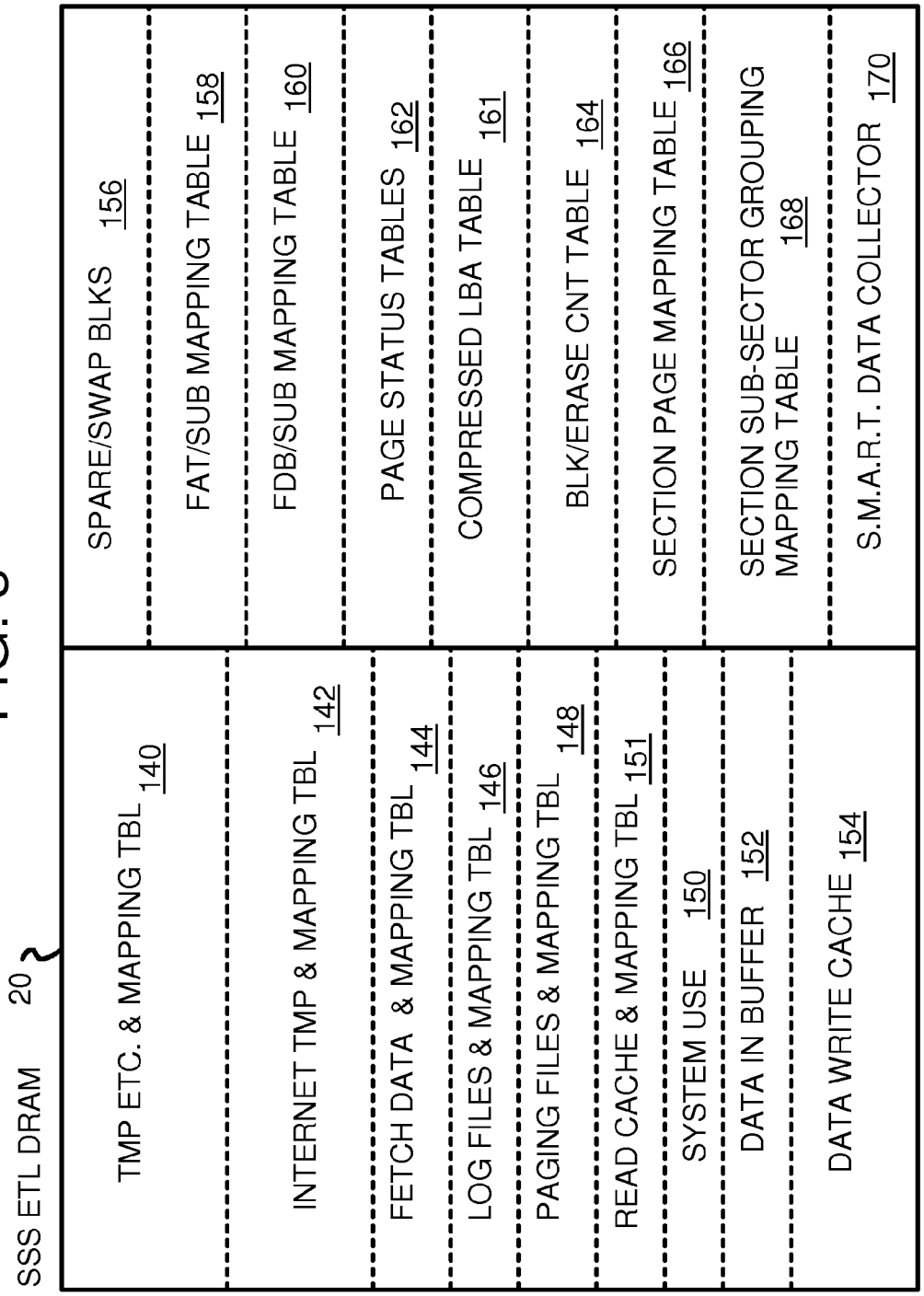

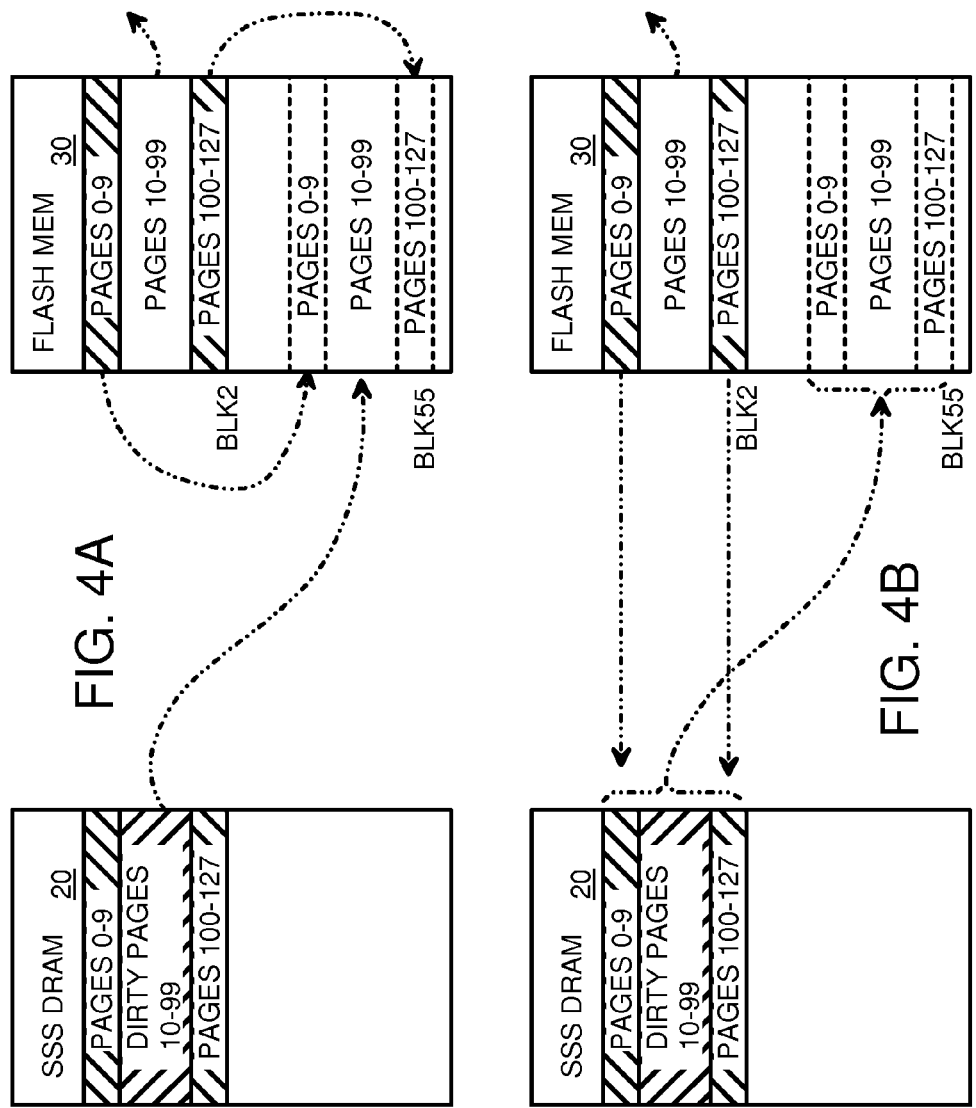

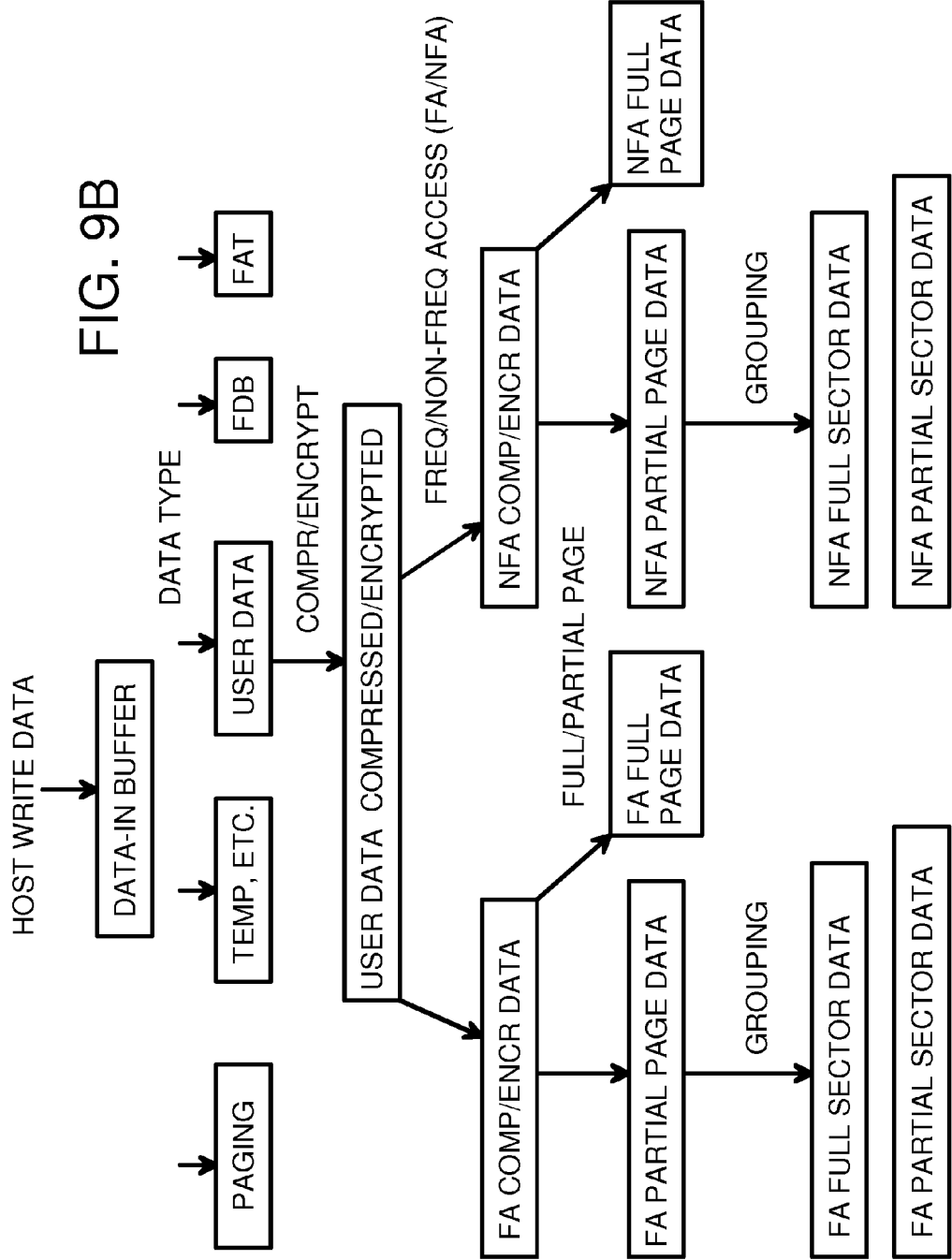

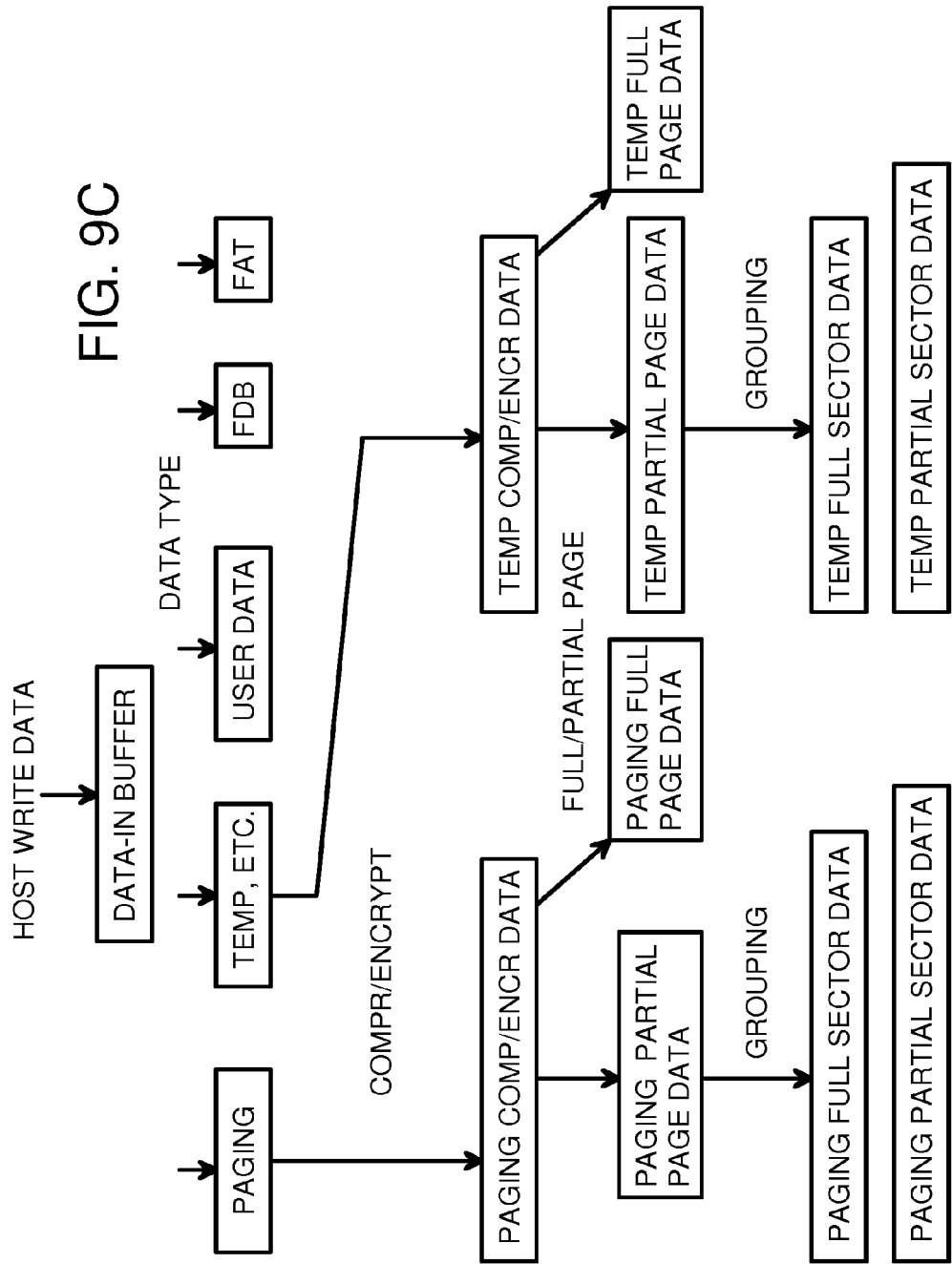

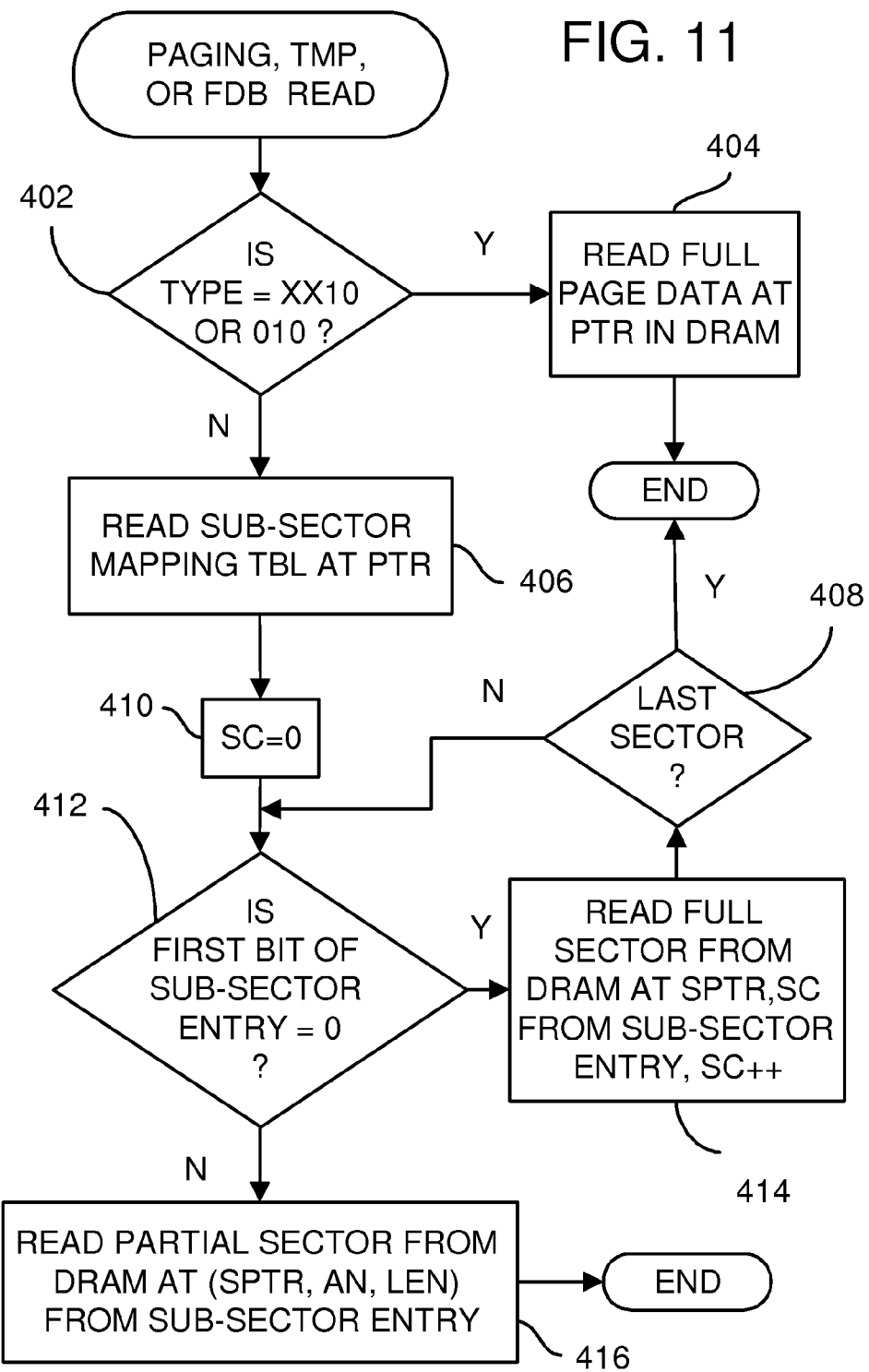

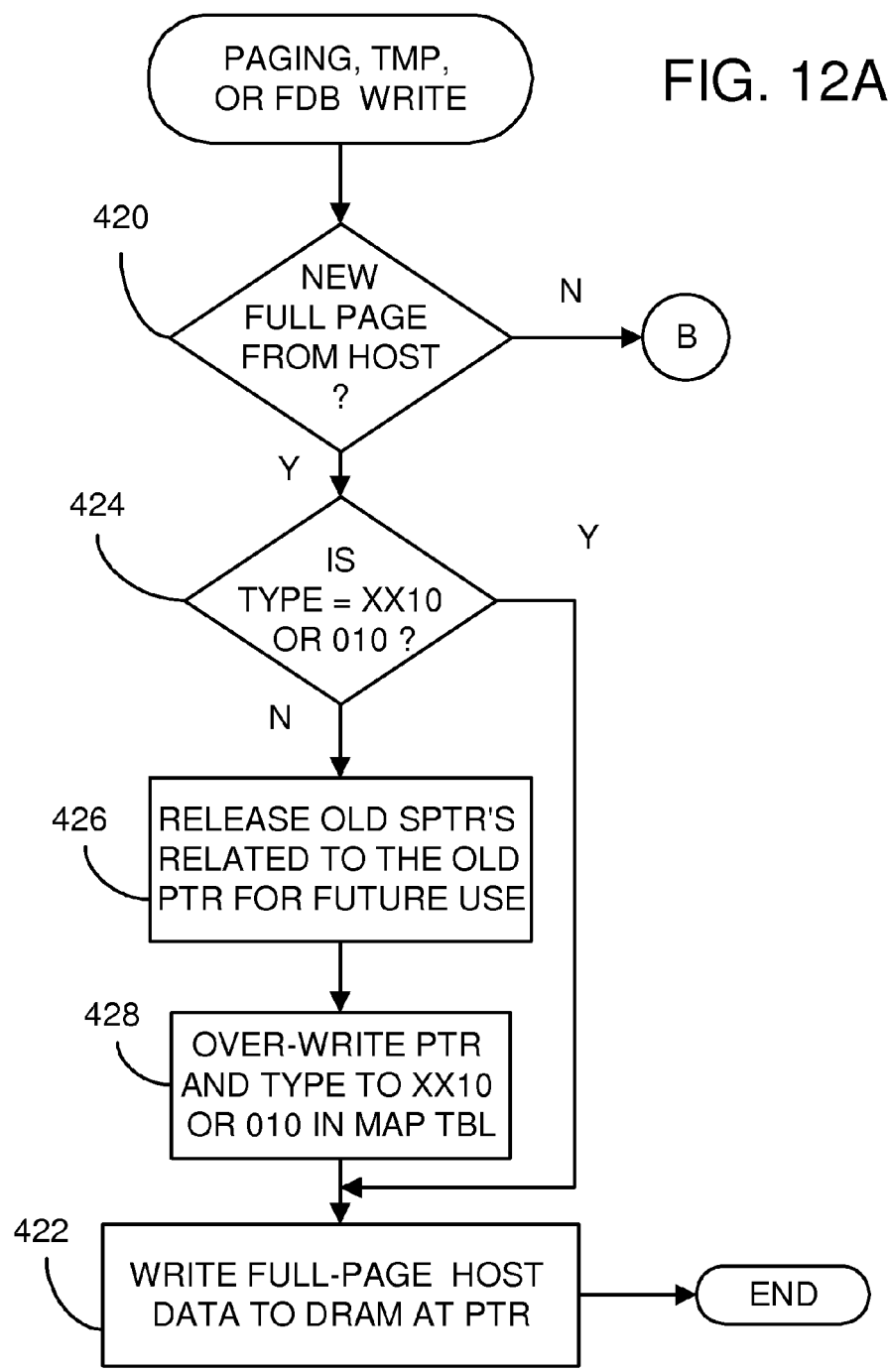

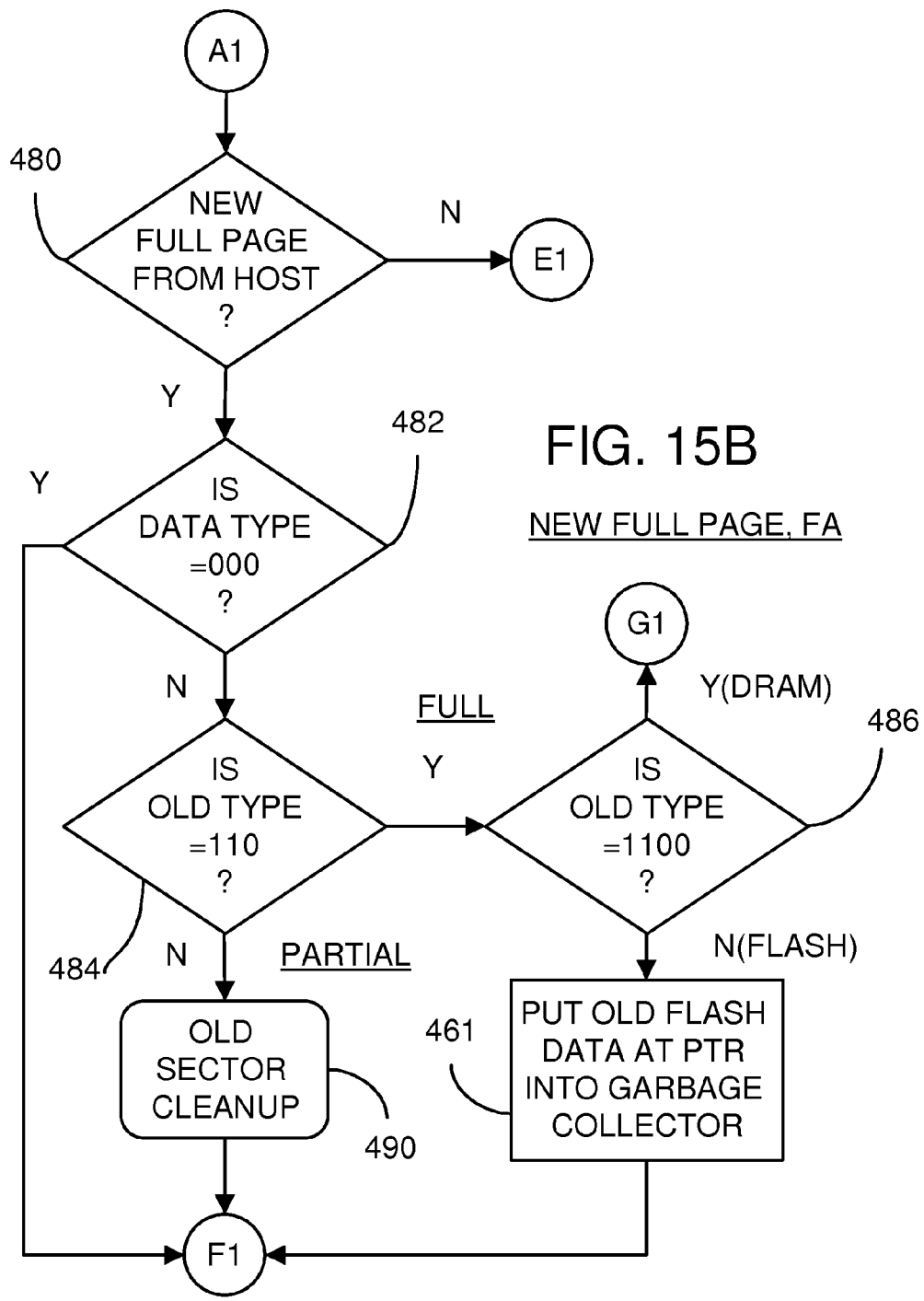

NEW FULL PAGE, NFA

NEW FULL PAGE, FA

NEW FULL PAGE, NFA

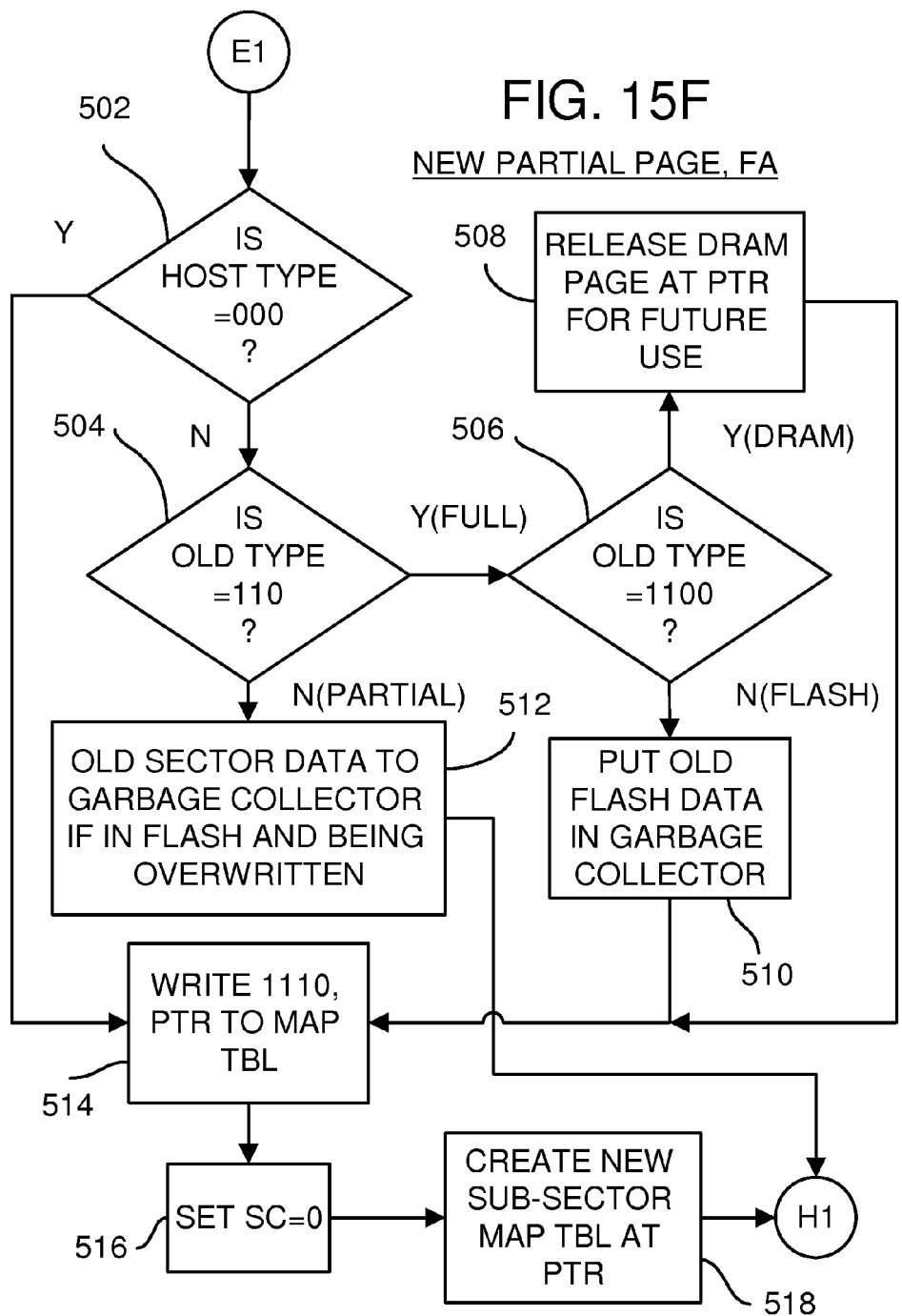

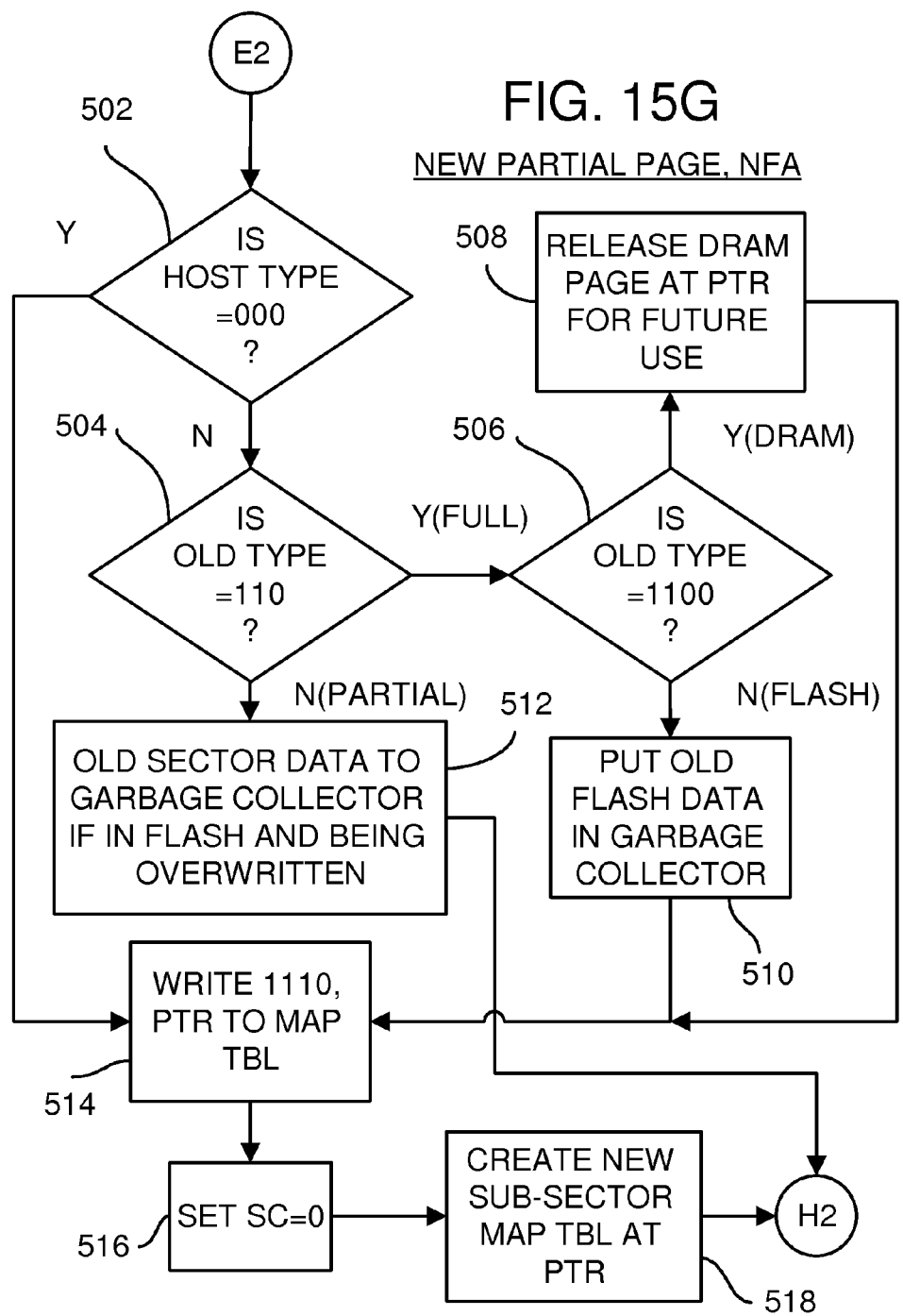

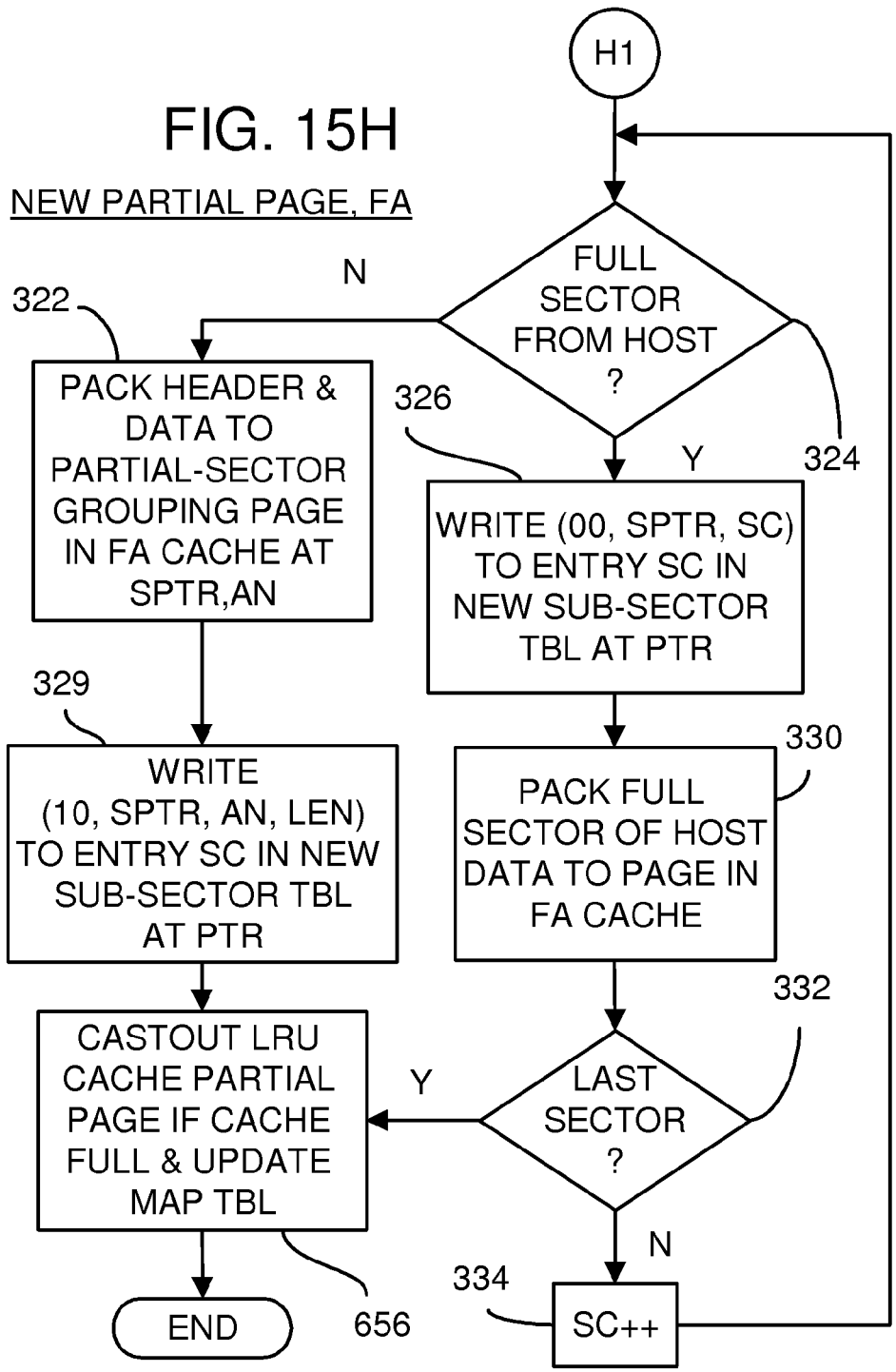

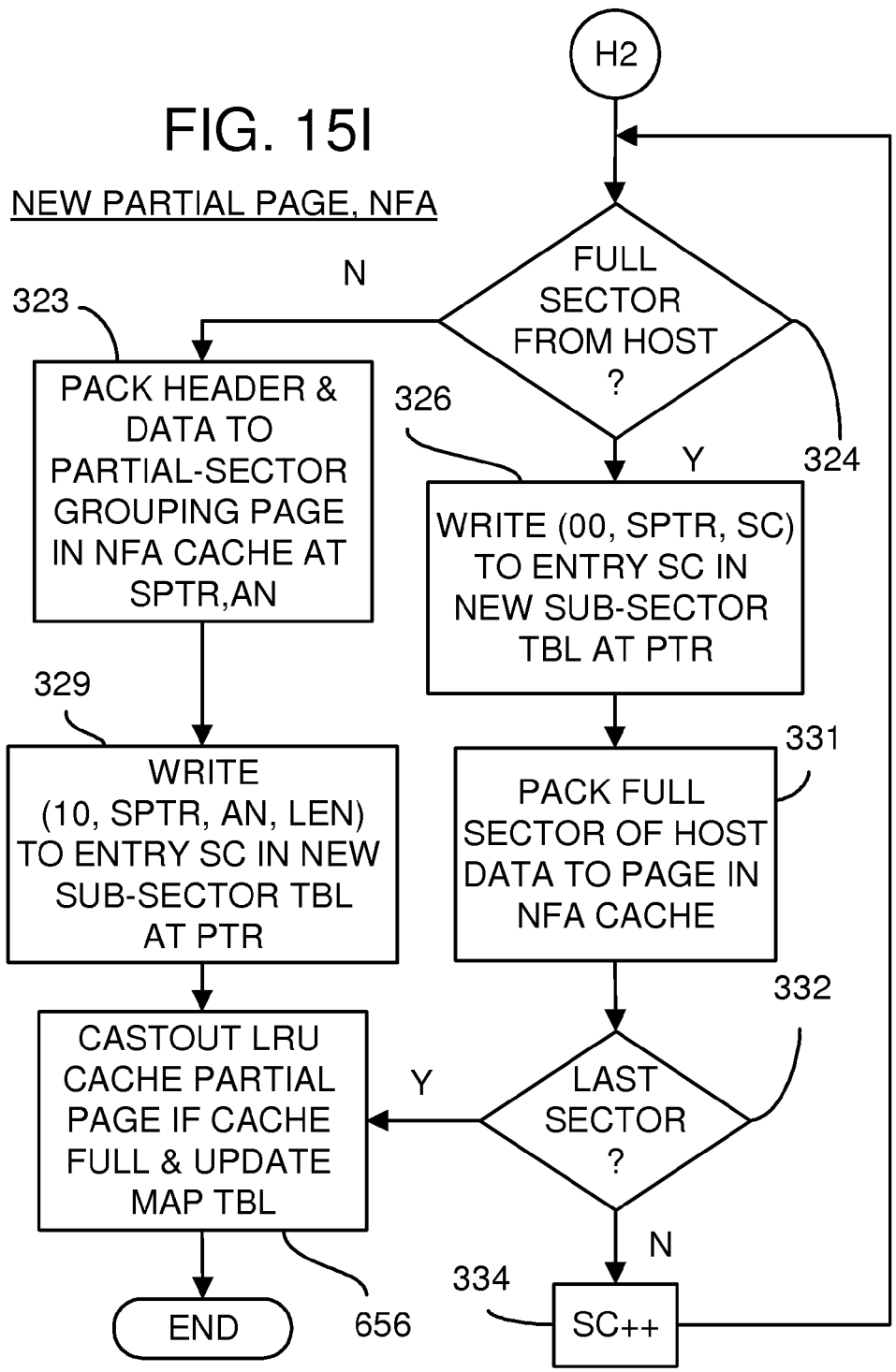

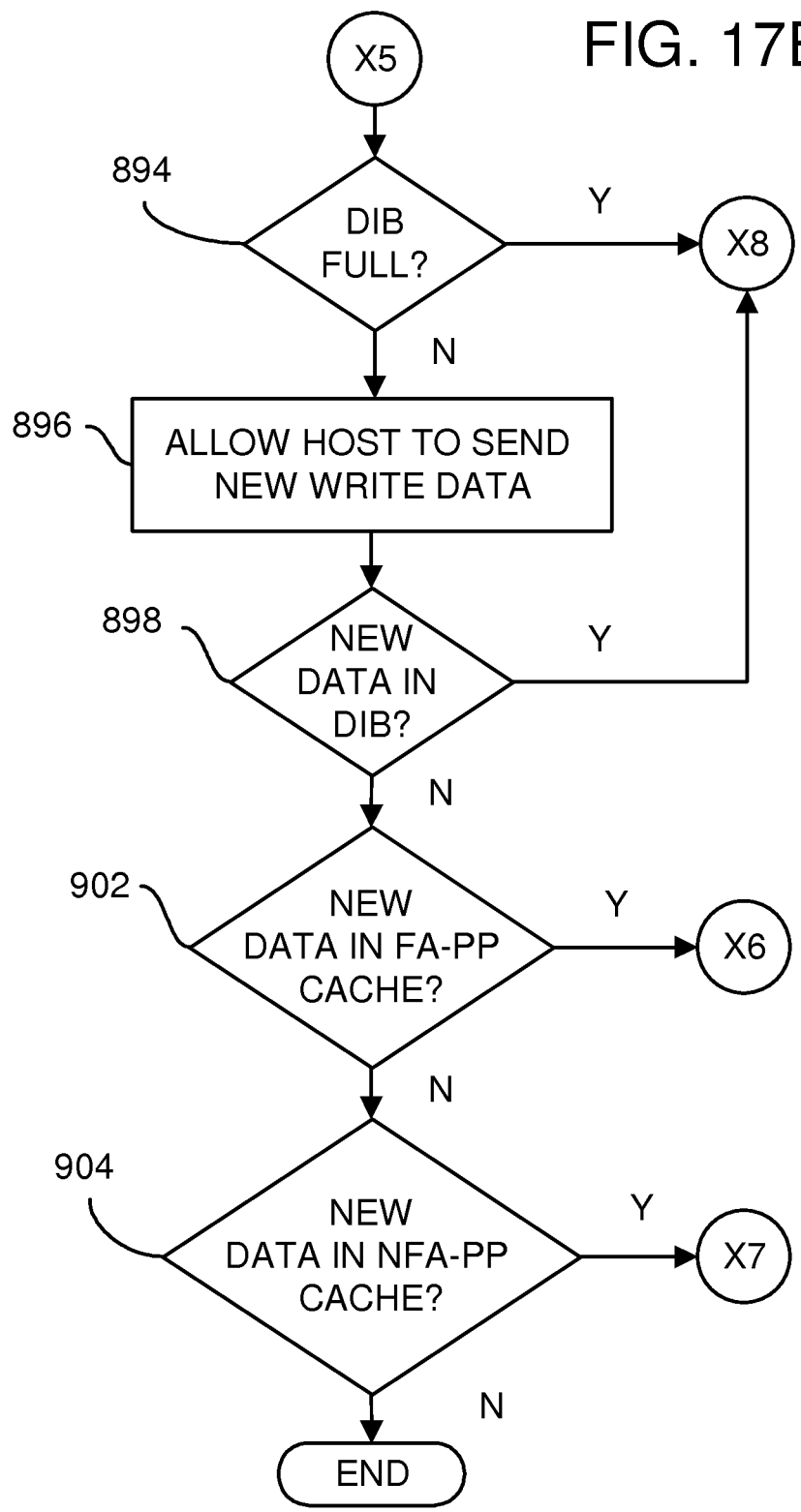

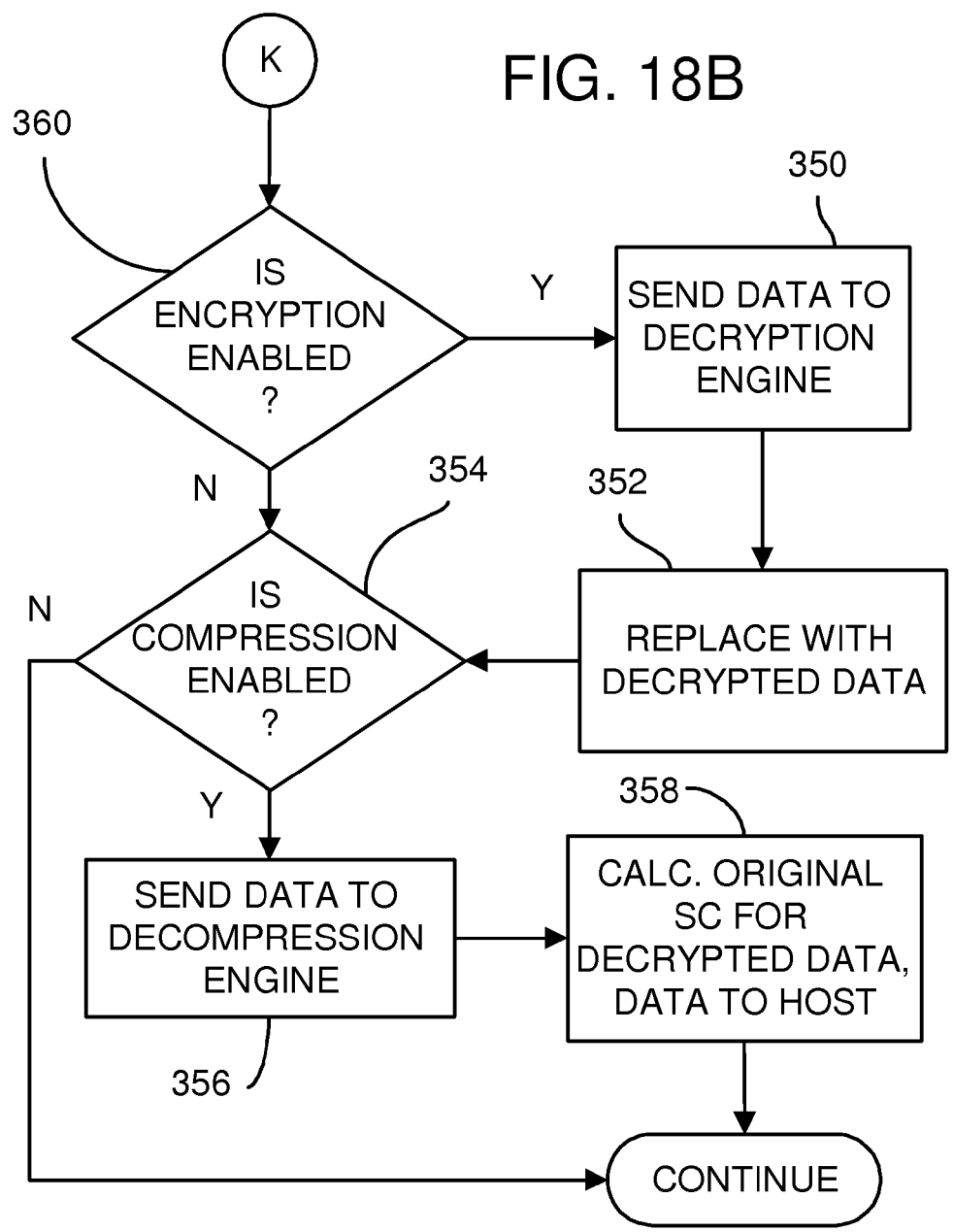

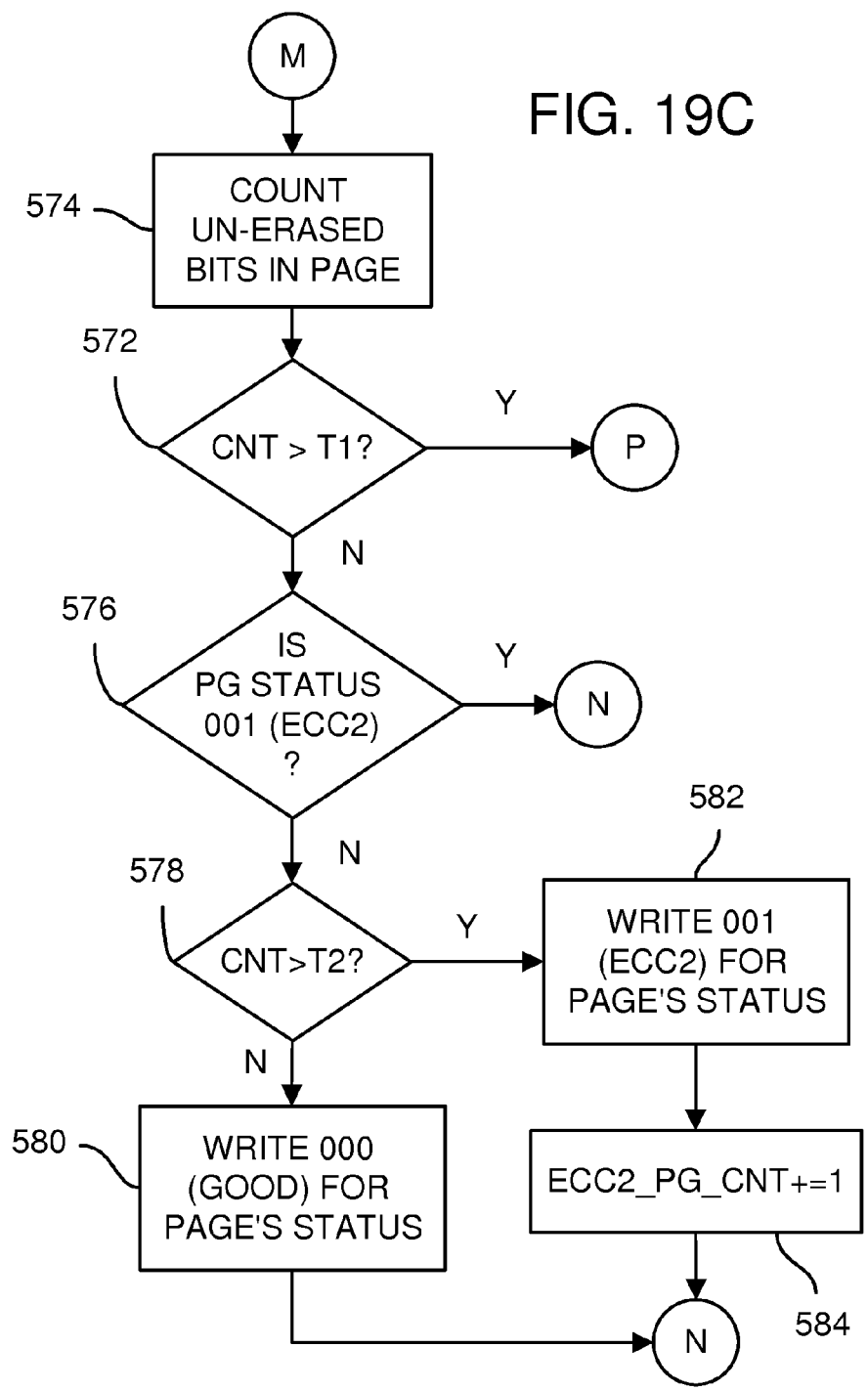

ENDURANCE TRANSLATION LAYER (ETL) AND DIVERSION OF TEMP FILES FOR REDUCED FLASH WEAR OF A SUPER-ENDURANCE SOLID-STATE DRIVE

RELATED APPLICATIONS

This application is a divisional of U.S. Ser. No. 13/540,569, filed Jul. 2, 2012, now U.S. Pat. No. 8,959,280.

This application is a continuation-in-part (CIP) of "Multi-Level Striping and Truncation Channel-Equalization for Flash-Memory System", U.S. Ser. No. 12/475,457, filed on May 29, 2009.

This application is a continuation-in-part of "Swappable Sets of Partial-Mapping Tables in a Flash-Memory System With A Command Queue for Combining Flash Writes", Ser. No. 12/347,306, filed on Dec. 31, 2008, now U.S. Pat. No. 8,112,574.

This application is a continuation-in-part of "High Performance and Endurance Non-volatile Memory Based Storage Systems", U.S. Ser. No. 12/141,879, filed Jun. 18, 2008.

This application is related to "High Endurance Non-volatile Memory Devices", U.S. Pat. No. 7,953,931, Filed on Feb. 21, 2008.

This application is related to "Cell-Downgrading and Reference-Voltage Adjustment for a Multi-Bit-Cell Flash Memory", U.S. Pat. No. 7,333,364, Filed on Apr. 19, 2007.

FIELD OF THE INVENTION

This invention relates to flash-memory drives, and more particularly to increased-endurance and longevity of flash memory drives.

BACKGROUND OF THE INVENTION

Flash memory is widely used for peripheral storage in computer systems, and even for primary storage in portable devices. The NAND flash memory was invented by Dr. Fujio Masuoka of Toshiba in 1987. Flash memory uses electrically-erasable programmable read-only memory (EE-PROM) cells that store charge on a floating gate. Cells are typically programmed by an avalanche current, and then erased using quantum-mechanical tunneling through a thin oxide. Unfortunately, some electrons may be trapped in the thin oxide during program or erase. These trapped electrons reduce the charge stored in the cell on subsequent program cycles, assuming a constant programming voltage. Often the programming voltage is raised to compensate for trapped electrons.

As the density and size of flash memory has increased, the cell size has been shrunk. The thickness of oxides including the tunneling oxide has also been reduced. The thinner oxides are more susceptible to trapped charges and sometimes fail more easily. The floating gate of NAND flash is used to trap electrons. The number of electrons in the floating gate can affect the voltage level of the output. The different level of voltage is achieved by controlling the number of electrons trapped in the depletion layer during the write process. The ever smaller floating gate area often limits the maximum number of electrons that can be trapped (now just several hundred electrons). Due to program/read interference the electrons can leak or trap into the floating gate. This electron number change will affect the voltage output level change and change the read result.

The number of program-erase cycles that a flash memory is able to withstand (or is spec'ed at) was around 100,000 cycles, which allowed for a lengthy lifetime under normal read-write conditions. However, the smaller flash cells have experienced a disturbingly higher wear and newer flash memories may be spec'ed at less than 10,000 program-erase cycles for two-level cells and about 600 for Triple-Level Cells (TLC). If current trends continue, future flash memories may only allow for 300 program-erase cycles. Such a low endurance could severely limit the applications that flash memory could be used for, and have severe impacts for Solid-State-Disk (SSD) applications.

One method to increase the density of flash memory is to store more than one bit per memory cell. Different voltage levels of the cell are assigned to different multi-bit values, such as four voltage ranges for a two-bit cell. However, the noise margins are reduced for the multi-level-cell (MLC) and TLC flash technologies and endurance problems are exacerbated.

It is expected that the underlying flash technology will have lower and lower endurance in the future. Flash drives may compensate for the lower wear tolerance of the underlying flash memories by a variety of techniques. For example, a DRAM buffer on the flash drive may act as a write-back cache, reducing the number of writes to the underlying flash memories when the host performs writes to the same data location.

What is desired is a flash drive that compensates for lower wear tolerances of underlying flash memory devices. A super-endurance flash drive is desired that uses a barrage of advanced management techniques that together reduce the number of writes to flash, hence reducing program-erase cycles on the underlying flash memory. A super-endurance flash drive constructed from low-endurance flash memory is desired.

BRIEF DESCRIPTION OF THE DRAWINGS

FIG. 2A-C highlight separate management of temporary files to avoid flash writes of temporary files.

FIG. 3 is a memory map showing an Endurance Translation Layer (ETL) with various types of data stored in a SSS DRAM buffer.

FIGS. 4A-B show a partial block being over-written using a spare/swap block.

FIG. 9B highlights data flow in the DRAM buffer for user data.

FIG. 9C highlights data flow in the DRAM buffer for paging and temp files.

FIG. 11 shows a process for reading paging, temp, or FDB files.

FIG. 12A-C shows a process for writing paging, temp, or FDB files.

FIG. 15A-I shows the super-endurance flash drive processing a host write of a user data file for both frequent and non-frequently accessed areas.

FIGS. 17A-E are a flowchart of user data processing using FA and NFA caches for full and partial pages.

FIG. 18A-B shows processing encrypted and compressed pages.

FIG. 19A-D show a process for detection and handling of bad pages and bad blocks.

DETAILED DESCRIPTION

Figure 1:
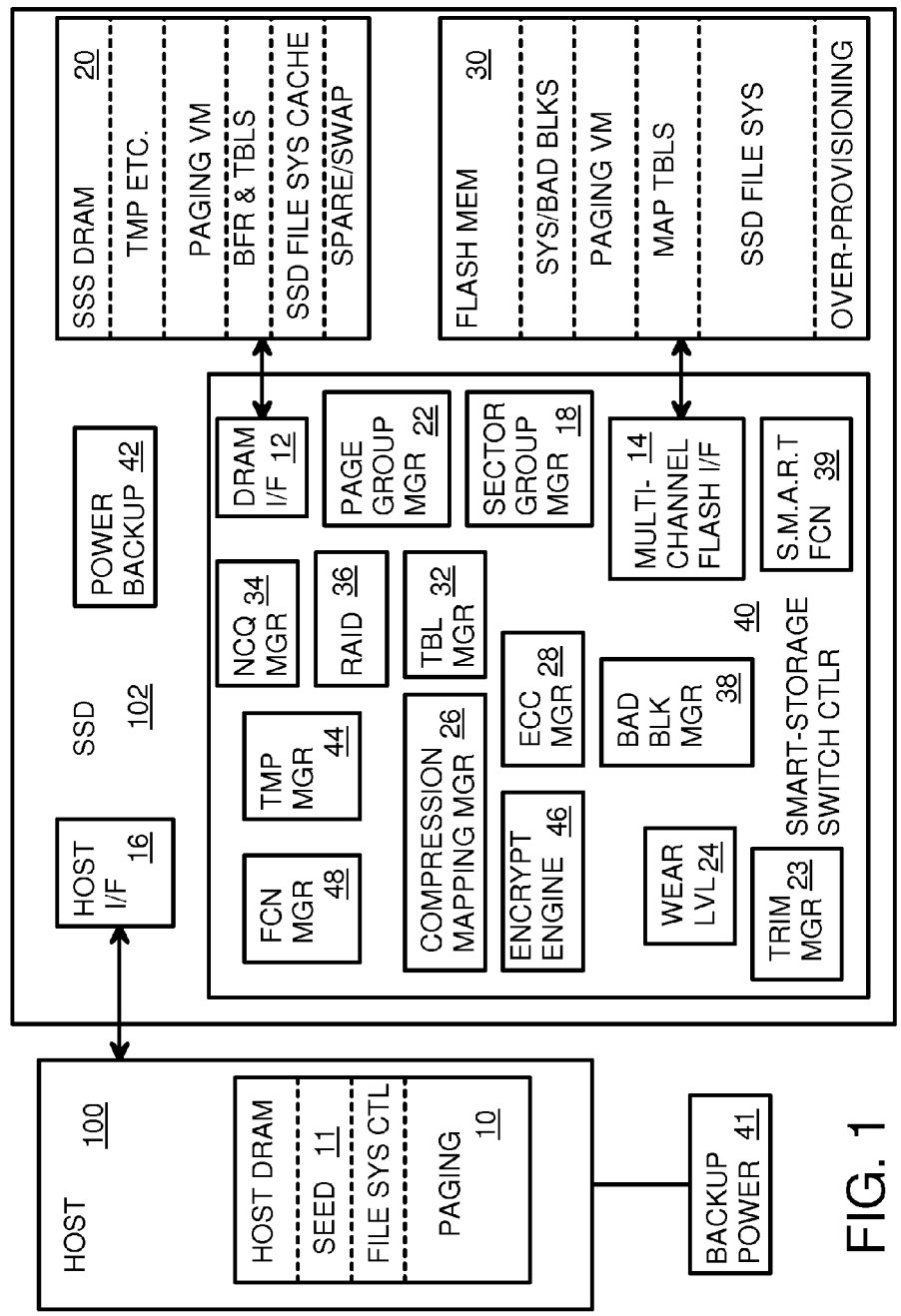
FIG. 1 is a block diagram of a super-endurance flash drive using low-endurance flash memory.

The present invention relates to an improvement in flash-memory drive endurance. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The wear on underlying flash devices may be reduced by blocking unnecessary writes to the flash memory. A DRAM buffer in the flash drive can store data that does not need to be stored permanently and thus does not need to be written to flash. The DRAM is not only faster, it can be over-written more than one million times. In 1966 DRAM was invented by Dr. Robert Dennard at the IBM. A typical host creates many temporary files, such as during Internet browsing, or when running certain bloated application programs, that are not critical. The inventors realize that these files do not need to be written to flash memory, reducing flash wear.

A typical system also frequently over-writes certain kinds of data. Such frequently-over-written data is best stored in the DRAM buffer in the flash drive and copied to the flash memory according to a policy (such as based on time elapsed, capacity allocated, etc.) or upon power off or power failure. Storing such frequently-over-written data to flash on power down can also significantly reduce the wear of the flash devices.

Such frequently-over-written data may include log files that are frequently updated with new events. The latest copy is examined, usually after a system crash. The File Allocation Table (FAT) is another frequently-over-written location, since it is updated when files are created or expanded. The FAT table is a relatively small portion of memory, but its frequent access can significantly increase wear if every update of the FAT is copied to flash. The File Descriptor Block (FDB) is a similar structure that is frequently over-written. FDB/FAT holds the meta data for the file system from the host. The various tables used together with the DRAM buffer have meta data created to store the "file system" to the DRAM and Flash. In the case of an Logical-Block Address (LBA) address misalignment, the LBA address is added to an offset to make the LBA address aligned with the page address boundary of flash memory 30 before writing to the FAT/Sub Mapping table in FAT area 158 or to the FDB/Sub Mapping table in FDB area 160 to make the write to flash more efficient for future accesses.

Bad-block tables, erase counters, garbage collection, mapping tables, and other files created by the flash drive need to be stored to flash according to a policy (such as based on time elapsed, capacity allocated, etc.) or on power off/loss. The flash system meta files may also be stored in the DRAM buffer and copied to flash according to a policy (such as based on time elapsed, capacity allocated, etc.) or on power off/loss to reduce flash wear. The above mentioned tables and meta files are stored in flash memory at power up. They are loaded into DRAM buffer at device initialization. Subsequently host data read/writes change those data contents. When power off/loss occurs, those dirty tables and meta files need to be written or backed up to the flash memory in a stripe-ready unit. Host data in the write cache, FIFO buffers, data-in buffer, endurance spare and swap blocks, and other buffers in the flash drive may also be copied to flash on a power failure to allow for system recovery if an exact recovery point is needed for a particular application.

Another way is to insure the data of interest in ETL of DRAM is copied to the MLC. In case of power off, a valid copy of data in ETL can be kept in MLC. At power up, the data in ETL can be loaded back to DRAM from the MLC. The copy method can be modified by recording the differences, which will reduce the amount of copied data and therefore reduce the writes to MLC.

A partial mapping table in ETL of the DRAM buffer has entries for only 1 of N sets of mapping tables. The other N−1 sets are stored in flash memory and fetched into the DRAM buffer when a partial mapping table miss occurs.

Paging files that the system uses for memory management, when images of the host's main DRAM memory are traditionally moved to a hard disk, or to a flash drive. Page swapping files are not critical if lost on a power failure, since the system would need to be rebooted anyway, and the memory management and paging systems would be re-initialized, wiping out any stored paging files. These paging files may also be stored in the DRAM buffer, and do not have to be copied to flash on a power off/loss, thus reducing flash wear.

Host requests to a flash drive tend to follow regular sequences of data types. For example, a host may first access the FAT, then the FDB, then read or write a data file. This recurring sequence may assist a super-endurance flash drive to categorize data types. The FAT is always in a pre-determined memory location that depends on the type of OS (Windows, Linux, Apple OS, Android, etc.). Thus an access to this range of address is a FAT type of access. The access after a FAT access is to the FDB. Then the next access is user data. Thus user data can be identified as following the FAT and FDB access. The FDB can be examined by the super-endurance flash drive to find the file extension so that .tmp files can be detected and handled differently than user data files.

Each type of file contributes to flash wear in a typical flash drive that does not distinguish among data types. Such agnostic systems treat all data equally. Everything is written to flash, at least when its entry in the DRAM buffer, if any, is cast out by another piece of data from the host that has the same cache index into the DRAM buffer. Significant reductions of flash writes can be achieved by identifying the data type and its purpose to the host, and then only writing actual user data to the flash during normal operation, and writing only critical data to flash, and then according to a policy on a power failure.

Further reductions in flash wear can be achieved by packing data. For example, data that is less than a whole page in flash (partial-page data) may be stored with other partial-page data in a single page in flash, rather than in many separate pages. Some data files are very small, being only a sector or even less than a sector in size. These partial sector files may also be packed together. As flash memories increase in size and density, the page size also increases. For example, a flash page may be 16 sectors of 512 bytes per sector, or 8 KB. Small data files (such as only 1 KB) waste an enormous amount of space when stored in separate flash pages, yet many host files are very small in size. Packing these partial-page files together can increase efficiency and ultimately reduce flash wear. Even for a large file, the last page of the file can be as small as the small files, so a lot of space is wasted.

The cluster misalignment from the host compared to the page alignment of flash memory will cause unnecessary write amplification due to two different writes at different times that share the same page of flash memory. Also one page of a write may result in two pages being written. This can be done by checking the FAT1 table starting address. If misalignment to the page boundary of flash memory occurs, an alignment adjustment is made by adding an offset to all LBA address after the FAT1 starting address to minimize the impact to write amplification.

In a hostile environment, the DRAM buffer may have software errors. An extra over provisioning DRAM can be used for ECC parity for increased the reliability.

While the flash-wear savings from each technique may provide various improvements, these techniques when used together may significantly increase flash endurance. A super-endurance flash drive may be achieved using these techniques.

FIG. 1 is a block diagram of a super-endurance flash drive using low-endurance flash memory. Host 100 has a processor that executes instructions for programs and for an operating system (OS) such as Windows, Linux, Apple OS, or Android, etc. The main memory of the processor is in host DRAM 10, which also stores data for the file system control, and paging files for page swapping, which are part of the memory management. Backup power 41 provides power to host 100 when the main power source fails, enabling host 100 to send critical data from DRAM 10 to Solid-State Drive (SSD) 102 or to a hard disk when power fails. Backup power 41 can use a battery, or an uninterruptible Power Supply (UPS), etc. This gives the HOST CPU time to turn off applications and to properly shut down the attached devices. SSD 102 has its own power backup 42, allowing SSD 102 to write critical data to flash memory 30 when the main power fails. Power backup 42 can utilize capacitors, super-capacitors or a battery.

Super Enhanced Endurance Device (SEED) 11 is an application and storage in DRAM 10. SEED 11 can be used to ease the loads of SSD 102. First, SEED 11 can separate and/or store data such as temporary, paging files etc., that not meant to be permanently stored to SSD. If SSS DRAM 20 of flash memory device 102 is large enough, a portion of it can be partitioned as a drive which can be directly accessed by SEED 11. Second, SEED 11 can use the host CPU to perform tasks such as compression/decompression, and encryption/decryption. Third, SEED 11 can support data write cache 154 to manage data with page writes to SSD 102. SEED 11 can generate either software ECC or Low-Density parity Check (LDPC) code for the write page data to SSD 102. Fourth, SEED 11 can support load/copy of the SEED image in a stripe-ready unit automatically at power on/off of host system 100.

SSD 102 has host interface 16, which communicates with host 100 using a bus such as a PCIe, SATA, or Universal-Serial-Bus (USB), Thunderbolt, eMMC, iSSD, etc. Host data from host interface 16 is sent to Smart Storage Switch (SSS) controller 40. SSS controller 40 performs a variety of functions to reduce the wear of flash memory 30, such as by storing temporary files from host 10 in SSS DRAM buffer 20 and not in flash memory 30. Other kinds of data, such as paging files from host 100 are cached in SSS DRAM buffer 20, but when no additional space is available in SSS DRAM buffer 20, older paging files are cast out to flash memory 30 at an application of the server system. Likewise the flash file system for SSD 102 is cached in SSS DRAM buffer 20 but maintained in flash memory 30. Various tables and buffers are stored in SSS DRAM buffer 20, as are spare and swap management tables or files. These tables in SSS DRAM buffer 20 may be caches of larger tables that are maintained in flash memory 30, such as system and bad block tables, logical-to-physical address mapping tables, or other kinds of mapping or system tables. Since portions of flash memory 30 will wear over time, there is over-provisioning of flash memory 30. The Spare/Swap area in DRAM buffer 20 provides extended over-provisioning of flash memory 30.

DRAM interface 12 reads and writes data in SSS DRAM buffer 20 while multi-channel flash interface 14 programs data pages and erases blocks in flash memory 30, which is organized into several channels. Native Command Queue (NCQ) manager 34 may re-order host commands from host 100 and manage the queue of host commands received through host interface 16. The manager loads host commands into a command queue where writes are re-ordered and combined to reduce flash writes.

Temp manager 44 identifies temporary files from host 100, such as by reading the file extension in the FDB for host data being written. Temp data (which has a file extension of .tmp, .temp., etc.) is stored in SSS DRAM buffer 20 and prevented from being stored in flash memory 30. The temp data can be discarded depending on policy, such as based on time elapsed, capacity allocated to temp data, etc. or power off/loss.

RAID controller 36 writes new data across several channels of flash memory 30 and may replicate data to provide redundancy and data recovery. ECC manager 28 generates error-correction code (ECC) to attach to write data, and compares stored ECC to re-generated ECC to detect and correct errors on reads. It also manages pages of flash which need extra ECC protection. It generates ECC for those page, then manages store and retrieval of the ECC data when needed. Bad block manager 38 keeps track of locations of bad blocks in flash memory 30, and may further identify bad pages writing partially-bad blocks. This can extend the lifetime of individual blocks, since only one page may be bad in the block, and the other pages may continue to be used. More complex bad-block management may reduce the overall wear of the flash drive.

Wear-leveler 24 provides two types of wear leveling methods. One is to dynamically choose the lowest wear leveling count block from the available empty blocks to write data to. The other method is based on the criteria of a wear leveling count threshold. Once this threshold is reached, blocks of flash data are moved from one physical block (with a low wear leveling count) to another empty physical block (with a high wear leveling count) in flash memory 30. Updates are made to the logical-to-physical mapping in mapping tables that are managed by table manager 32. Table manager 32 also tracks the type of data that is stored in each logical block so that temp files, paging files, FAT, FDB, and user data files are tracked once identified and categorized.

Partial-page data is grouped together to be packed into flash pages by page grouping manager 22. Sector grouping manager 18 groups together partial sectors of data. Grouping partial pages and partial sectors together increases efficiency and reduces wear. Partial-page and partial-sector data may be packed together and buffered for a time in SSS DRAM buffer 20 before being copied to flash memory 30. Grouping partial data into a full page of data can save several writes to flash.

Data may be compressed and/or encrypted. Compression mapping manager 26 maps the locations of compressed data blocks, and performs compression or write data and decompression of read data. Encryption engine 46 performs encryption of write data and decrypts read data.

TRIM manager 23 processes a TRIM command from the file system or OS on host 100. The TRIM command indicates that a sector is no longer needed by the host and can be wiped or erased. The trimmed page is recorded in the "Page Status Table" as deleted. When doing background garbage collection, if that block is identified as an erase candidate, this page is not be copied to a new block. At that time the TRIM command is really done. TRIM manager 23 performs overhead such as keeping track of which sectors and pages in a block are no longer needed. A garbage collector may also be used to track blocks that are ready for erasing. Once an entire block is no longer needed, TRIM manager 23 activates the garbage collector or other erase mechanism to erase the block so that the block may be re-used.

S.M.A.R.T. function 39 processes S.M.A.R.T. commands or vendor commands from host 100, such as to monitor and control error correction, wear, bad block, and other flash memory management. S.M.A.R.T. stands for Self-Monitoring, Analysis and Reporting Technology. The host can use the S.M.A.R.T. command sets to monitor some important data from the SSD device such as power on time, wear-leveling count, etc. The Host can use this data to diagnoses and identify the life expectancy of the SSD. The host can replace the SSD drive before it experiences a real casualty. In RAID, the host can use S.M.A.R.T. commands to avoid a more expensive RAID 5 configuration. Function manager 48 may include many functions such as compression, encryption, and grouping, etc. that can be turned on or off by the host. The function manager takes care of the communication with the host and manages the usage of DRAM buffer and performs other functions such as prioritizing data from SSS DRAM buffer 20 to be written to flash memory 30 on power failure, and for copying this data to flash memory 30 when power is lost. Function manager 48 checks the file system format to determine the cluster size and the FAT1 starting address at power up. It will check against the page size of flash memory 30 used. If any misalignment to the flash page size occurs, an offset is added to the incoming LBA to align the host cluster to the flash page boundary.

Figure 2A:
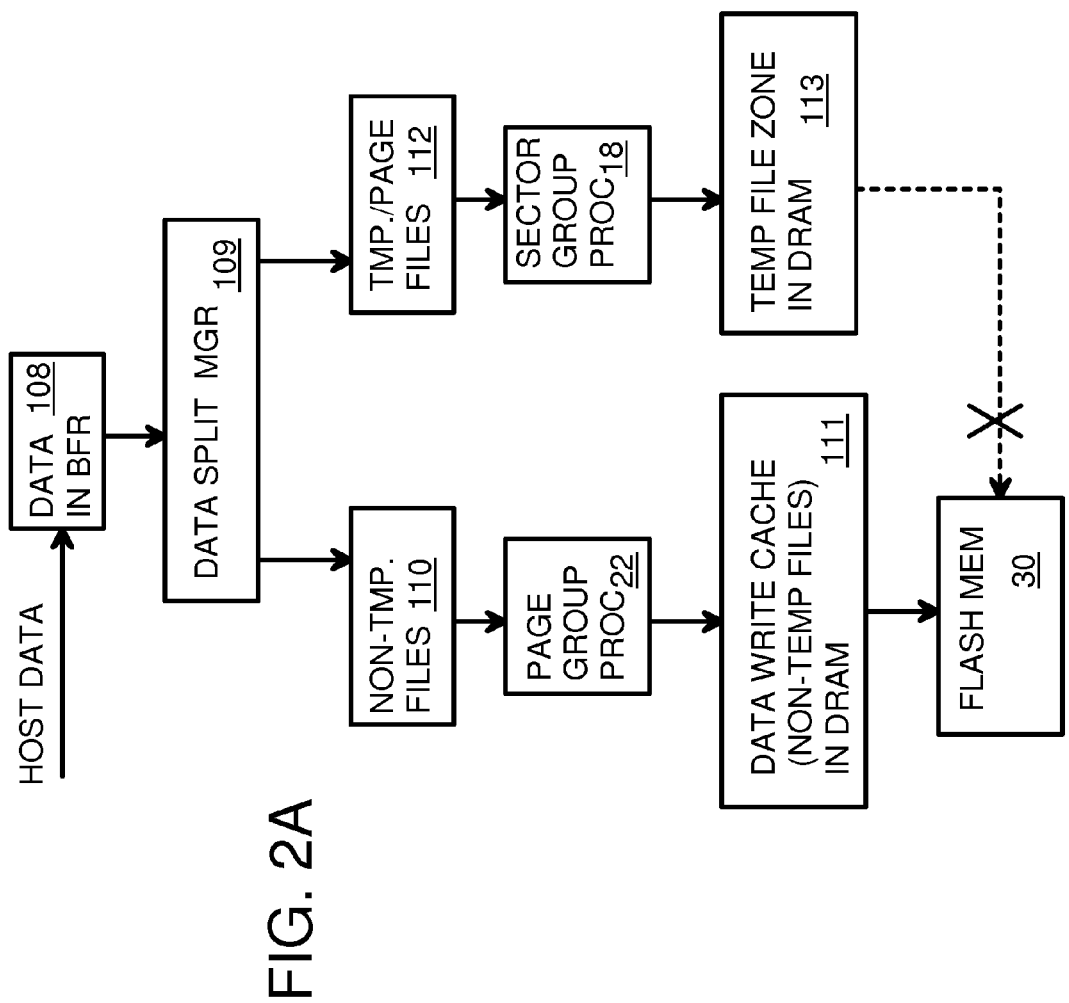

FIG. 2A-C highlight separate management of temporary files to avoid flash writes of temporary files. In FIG. 2A, host data is split into temporary files that are not backed up to flash. Host data and commands are written into data input buffer 108 in DRAM. Data split manager 109 looks up the LBA of each host request and determines which host requests are to data in temporary file directories. Host requests to data in a paging area of memory may also be included with temporary files 112. Other host requests to non-temporary directories are split off as non-temp files 110. Non-temp files 110 are processed by page grouping processor 22 which groups pages from different host requests into flash blocks. This non-temp file data is stored in data write cache 111, in a non-temp-file area of DRAM. When data write cache 111 is nearly full, blocks of data are castout and written to flash memory 30.

Temporary files 112 from different host requests are merged into pages by sector grouping processor 18. The size of the data chunks may be a page, a sector, or a partial sector, or various combinations. This smaller granularity is especially useful for temporary files as it allows for greater packing efficiency, especially with smaller files. These temporary files are stored in temporary file zone 113 in DRAM. These temporary files are not backed up to flash memory 30. When temporary file zone 113 is nearly full, the size of the zone is enlarged, or older temporary files may be deleted or over-written. Thus writes to flash memory 30 are avoided for temporary files. This reduces flash wear.

FIG. 2B shows data splitting. Data in buffer 108 receives host data. The LBA of the host data is compared to LBA ranges that are known to store temporary files, such as LBA ranges set aside for a sub-directors of temporary files, or files having a file extension of .tmp or some other known temporary file extension. When the data is identifies as a temporary file, step 732, then the data is moved to the temporary file zone in DRAM, steep 734. Non-temp data is moved to the data write cache in DRAM, step 736. This is in a non-temp zone in DRAM that is baked up to flash memory.

FIG. 2C shows data categorization of temp files. A file system analysis process 740 is executed. This process identifies directories that store temporary files, step 742. The file system aides this identification. For example, file extensions of .temp or .tmp may be identified using the FDB in conjunction with the FAT.

Process 740 can be run in the background, step 744, or when the system is idle. During idle times, a search can be made of the FDB to find the LBA range for each temporary directory, step 746. A lookup table can be created for each temporary directory, step 748. LBA ranges for temp files in this temp directory can populate entries in the lookup table.

FIG. 3 is a memory map which is an Endurance Translation Layer (ETL) showing various types of data stored in SSS DRAM buffer 20. The firmware of Smart-Storage Switch controller 40 uses the ETL to manage the interaction of DRAM and Flash Memory, at power up, normal operation and power down. Temp area 140 in SSS DRAM buffer 20 stores temporary files that are identified by SSS controller 40 reading the file extension in the FDB/FAT that is stored in FAT area 158 or FDB area 160. Temp files are those with extensions of .tmp, .temp, .tmt, .tof, .trs, .tst, etc. System related temp files may include ._mp, .log, .gid, .chk, .old, .bak, AutoCAD related temp files may include .SV$, .DWL, .AC$, Word related temp files may include .asd files. Excel related temp files may include .xar files. Other applications may use their own unique file extension for temp files. Internet temp file area 142 stores files with an extension of .gif, .jpg, .js, .htm, .png, .css, .php, .tmp, .mp3, .swf, .ico, .txt, .axd, .jsp, and .aspx. Both areas 140, 142 have a table for locating each temp file. This table may be indexed by the logical address from the host.

Fetch data area 144 stores fetch data and a table of entries in fetch data area 144. Each time a computer is turned on, the Windows OS keeps track of the way the computer starts and which programs are commonly open. Windows saves this information as a number of small files in the prefetch folder. The next time the computer is turned on, Windows refers to these files to help speed the start process.

The prefetch folder is a subfolder of the Windows system folder. The prefetch folder is self-maintaining, and there's no need to delete it or empty its contents.

Log files with an extension of .log or .evt are stored in log file area 146, which also may have a mapping table for log files stored in this area, or may be considered a type of temp file.

Paging files that swap data between main memory on the host at peripheral storage such as a hard disk or SSD 102 are stored and mapped in paging area 148. A read cache of data read from flash memory 30 and stored in SSS DRAM buffer 20 is placed in read cache area 151. A mapping table of read cache entries may be used, and include tags, valid bits, and pointers to the data in flash memory 30. System area 150 stores flash system data used by the operating system of SSS controller 40. Data in buffer 152 stores the raw host data (including the LBA) being written to SSD 102. The actual host data is later moved to data write cache 154 before being written into flash memory 30. The Super write cache technology related to data write cache 154 is used to cache the write data to flash for the purpose of reducing the number of writes/erases to the flash and with Spare/Swap blocks 156 further to reduce the writes/erases in the flash.

The data write from host 100 will write into data in buffer 152 first, then after processing by the controller such as compression, it will write to data write cache 154, then write to flash memory 30. In the case of a large quantity of data continuously writing from host 100, writes to flash memory 30 will be the bottleneck. The data will be continuous writes into data write cache 154 until it is full, then the flow from data in buffer 152 to data write cache 154 will be stopped. If data in buffer 152 is also full, then the host will be notified to stop the traffic.

Data write cache 154 uses an endurance write cache algorithm that stores write data to DRAM buffer 20 and not write to flash memory 30 until castout. Thus multiple writes with the same LBA will overwrite the data in data write cache 154 and write to flash memory 30 in a stripe-ready unit according to the policy (such as based on time elapsed, capacity allocated, etc.) or upon power off or power failure. Data write cache 154 also holds the partial page write data until the whole page is grouped with multiple partial pages. Thus multiple partial pages write can write to flash memory 30 according to policy (such as based on time elapsed, capacity allocated, etc.) or upon power off or power failure.

In a multi-channel controller structure, the device controller may write data which is arranged as multiple pages (the number of the multiple may be equivalent to the multi-channel) from data write cache 154 to flash in a stripe-ready unit when castout to best utilize the flash interface bandwidth. For each device controller it consists of the number of channels C, each channel has a number F of flash chips attached, each chip has D dies in a stack, and each die has P planes. The stripe size is set to be F*D*P pages. The stripe depth is set to C*F*D*P pages. The device controller selects the data from data write cache 154 and writes the data to the selected stripes of flash memory 30, then updates related mapping table entries with corresponding PBA address. Each channel has only one bus, so only one die can be accessed. F*D dies will be interleaved to share the bus to maximize the utilization of the bus. The size of the stripe-ready unit can be C or up to C*F*D*P pages.

An Endurance Translation Layer (ETL) method increases endurance of a flash memory that has a low specified erase-cycle lifetime. A flash memory interface has a multiple of buses for channels; each channel has a multiple of flash chips; each chip has a multiple of dies, and each die has multiple planes. All channels can be accessed at the same time.

All dies in the same channel cannot be accessed at the same time; only one die in the same channel can be accessed at a time. Another die in a channel can be accessed when the other die is being written or read. Interleaving writing or reading can increase the performance of flash access. A data write cache is stored in the DRAM buffer and managed by the controller according to a policy. When the dirty data in the data write cache is greater than the stripe-ready unit, the device controller manages the dirty data and writes to the flash memory through the flash memory interface. The device controller manages the distribution of data to each channel of flash memory. The device controller manages the interleaving of data to one die of one chip in each channel, and manages the mapping table entries to track the LBA to PBA mapping.

In other alternate designs, in a multi-channels controller structure, each channel may have its own data write cache 154. Writing stripe-ready units simultaneously to each flash memory channel can maximize the flash memory interface speed.

User file data can be identified as Frequent Access data based on the hit rate of >=n (such as 2) and Non-Frequent Access data of hit rate<n. They may be written to two data write caches 154 separately. Multiple write data with the same LBA address to a Frequent Access Zone will overwrite the old contents in DRAM that is not in flash so that it reduces the number of writes to flash memory 30. The cache data in the Frequent Access Zone of the data write cache will be stored in flash memory 30 in a stripe-ready unit based on a policy such as based on time elapsed (such as 1 hour), capacity allocated, etc., or upon power off or power failure. The cache data in the Non-Frequent Access Zone of the data write cache will be stored to the flash memory 30 in a stripe-ready unit based on another policy such as based on time elapsed (such as 15 minutes), capacity allocated, etc. or upon power off or power failure.

In the case of LBA address misalignment, the LBA address will be added with an offset to make the LBA address aligned with the page address of flash memory 30 before writing to data write cache 154 to make the write to flash more efficient later on.

Endurance spare and swap blocks 156 are used for the garbage collection function to consolidate the valid data and evicted data from the write cache before it is written to flash. Page status tables 162 contain a table with page status entries, such as an empty page, a used page, a garbage page (TRIMed), a bad page, and a page that needs additional ECC protection. Compressed LBA table 161 stores mapping entries for compressed user data. Block erase count table 164 keeps track of erase counters and block status for each physical block in flash memory 30.

Section page mapping table 166 stores partial-page mapping information. The DRAM may not have enough space for the whole mapping table, so only portion of it is loaded to the DRAM. When the LBA table entry is not in the DRAM then it will evict some portion of the partial mapping table and load the related LBA table to DRAM. Section sub-sector grouping mapping table 168 stores sub-sector mapping information for data files that are less than one page in size. A partial mapping table of sub-sector grouping mapping table 168 has entries for only 1 of N sets of mapping tables. The other N−1 sets are stored in flash memory and fetched into the DRAM buffer when a partial mapping table miss occurs.

S.M.A.R.T data collector 170 has data tables and other information used by SMART function 39 (FIG. 1) and can be requested by the host through SMART commands or vendor commands.

The sizes of the areas in SSS DRAM buffer 20 may be determined by the overall size of SSS DRAM 20, the page size, block size, and sector size of flash memory 30, and whether page mapping or block is used, or an estimate of what percent of the entries in that area are page mapped rather than block mapped. For example, SSS DRAM buffer 20 may be a 512 MB DRAM, with 240 MB allocated to temp area 140, 160 MB allocated to Internet temp area 142, 12 MB allocated for fetch data, 6 MB allocated for log files, etc.

In a multi-channel controller structure, the device controller may read data from flash memory 30 and go through the multi-channel structure to various ETL tables (FAT/Sub Mapping Table 158, FDB/Sub Mapping Table 160, Page Status Table 162, compressed LBA Table 161, block erase count table 164, Section Page Mapping Table 166, and Section Sub-Sector Grouping mapping Table 168).

In a multi-channels controller structure, the device controller may write various ETL tables (FAT/Sub Mapping Table 158, FDB/Sub Mapping Table 160, Page Status Table 162, Compressed LBA Table 161, block erase count table 164, Section Page Mapping Table 166, and Section Sub-Sector Grouping mapping Table 168) which are arranged as multiple pages, (the number of multiple is equivalent to multi-channel) to flash in stripe-ready units according to a policy (such as based on time elapsed, capacity allocated, etc.) or upon power off or power failure to best utilize the flash interface bandwidth.

Rather than have separate mapping tables in each area of memory shown in FIG. 3, one or more unified mapping tables could be used. The type of file could be specified in each entry using a code such as that shown later in FIG. 6.

FIGS. 4A-B show a partial block being over-written. In FIG. 4A, the host had previously written all pages 0-127 in a block. All 128 pages were first stored in SSS DRAM buffer 20, and later copied to physical block BLK2 flash memory 30. Later, the host overwrites pages 10-99, but does not write pages 0-9 and 100-127. The new host data for pages 10-99 over-write the old page data in SSS DRAM buffer 20. These pages are marked as dirty since pages 10-99 in flash memory 30 are stale data.

When the dirty data in SSS DRAM buffer 20 is to be copied to flash memory 30, pages 0-9 from physical block BLK2 are copied to pages 0-9 of physical block BLK55. Likewise, dirty pages 10-99 with new host data are copied from SSS DRAM buffer 20 to pages 10-99 in physical block BLK55 in flash memory 30. Pages 100-127 from physical block BLK2 are copied to pages 100-127 of physical block BLK55. This logical block's storage in SSS DRAM buffer 20 may now be used for a different logical block since the old block's data is now stored in physical block BLK55 for all pages 0-127. The mapping table entry for this logical block is changed to point to physical block BLK55 rather than to BLK2. All of old physical block BLK2 can then be garbage collected and queued up for erasure, bad block detection, and re-use.

FIG. 4B is an example of operation of endurance spare and swap blocks 156. There is no current space in SSS DRAM buffer 20 allocated for the host's logical block. An allocate-on-write policy is used for SSS DRAM buffer 20. When the host writes the partial block data, a new block entry is allocated, either from a pool of empty block entries in SSS DRAM buffer 20, or by casting out old data to flash memory 30. Pages 10-99 from the host are stored into pages 10-99 in this newly allocated block in SSS DRAM buffer 20. Pages 0-9 are read from physical block BLK2 in flash memory 30, as are pages 100-127. The entire block, pages 0-127, may then be copied from SSS DRAM buffer 20 to new physical block BLK55 in flash memory 30. The mapping table entry for this logical block is changed to point to physical block BLK55 rather than to BLK2. All of old physical block BLK2 can then be garbage collected and queued up for erasure, bad block detection, and re-use. The page status table will show the status of each individual page of flash. The target block for and erase by the garbage collector will be examined for its page status in the block from page status table. Only used pages that are not bad or empty, and trimmed pages are copied to the swap area.

In an old file algorithm, there are spare and swap blocks located in flash that are involved in partial overwrites. For example, data is written to one block in the flash and later a partial of original data is changed. The controller writes the new update to the spare block in flash first. Then the old and new data will be merged into the swap block. After that the original block and the spare block will be erased. One partial overwrite will cause two blocks to be erased. In some file algorithms, the data needs to be written back to the original block. In that situation, three blocks are erased.

In a multi-channel controller structure, the device controller may read data from flash memory 30 of a particular channel to spare and swap blocks 156. After the spare and swap operations, the valid data writes to the same channel of flash memory 30.

Figure 5:
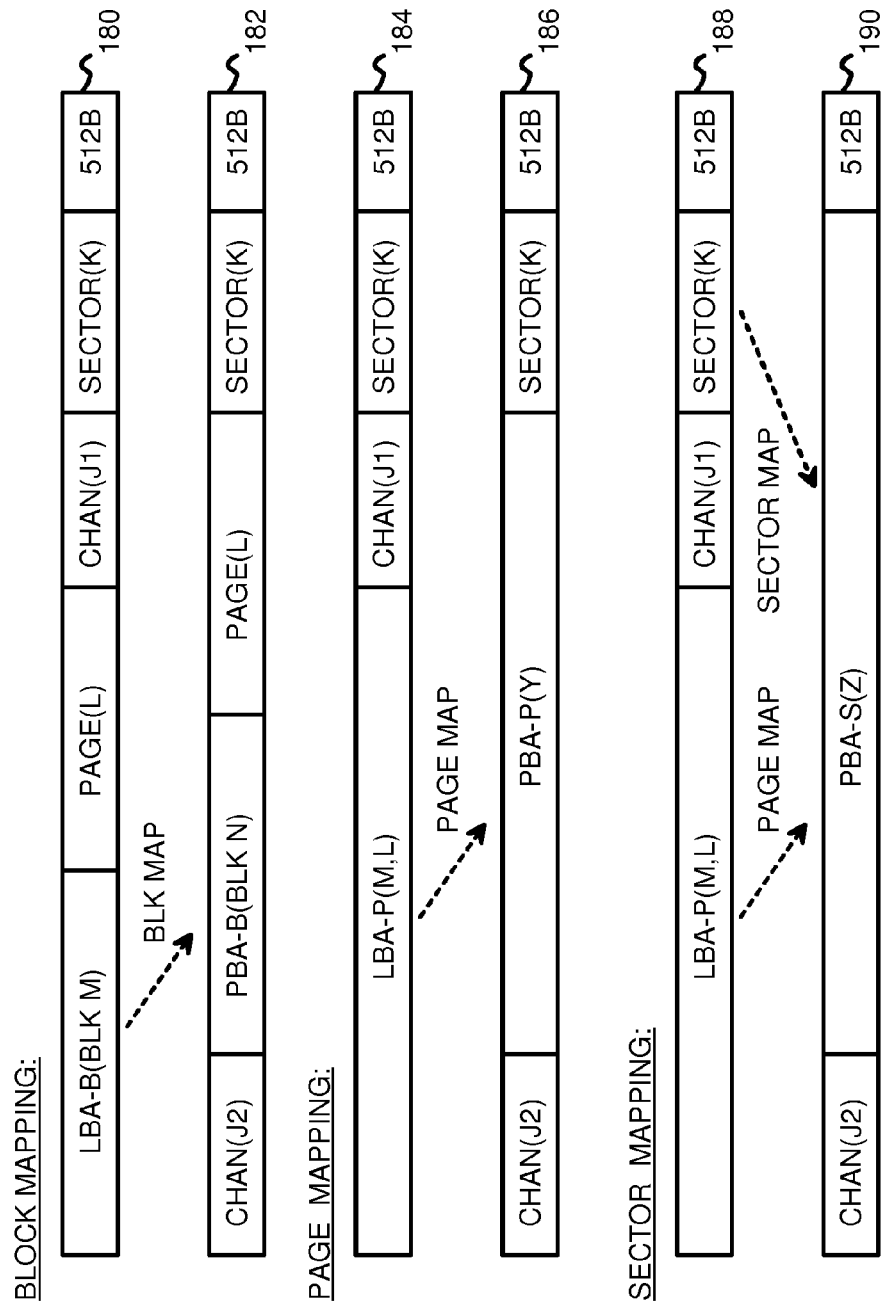
FIG. 5 highlights block, page, and sector mapping.

FIG. 5 highlights block, page, and sector mapping. For maximum flexibility, efficiency, and wear endurance, all three kinds of mapping are used, depending on the size of the user data.

In block mapping, an entire logical block from the host is mapped to an entire physical block in flash memory 30. Host address 180 refers to 512 bytes of user data. Sector K is a sector number that identifies one sector in a page, such as one 512-byte sector in a page of 16 sectors. Channel J1 identifies one striping of flash memory 30, such as eight stripes (one stripe is at least one page in size) in eight channels (similar to RAID 0's structure). Page L is a page number that identifies one page in a logical block, such as one page in a block of 128 pages. LBA-B is the block address that identifies logical block M. A block mapping table is indexed by LBA-B and maps logical block M to physical block N (physical block address PBA-B) in physical address 182 to flash memory. The channel J2 of flash memory can be removed from the physical block number. In the case of two planes flash memory, the LSB channel J1 will be added to Page L as the LSB. If a structure similar to the RAID 1 structure used, one channel is used as parity of the other channels and not shown in the figure.

In page mapping, the mapping table is indexed by LBA-P from logical address 184, which is the logical page number that included both the logical block number M and the logical page number L. The page entry in the mapping table produces a physical page number Y, which is the physical block address, page, PBA-P in physical address 186 (Y has the same size of M,L but a different value). Since there are many more pages than blocks, the number of mapping entries is much larger for page mapping than for block mapping. Channel J1 identifies one striping of flash memory 30, such as eight stripes in eight channels (similar to RAID 0's structure). Channel J1 can map to the mapping table so the device controller can move the page data to any channel and not be limited to a specific channel. Alternatively, if J1 is always equal to J2, channel J2 of the flash memory can be removed from the physical block number. In the case of two planes of flash memory, the LSB channel J1 is added to Page L as the LSB. If a structure similar to a RAID 1 structure is used, one channel is used as parity of the other channels and not shown in the figure.

In sector mapping, the mapping table is indexed by the block, page, sector address LBA-S from logical address 188. This is the logical page number that includes the logical block number M, the logical page number L, and the sector number K. A sector sub-mapping table is used together with the page mapping table, so that LBA-P and sector K are mapped to a physical sector address, PBA-S, in physical address 190 (Z has the same size of M,L,K but different value). Since there are many more sectors than blocks or pages, the number of mapping entries is much larger for sector mapping than for block mapping. Channel J1 identifies one striping of flash memory 30, such as eight stripes in eight channels (similar to RAID 0's structure). Channel J1 can map to the mapping table so the device controller can move the page data to any channel and not be limited to a specific channel. Alternatively, if J1 is always equal to J2, channel J2 of the flash memory can be removed from the physical block number. In the case of two planes of flash memory, the LSB channel J1 is added to Page L as the LSB. If a structure similar to a RAID 1 structure is used, one channel is used as parity of the other channels and not shown in the figure.

Most blocks are block-mapped, with only a fraction of the blocks being page-mapped. When relatively few pages within a page-mapped block are sector mapped, the overall area in SSS DRAM buffer 20 for mapping tables is kept to a reasonable size. When there is insufficient space in SSS DRAM buffer 20 for all mapping tables, the mapping tables may be kept in flash memory 30 and a cache of these mapping entries stored in SSS DRAM buffer 20.

Figure 6:
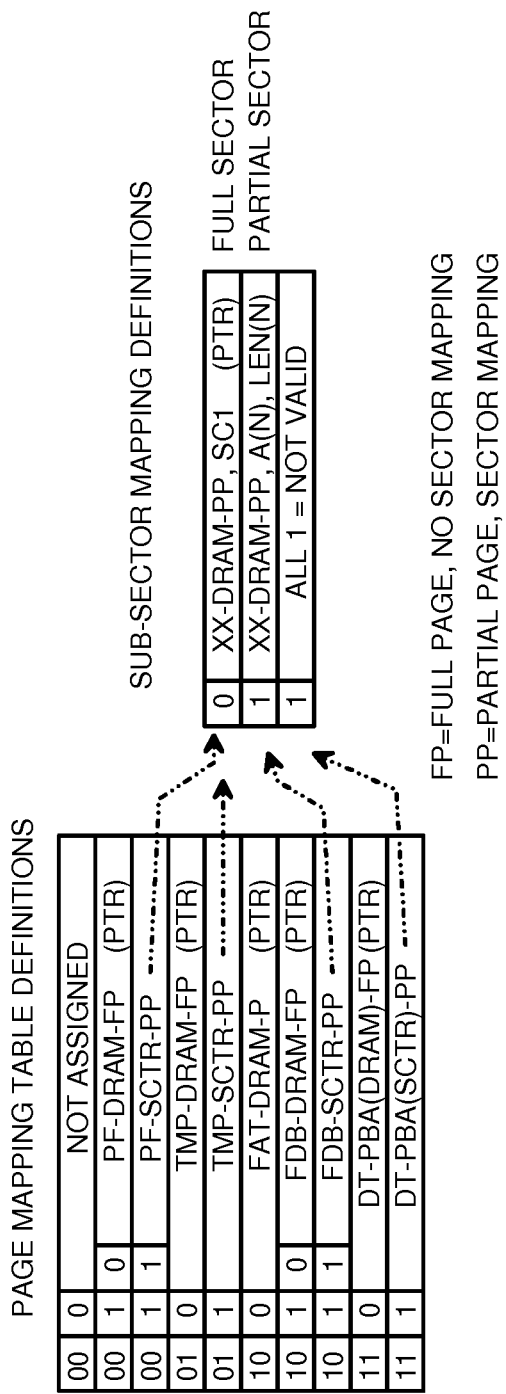
FIG. 6 shows mapping entries with definitions for different data types in a super-endurance flash drive.

FIG. 6 shows mapping entries with definitions for different data types in a super-endurance flash drive. Other than have separate mapping tables for each type of data, such as shown in FIG. 3, a unified mapping table may be used to map logical address from the host to physical addresses in SSS DRAM buffer 20 or in flash memory 30.

The first bits in each mapping entry in the unified table are a code that identifies the type of host data mapped by that entry. The code bits also indicate the size of data being mapped, whether a full page (FP), or a partial page (PP).

At power up, the SSS controller loads previously stored mapping tables which have the known data types assigned. After a format, only FAT/FDB entries and tables exist. Any new files and sub-directories are built up after that. All reads from the host should be from a known data type, since the data must have been written before a read can occur. For writes, only new file data needs a data type determination. All of the writes from the host access the FDB/FAT.

The SSS controller examines the FDB/FAT for a new entry to determine the data type of the LBA. The file description in the FDB has the file name and file extension, the starting cluster location, file size, and creation date. The SSS controller uses this information to determine and categorize the data into one of several data types:

PF—Paging files created by memory management for swapping files from main memory to hard disk. These paging files are detected by being in a range of logical addresses that are used for paging files. The host allocates an available LBA range for the Virtual Memory needed. The SSS controller examines the FDB to determine the LBA range for paging files.

TMP—Temporary files from the host. Temporary files are detected by the SSS controller reading the file extension in the FDB entry that was written just before the temp file is written by the host. The host is expected to write the FAT, then the FDB, and then the temp file, so a file extension of .tmp in the FDB access identifies the file as being a temp file. The FDB has the beginning cluster location, size (number of clusters used), while the FAT has the information of the next cluster location (if the file larger than one cluster) or the end of file (last cluster of file).

FAT—FAT entries from the host. The host writes two copies of the FAT, FAT1 to a first pre-defined range of address, and FAT2 to an immediately following range of addresses. For example, logical addresses 0-8 KB are to FAT1 and logical addresses 8 KB to 16 KB are to FAT2. The actual address ranges depend on the SSD's capacity (ex: 16 GB), cluster size (ex: 8 KB), which determine the total FAT table entries needed, such as 16 MB/8 KB=2M. For FAT32, each entry needs 32-bits, so the address range is 2M×4=8 MB. If each LBA is 512 B, then its LBA range (8M/512=16K) is "FAT_beg" to "FAT_beg+16K.

FDB—File Descriptor Block (FDB) entries from the host. These are identified by SSS controller 40 as being an access that immediately follows a FAT access. After a format, the root directory is known for the FDB. Every file and sub-directory write will update the FDB. SSS firmware knows the write to the FDB because the LBA range is already marked for the FDB. The firmware further examines writes to the new sub-directory. The new sub-directory provides the beginning cluster and size information, to identify the new FDB data type. There may be a pre-defined address range for FDB entries that may also aide or accelerate FDB detection.

DT—Data Files for user or application data. These are the normal data files that are stored in flash, either immediately or after being cached in SSS DRAM buffer 20 for a period of time and then cast-out or coped in when power is shut off.

The command from host 100 provides four different parameters: Starting LBA address, Sector Count (SC), Command (read/write), and Data (none if read). To identify each different type of data, the firmware of SSS 40 needs to manage the file system such as FAT32. Starting from LBA 0, it will verify the file system to be FAT32, it will then find the LBAs for FAT, FDB, temp files etc., from the file system written in SSD. It also relies on SSS 40 to actively look over the changes in FDB for update file/subdirectory information to identify the newly used LBAs for their data type. For example, if a new temp file name is written to FDB, the information will include the starting cluster LBA of the temp file. SSS 40 will then identify the LBAs related to the cluster as temp data type. In one alternate design, the command from host 100 is modified by SEED 11 to include a fifth parameter of data type to improve the endurance and performance of the flash device. The data type can be temp file, page file, FAT, FDB, FA DATA, and NFA DATA (each data type can be one of the variations: normal, compressed, encrypted, compressed+encrypted, etc). For example the "page" (normal) has data type 0x00 and "NFA data" (compressed+encrypted) has data type 0x13. This fifth parameter can free the special firmware of SSS 40 mentioned above. For example, the temp file has a data type of "temp" as the fifth parameter of the host write command data. Also, SEED 11 may support host system 100 settings to enhance flash memory device endurance. The system settings such as redirect page files, windows temporary files, specific program temporary directory, event logs, index, system restore, etc. may be copied to host DRAM 10. Other setting changes such as defragmentation disable, reduction of the recycle bin size, TRIM enable, and S.M.A.R.T. enable, etc. also can enhance flash memory device endurance. Alternatively, SEED 11 can send proprietary commands to flash memory device 102 with parameters such as page number, page count, command(n), data instead of LBA number, Sector Count, Command, Data. Command(n) may include the read/write information of the data type temp file, page file, FAT, FDB, FA DATA, and NFA DATA (each data type can be one of the variations: normal, compressed, encrypted, compressed+encrypted, etc).

To reduce wear of flash memory 30 and increase endurance of the flash drive, only data files (DT) are routinely allowed to be written to flash memory. Paging files (PF), temp files (TMP), FAT and FDB entries are not written to flash, but are only stored in SSS DRAM buffer 20. These types may be written to flash on power off/loss, or when there is insufficient space in SSS DRAM buffer 20 to cache all data of that type.

The first three data-type bits identify the data type as follows:
001—paging files (PF)
01X—temp files
100—FAT entries
101—FDB entries
11X—Data Files (DF, user data)

The last type bit, either the third or fourth bit, identifies the entry as being an entry for a full page (FP) or for a partial page (PP). An entry for a full page contains a pointer (PTR) to the data's location in DRAM (in SSS DRAM buffer 20), while an entry for a partial page contains a pointer (SCTR) to a sub-sector mapping table. When the last type bit is 0, the page is a full page of data. There is no need for sector mapping.

When the last type bit is 1, the page is partially mapped. The entry in the unified mapping table is a pointer (SCTR) to a sub-sector mapping table for that particular page. There may be several entries in that sub-sector mapping table. Each entry is for one or more full sectors, and/or a partial sector. When the first sub-sector bit is a 0, the sub-sector entry is for a full sector of host data. The sub-sector entry contains a pointer to the page of data in SSS DRAM buffer 20, and the sector number(s) SC# of the full sector(s), which is an offset from the start of that page being pointed to.

When the first sub-sector bit is 1, the sub-sector entry is for a partial sector. The sub-sector entry contains a pointer to the start of a page of data in SSS DRAM buffer 20, an offset A(N) to the first byte within that page, which is the start of the partial sector of data, and the length LEN(N) of the partial sector of data.

Figure 7:
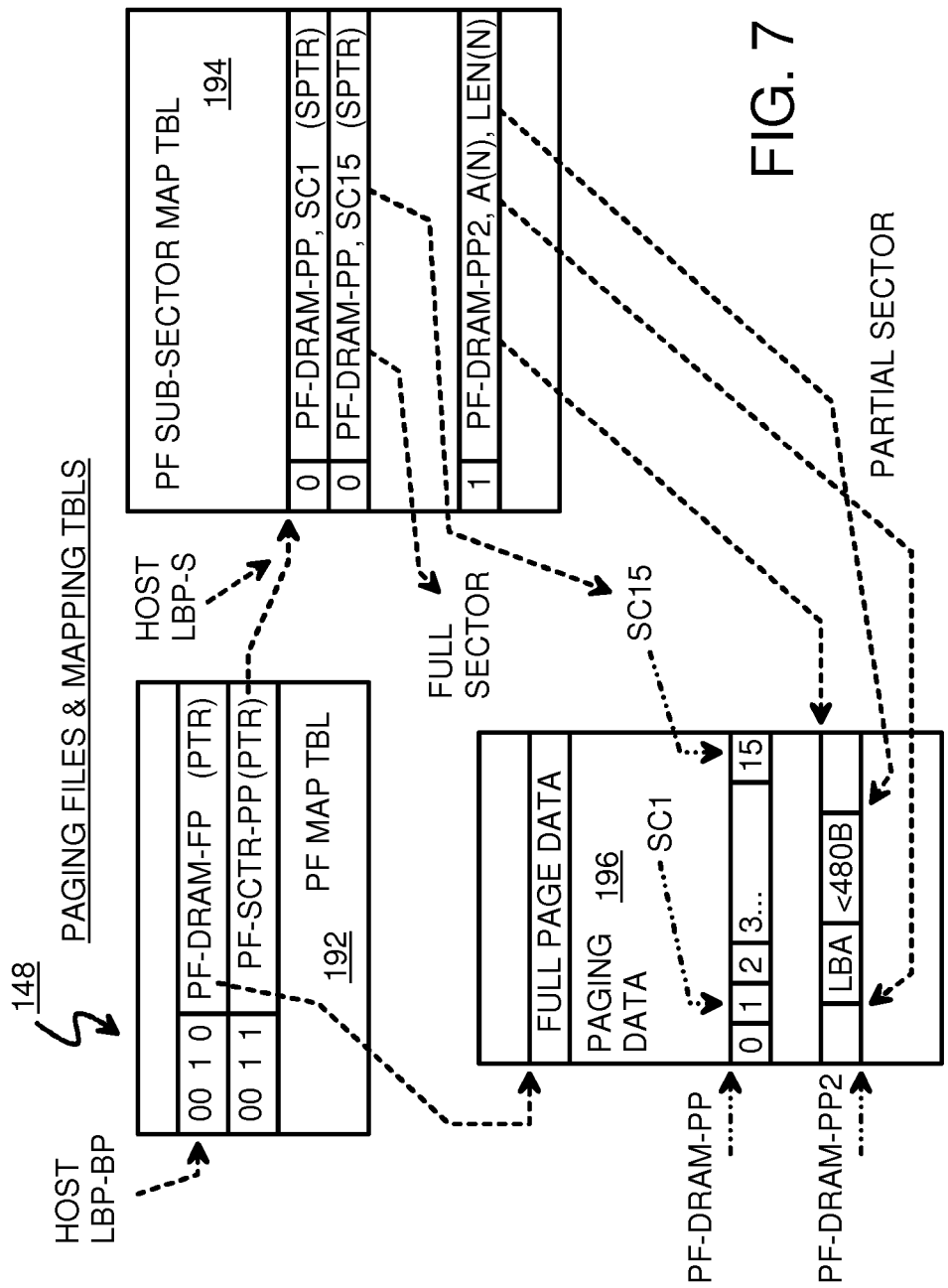
FIG. 7 is a diagram showing full-page and partial-page mapping of paging files using a unified mapping table and a sub-sector mapping table.

FIG. 7 is a diagram showing full-page and partial-page mapping of paging files using a unified mapping table and a sub-sector mapping table. The first three type bits are 001, identifying the entries as for paging files (PF). Paging files are stored in SSS DRAM buffer 20, not in flash memory 30, to reduce flash wear. These entries are for mapping paging area 148 (FIG. 3) of SSS DRAM buffer 20. These entries are part of unified mapping table 192.

The first entry shown has a final type bit of 0, indicating that this entry is for a full page (FP). The first entry contains a pointer (PTR) to a location in SSS DRAM buffer 20 where the full page of data is stored for this paging file in paging data area 196. The host data may be read from or written to this location in SSS DRAM buffer 20 to complete the host request.

The second entry shown has a final type bit of 1, indicating that this entry is for a partial page (PP). The SSS controller examines the incoming page data to determine if it is a full or a partial page of data. For a partial page of data, the SSS controller also determines each sector (0-15) to be a full sector data, a partial sector data, or no data. The second entry contains a pointer (PTR) to a location in SSS DRAM buffer 20 where the sub-sector mapping table for this entry in unified mapping table 192 is located. The logical sector extracted from the host address is used to select a current entry in sub-sector mapping table 194.

The first two entries in sub-sector mapping table 194 are for full sectors, since their first sub-sector bit is 0. These entries contain a pointer (SPTR) to a page location (PF-DRAM-PP) in SSS DRAM buffer 20 where the sector data is stored. The sector data is stored in sequence, starting with sector 0 (SC) to the final sector SC15. Each full-sector entry in sub-sector mapping table 194 also contains the sector number SC#, which points to the sector within the page pointed to by pointer PF-DRAM-PP. These are full sectors of data.

The final entry in sub-sector mapping table 194 is for a partial sector, since its first sub-sector bit is 1. There is at most one partial sector allowed per partial page entry, and per sub-sector mapping table 194. This entry contains a pointer to a different page location (PF-DRAM-PP2) in SSS DRAM buffer 20 where the partial sector data is grouped and stored in one page.

The entry also contains a starting byte offset, A(N), that points to the starting byte of this partial sector of data within the located page, and the length (LEN(N). The partial-sector entry contains the LBA (block+page+sector) followed by the actual partial-sector data, which is less than 480 bytes, due to the overhead of LBA and LEN(N) in this embodiment. Partial sectors of 480 to 512 bytes use a full sector. This scheme also applies to temp etc. files and the FDB. The unit size of full page data and partial page grouping data is page. The stripe-ready unit may include the full page data and grouped partial page data. When the dirty data in the data write cache is greater than the stripe-ready unit, the device controller manages the dirty data and writes to the flash memory through the flash memory interface.

FAT and FDB

The FAT is the File Allocation Table. The Host may use a cluster as the basic size for each table entry. When the cluster size is 4 KB, the capacity of the FAT is 4096 KB, with 1024 FAT table entries needed. For FAT32, an entry of 0000,0000 means the entry is not used, an entry of FFFF, FF0F means the end of a file, and a valid number (such as between 1~1023), means the next cluster is the location of the file. The Host uses the FDB to find the file's starting location and uses the FAT content to track the location of the next cluster and successive clusters (for larger files) until the "FFFF,FF0F" entry indicating the end of the file is reached.

FDB is the File Description Block. The FDB stores the file names and sub-directory names. In a typical FAT file system, the FDB starts after the FAT2 Table. The start of the FDB is the root directory. After formatting, the FDB only occupies the first cluster after the FAT2 table. The corresponding FAT entry is FFFF,FF0F for the end of the file. When a file is written, the file data is written to this cluster until the cluster is full, then it finds a new cluster to fill with the file's data. The location (entry) of FAT1/2 is changed from FFFF,FF0F (end of file) to the location of the new cluster. If a new sub-directory created, the sub-directory is given a new cluster location. The FAT table is fixed in size and fixed in continuous locations. The FDB locations are fixed once created, but newly created/expanded clusters are scattered at any unused locations.

The FDB keeps file information such as the file name and extension, first cluster location, create/modify date/time, size, etc. The FDB is frequently changed. The FAT is only changed at creation of files and sub-directories, and when new clusters are needed as files are enlarged or added to directories.

Figure 8:
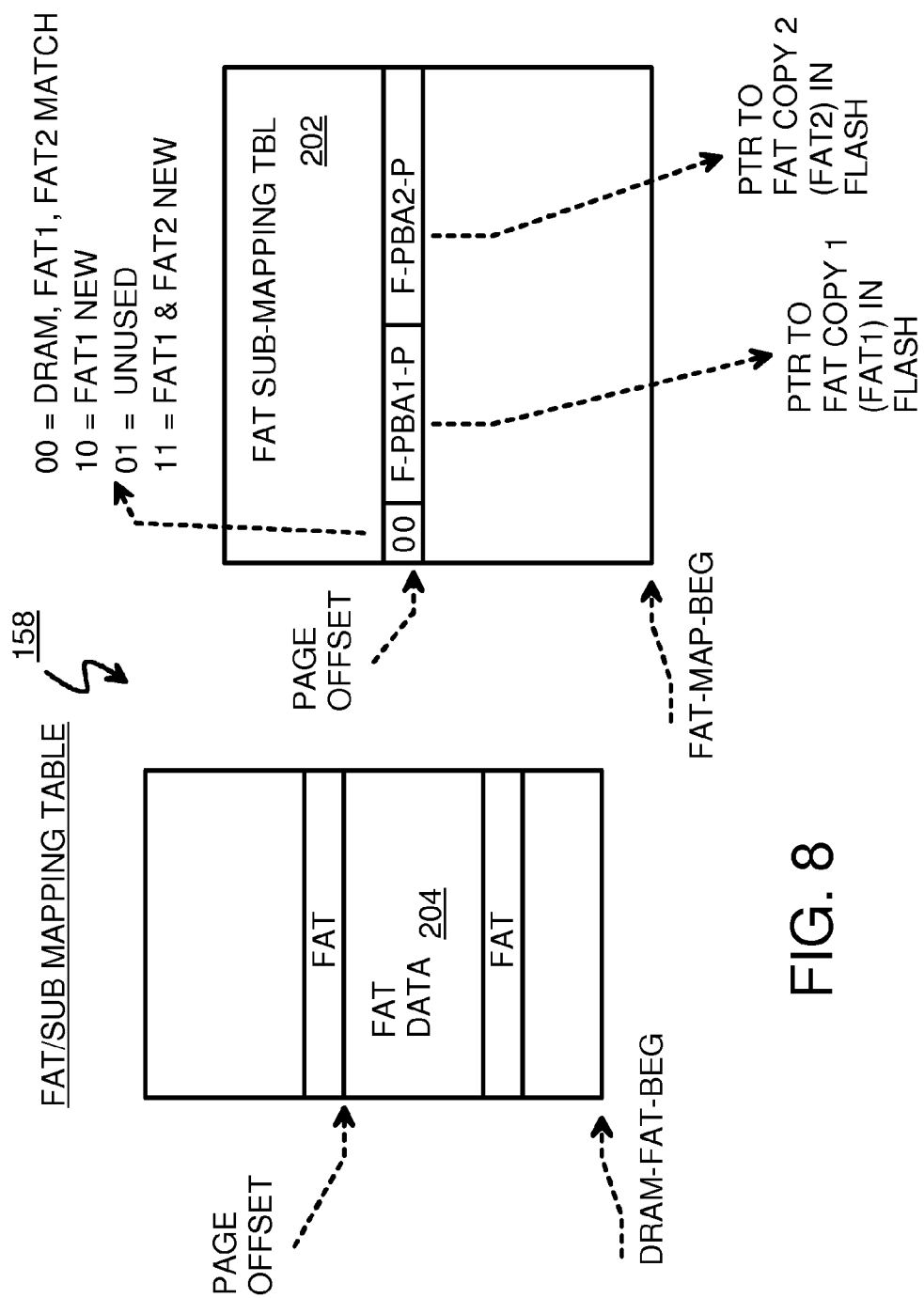
FIG. 8 shows FAT mapping in the unified mapping table.

FIG. 8 shows FAT mapping in the unified mapping table. FAT entries are stored in a pre-determined range of addresses that is typically defined by the operating system. When SSS controller 40 detects a write to a logical address within this range, the data is written as FAT entries 204 to FAT area 158 in SSS DRAM buffer 20. A pointer, DRAM-FAT-BEG points to the start of the FAT entries 204, while the page offset within FAT entries 204 is obtained from logical address from the host.

The OS maintains two copies of the FAT entries, known as FAT1 and FAT2. The OS first writes the entry to FAT1, then writes the identical entry to FAT2. The entry for FAT2 is written to a logical location that is the first FAT1 entry's page offset, plus the size of the FAT1 table.

Rather than maintain two tables of entries in SSS DRAM buffer 20, one for FAT1 and the other for FAT2, a single FAT table is maintained in DRAM. Only the FAT1 entries are stored. The FAT2 entries are assumed to match the earlier FAT1 entries, and SSS controller 40 could verify that FAT2 matched FAT1, and signal an error when a mismatch occurred, or it can simply be assumed that the OS never writes a FAT2 that mismatches an earlier FAT1. Thus both FAT1 and FAT2 reads and writes from the host map to the same FAT entry in FAT entries 204 in SSS DRAM buffer 20.

A single sub-mapping entry in FAT sub-mapping table 202 is maintained for both the FAT1 and FAT2 accesses. The page offset to this entry is the page offset from the start of the FAT tables for FAT1, or the page offset for FAT2 minus the size of the FAT1 table.

Each sub-mapping entry in FAT sub-mapping table 202 has a pointer to the FAT1 entry in flash memory 30, F-PBA1-P, and a second pointer to the FAT2 entry in flash memory 30, F-PBA2-P. FAT entries may be maintained only in SSS DRAM buffer 20 to reduce wear, and then copied to flash memory 30 only on power off/loss. Alternately, all modified FAT entries may be copied to flash periodically, such as once per day, or may be copied to flash immediately when the increased flash wear is deemed acceptable.

While only one entry is maintained in DRAM for both FAT1 and the identical FAT2, two separate copies are maintained in flash memory 30.

The first two bits of each sub-mapping entry in FAT sub-mapping table 202 are FAT flash status bits. The FAT flash status bits indicate whether FAT1 or FAT2 has been copied to flash, or are only valid in SSS DRAM buffer 20. When the FAT flash bits are 00, the FAT entry in DRAM has been copied to both the FAT1 and FAT2 tables in flash, and all three locations are valid. When the FAT flash bits are 10, FAT1 has been written to DRAM by the host but the host has not yet written the identical entry FAT2, and the new FAT1 has not yet been copied to flash. When the FAT flash bits are 11, both FAT1 and FAT2 have been written to DRAM by the host but neither FAT1 nor FAT2 has been copied to flash. Flash writes of FAT entries may be reduced, increasing endurance.

In a multi-channel controller structure, the device controller reads FAT table data from flash memory 30 and goes through the multi-channel structure to the ETL FAT table.

In a multi-channel controller structure, the device controller writes FAT table data which is arranged as a multiple pages, (the number of the multiple is equivalent to multi-channel) from the ETL FAT table to flash in stripes according to a policy (such as based on time elapsed, capacity allocated, etc.) or upon power off or power failure to best utilize the flash interface bandwidth.

Figure 9A:
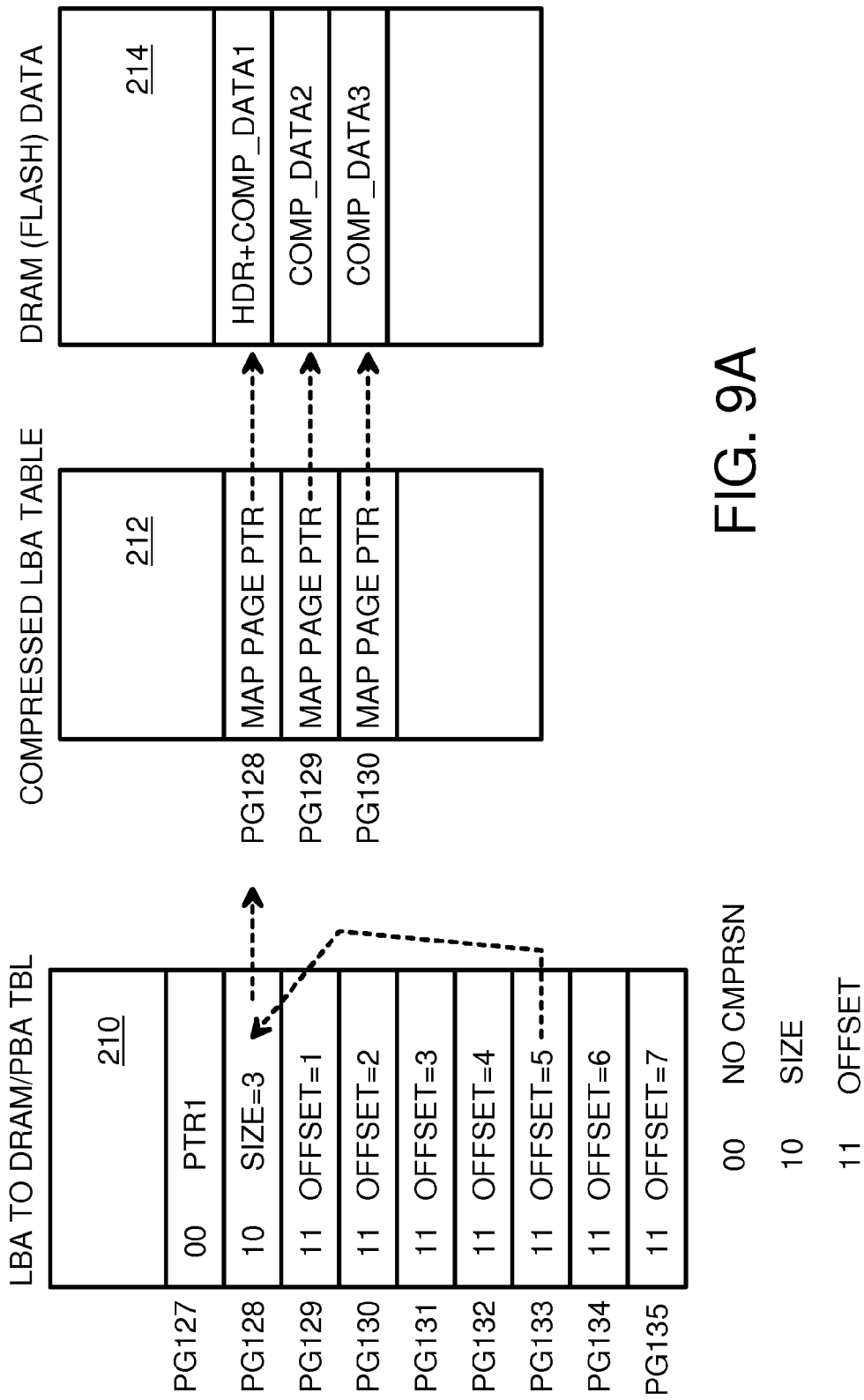
FIG. 9A shows mapping of compressed pages.

FIG. 9A shows mapping of compressed pages. Flash endurance may also be increased by storing compressed data in flash pages rather than regular data, since compression reduces the data size and this the storage requirements in flash. Compressed data may be cached in SSS DRAM buffer 20 and backed up to flash memory 30 when the cache is full.

SSS controller 40 may compress some data before storing it in SSS DRAM buffer 20 or flash memory 30. The host writes several pages of data in the normal fashion, indicating the logical address (LBA) and page numbers and sector counts that indicate the total data length. For example, the host may write DATA1 to LBA 2048, SC=128, which is 8 pages of 16 sectors per page. A compression engine in SSS controller 40 compresses the 128 sectors of data to 48 sectors of compressed data. These 48 sectors of compressed data includes a header and some compressed data stored in a first compressed page, and two more pages of compressed data, for a total of 3 compressed pages. This is a significant reduction from the uncompressed 8 pages.

SSS controller 40 stores these 3 pages of compressed data in SSS DRAM buffer 20 or in flash memory 30 as compressed data 214 at a page pointed to by pointers MAP_PAGE_PTR that are stored in compressed LBA table 212.

SSS controller 40 also creates entries in LBA table 210, which may be part of a unified mapping table such as unified mapping table 192. However, the entries in LBA table 210 are specially coded for mapping to compressed data.

The mapping entries in LBA table 210 each include first two bits that are compression status bits. The first compression status bit is a 1 for a compression access, and 0 for regular host accesses of uncompressed data. For example, page 127 maps to uncompressed data using PTR1.

When the first compression status bit is a 1, and the second compression status bit is 0, the entry in LBA table 210 contains the total size (number of pages) of the uncompressed data segment. When the first compression status bit is a 1, and the second compression status bit is 1, then the entry in LBA table 210 contains an offset. The offset is and offset to the first entry for this segment of compressed data, the entry that contains the size of the segment.

In the example of the host writing DATA1 to LBA 2048, SC=128, which is 8 pages, there are 8 page entries in LBA table 210 for this segment of DATA1. The LBA of 2048 selects page 128 in LBA table 210. A total of 8 page entries in LBA table 210 are used. The first entry has the total data size and the following 7 entries contain offsets that point back to the first entry.

When the host reads page 133 (LBA=2128, SC=16), the entry in LBA table 210 for page 133 is read. The offset stored in page 133's entry is 5, which points back to the entry for page 128, which contains the total compressed data size of 3 pages. The entry for page 128 is read from compressed LBA table 212, along with the next two entries of compressed LBA table 212, for a total of 3 page entries, which is the size of the compressed data. Each entry points to a page of compressed data in SSS DRAM buffer 20 or in flash memory 30. All three compressed pages are read and decompressed to recover the original 8-page block of uncompressed data. Then the data the host is reading is extracted from the uncompressed data. The compression can be in-line with a hardware circuit or a firmware controlled algorithm.

FIG. 9B highlights data flow in the DRAM buffer for user data. Host write data is written into the data-in buffer and the data type is identified, either as paging files, temp. etc. files, user data, FDB, or FAT data types. If the data is compressed or encrypted, compression and/or encryption is performed.

The user data is categorized as either Frequently-Accessed (FA) or Non-Frequently-Accessed (NFA), depending on the access frequency. Hot data (FA) is stored in a separate cache in the DRAM buffer than cold data (NFA). Having both FA and NFA caches can improve flash endurance.

The segregated FA data is then categorized as either full page or partial page data. The partial page data is grouped together with other partial pages to produce full sector data that is grouped together, and partial sector data that is also grouped together for different host accesses and LBA's. The NFA data is also categorized as full and partial page data, with the partial page data grouped together with other full sectors and partial sectors.

FIG. 9C highlights data flow in the DRAM buffer for paging and temp files. Host write data is written into the data-in buffer and the data type is identified, either as paging files, temp. etc. files, user data, FDB, or FAT data types. If the data is compressed or encrypted, compression and/or encryption is performed.

Paging data is stored separately from temp. files in the DRAM buffer. Having dedicated buffer areas for paging files and for temp files can improve flash endurance.

The segregated paging data, after any compression and/or encryption, is categorized as either full page or partial page data. The partial page paging data is grouped together with other partial pages of paging data to produce full sector data that is grouped together, and partial sector data that is also grouped together for different paging files.

The temp., etc. files are also compressed and/or encrypted, and categorized as full and partial page temp data, with the partial page data grouped together with other full sectors and partial sectors of temp files.

Figure 10:
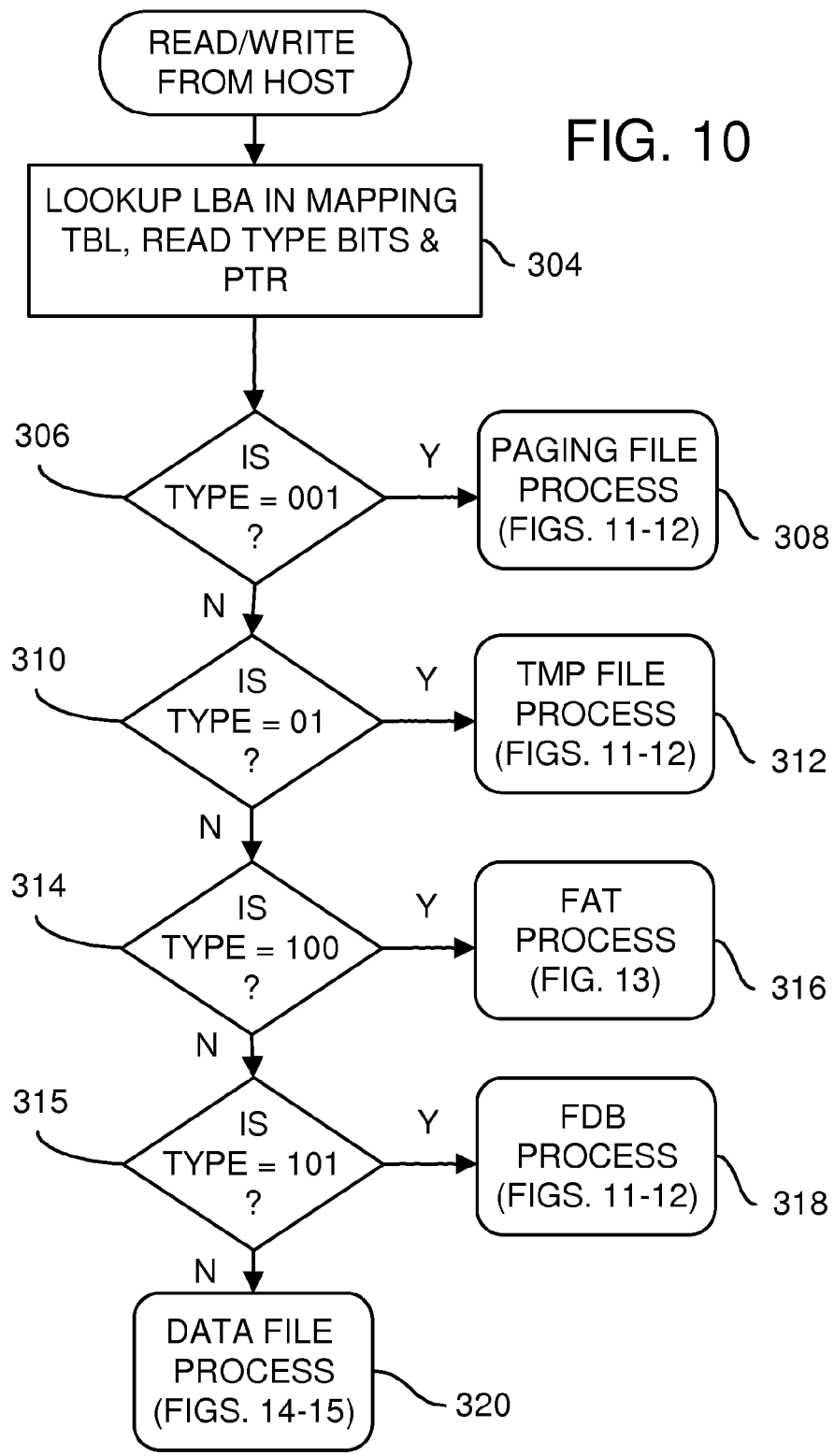
FIG. 10 is a flowchart of categorizing a data type for a host request and dispatching paging, temp, FAT, FDB, of user data processes to handle the host request.

FIG. 10 is a flowchart of categorizing a data type for a host request and dispatching paging, temp, FAT, FDB, of user data processes to handle the host request. The host request includes a logical address such as a LBA that is used as an index into unified mapping table 192, step 304. A matching entry from unified mapping table 192 is read. The first few bits in the matching entry are data-type bits that indicate what kind of data is stored at this logical address. Different processes are dispatched depending on the data-type bits.

When the data-type bits for the matching entry are 001, step 306, the data is for paging fields for swaps to peripheral storage from main memory that is performed by a memory manager on the host. These files do not need to be stored in flash, reducing wear. Paging file process 308 is called, which is detailed in FIGS. 11-12.

When the data-type bits for the matching entry are 01, step 310, the data is for temporary files that do not need to be stored in flash memory. Temp file process 312 is called, which is also detailed in FIGS. 11-12.

When the data-type bits for the matching entry are 100, step 314, the data is for FAT entries. FAT process 316 is called, which is detailed in FIG. 13.

When the data-type bits for the matching entry are 101, step 315, the data is for FDB entries. FDB process 318 is called, which is detailed in FIGS. 11-12.

When the data-type bits are none of the prior types, data file process 320 is called. Data file process 320 is detailed in FIGS. 14-15. Data files are user and application data that should first be stored in Data Write Cache 154 and later copied to flash memory when evicted from Data Write Cache 154.

When the data-type bits are 000, the matching entry is not yet assigned. This is the first host write to this logical address. Data file process 320, shown in FIG. 15, determines what type of data is being presented by the host and performs the proper process.

FIG. 11 shows a process for reading paging, temp, or FDB files. Separate subroutines could exist for each data type, or a combined flow could be used, since the read process is similar.

Since the host always writes data into the flash drive before reading that data, and entry must already have been loaded into unified mapping table 192 during that host write. Thus a matching entry in unified mapping table 192 should be found for all host reads.

When the data-type bits for the matching entry is XX10 or 010, step 402, then the matching entry is for a full page of data (FP, See FIG. 6). The pointer PTR is read from the matching entry in unified mapping table 192 and used to locate the data to read to the host, step 404.

When the data-type bits for the matching entry is neither XX10 nor 010, step 402, then the matching entry is for a partial page of data (PP, See FIG. 6). The pointer PTR is read from the matching entry in unified mapping table 192 and used to locate the sub-sector mapping table, step 406. The initial sector count is set to 0, step 410 so that the first sector's entry in the sub-sector mapping table is read. When the first bit of the current sector's sub-sector entry is 0, step 412, then a full sector is read from SSS DRAM buffer 20 at a location pointed to by the SCTR pointer read from the current sector's entry in sub-sector mapping table 194, step 414. The current sector is incremented to point to the next sector. When the current sector is not the last sector, step 408, the first bit of the current sector's sub-sector entry is examined, step 412, and the sector processing repeated.

When the first bit of the current sector's sub-sector entry is 1, step 412, then a partial sector is read from SSS DRAM buffer 20. The location of the partial sector is at a page pointed to by the SCTR pointer read from the current sector's entry in sub-sector mapping table 194, step 416. The byte offset to the start of the partial sector in that page is A(N), while the length of the partial sector is LEN(N), all read from the current sector's entry in sub-sector mapping table 194. There can be only one partial sector per page, so the process ends.

Figure 12B:
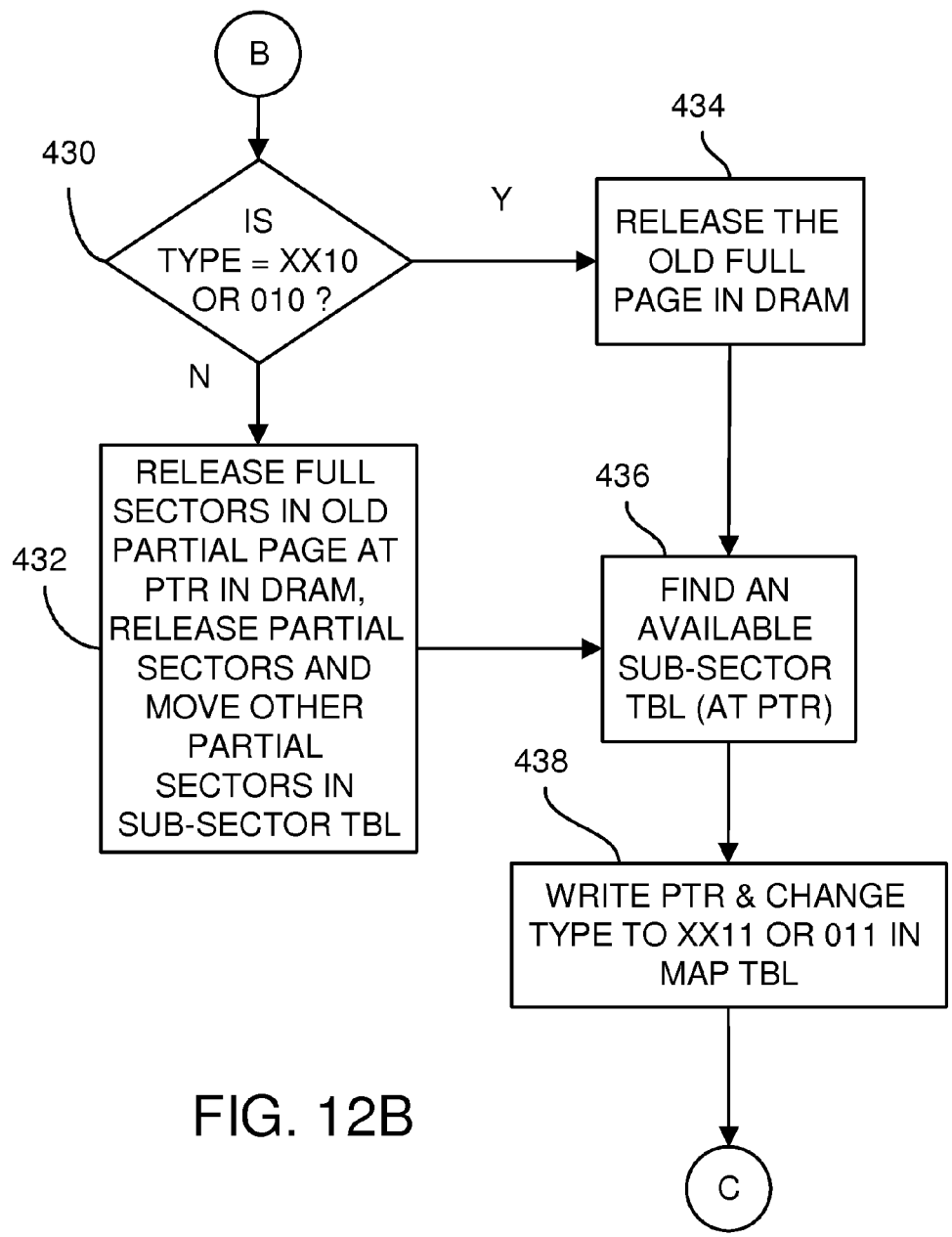
Figure 12C:
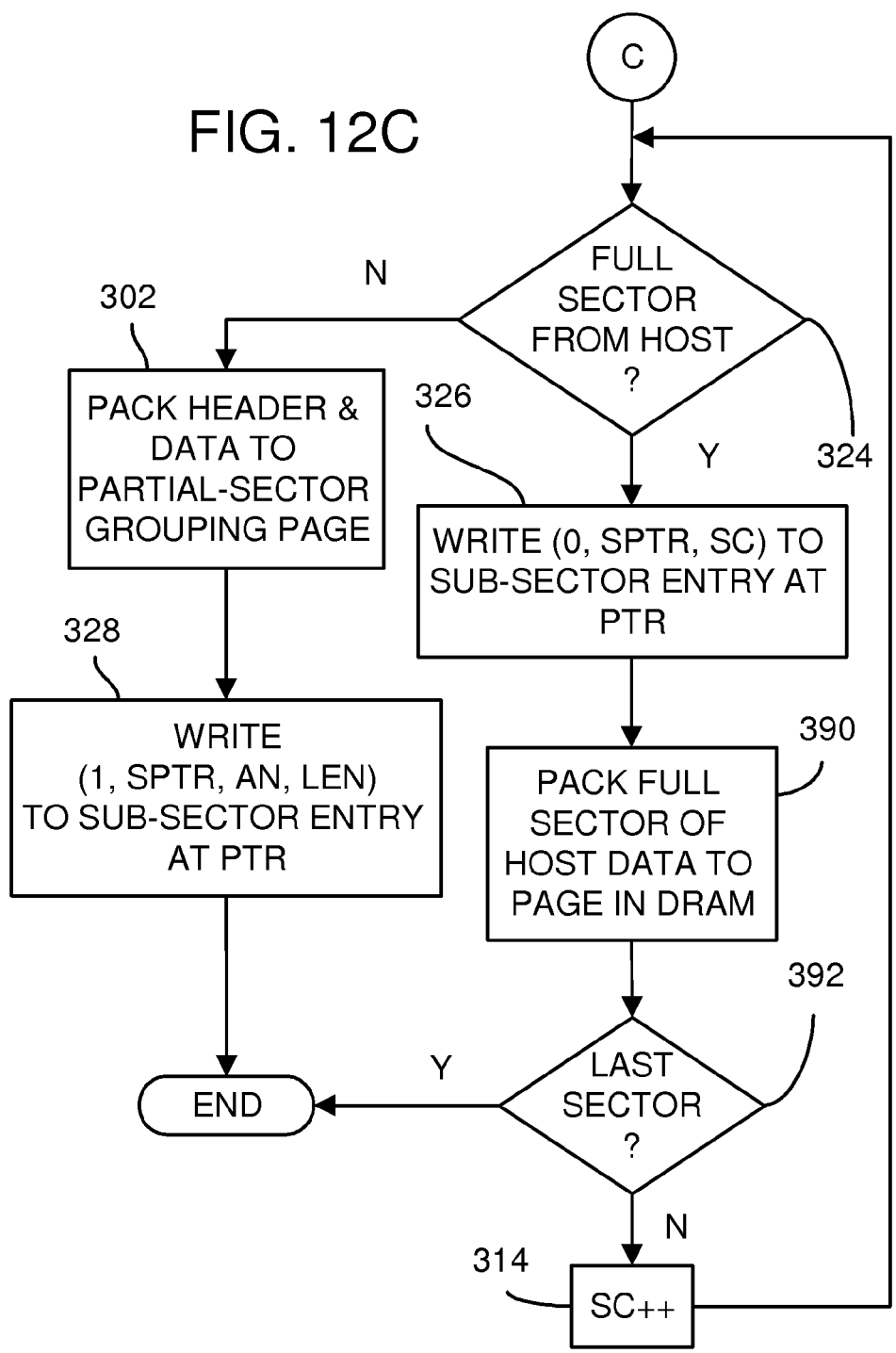

FIG. 12A-C shows a process for writing paging, temp, or FDB files. Separate subroutines could exist for each data type, or a combined flow could be used, since the write process is similar.

In FIG. 12A, when the host provides a new full page of data, step 420, but the data-type bits in the matching entry in unified mapping table 192 are not XX10 or 010, step 424, the old data was for a partial page (PP). The locations pointed to by the SPTR pointers in the entries in sub-sector mapping table 194 are released for future use by writing all 1's to all 16 entries, step 426, and the old sub-sector mapping table 194 pointed to by PTR is also released, since the new data is for a full page and sub-sector mapping table 194 is not needed. A new pointer PTR is written to the matching entry in unified mapping table 192 and the data-type bits changed to XX10 or 010 to indicate a full page (FP), step 428. The full page of host data is then written to SSS DRAM buffer 20 at the location pointed to by PTR from the matching entry in unified mapping table 192, step 422.

When the data-type bits in the matching entry in unified mapping table 192 are XX10 or 010, step 424, the old data was for a full page, and the process can jump directly to step 422. The full page data overwrites old data in SSS DRAM buffer 20

When the host provides a partial page of new data, step 420, the process continues on FIG. 12B. When the data-type bits in the matching entry in unified mapping table 192 are not XX10 or 010, step 430, the old data was for a partial page (PP). The locations pointed to by the SPTR pointers in the entries in sub-sector mapping table 194 are released for future use, step 432, but the old sub-sector mapping table 194 pointed to by PTR is also released.

The old partial sector data needs to be removed. The SSS controller examines the grouping data next to the current one. If no one existed, the SSS controller marks the end pointer and makes the page available for future partial data grouping. If more than one existed, all others are moved up by filling the gap of the old partial data and changing their corresponding sub-mapping table's A(N).

An empty sub-sector mapping table 194 is located in SSS DRAM buffer 20, step 436, and the pointer to this available table, PTR, is created. The new pointer PTR is written to the matching entry in unified mapping table 192, and the data-type bits changed to XX11 or 011 to indicate a partial page (PP), step 438.

When the data-type bits in the matching entry in unified mapping table 192 are XX10 or 010, step 430, the old data was for a full page (FP). The full page of data in SSS DRAM buffer 20 is released for future use by another request, step 434. An empty sub-sector mapping table 194 is located in SSS DRAM buffer 20, step 436, and the pointer to this available table, PTR, is created. The new pointer PTR is written to the matching entry in unified mapping table 192, and the data-type bits changed to XX11 or 011 to indicate a partial page (PP), step 438.

In FIG. 12C, the new partial page data is written into SSS DRAM buffer 20, sector-by-sector, and sector entries are loaded into sub-sector mapping table 194.

When the current sector from the host is a full sector, step 324, a new entry having a first bit of 0 and the pointer SPTR, and the sector number SC are written to sub-sector mapping table 194, step 326. The full sector of host data is written to SSS DRAM buffer 20 at the location identified by SPTR and SC, step 390. When there is another sector of data from the host, step 392, the current sector is incremented, step 314, and the process repeated from step 324. Otherwise the process ends.

Figure 13A:
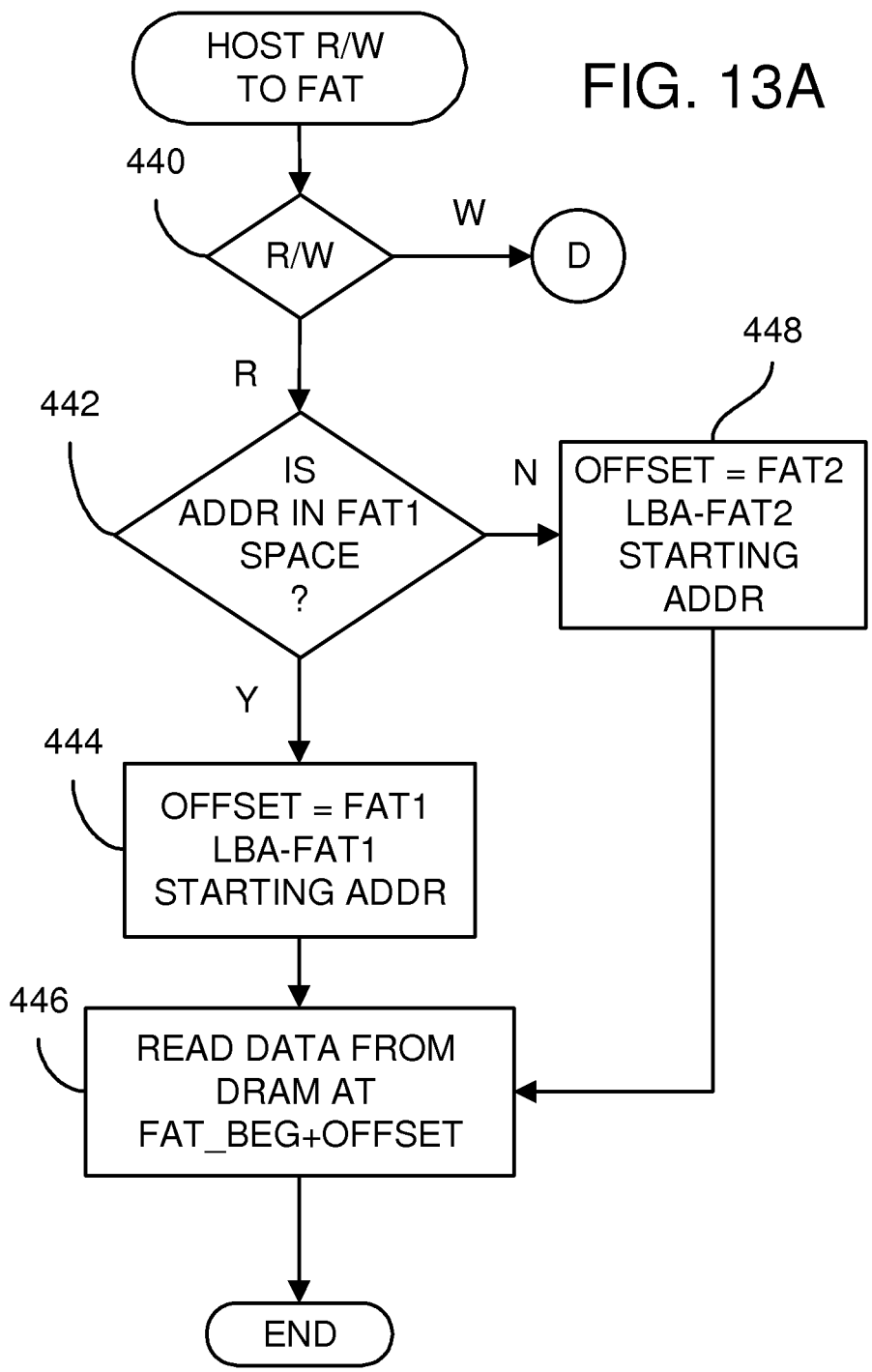
FIG. 13A-B show a FAT access to the endurance-enhanced flash drive.
Figure 13B:
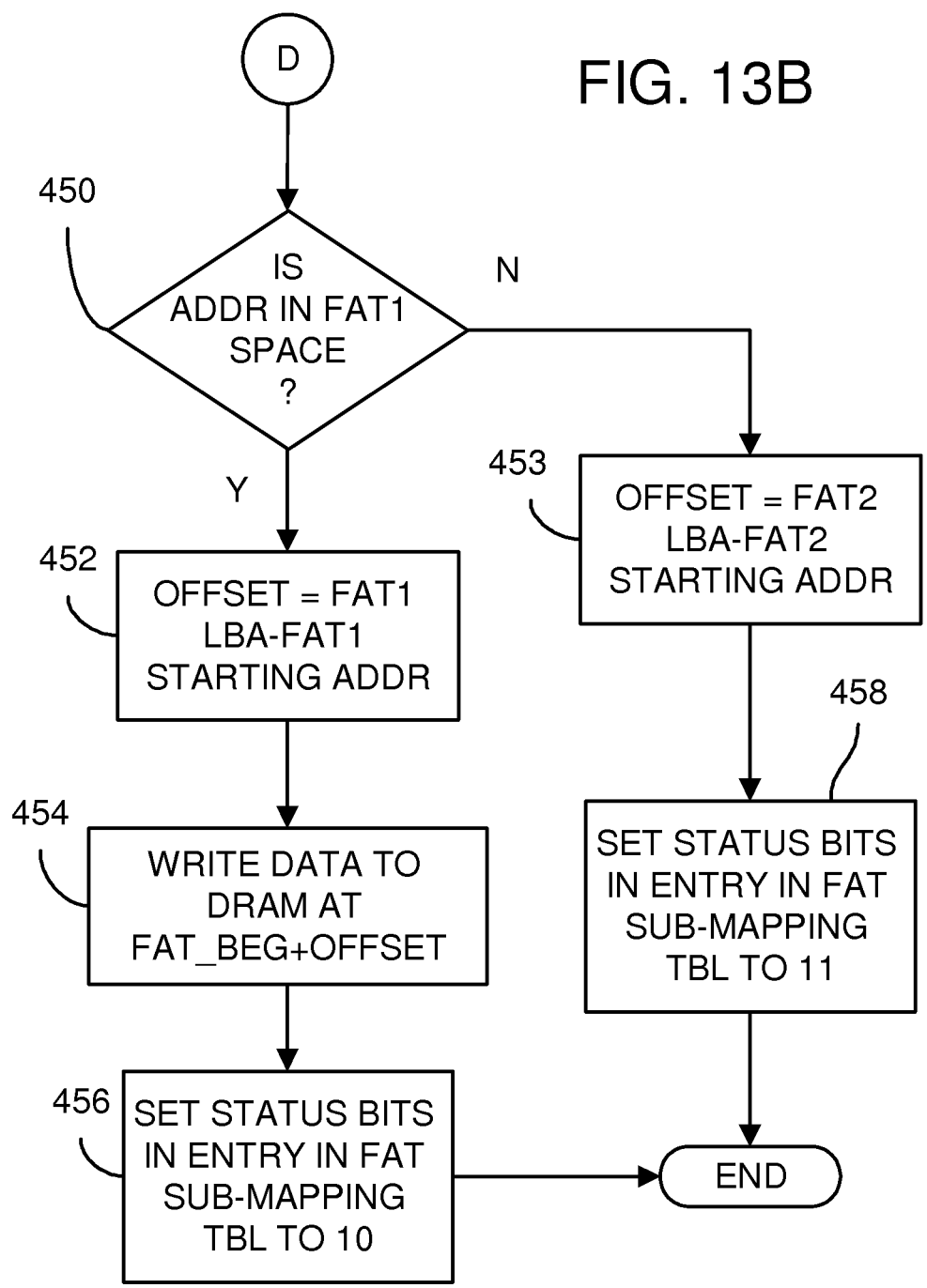

When the current sector from the host is a partial sector, step 324, a header is generated and packed together with the partial sector data from the host into a grouping page that is collecting partial sectors, step 302. The pointer to this grouping page, SPTR, the starting byte offset within the grouping page, A(N), and the length of the partial sector data and the header, LEN(N), are written to a new sub-sector entry in sub-sector mapping table 194, step 328. The process ends since only one partial sector can be received from the host per host request. The header has information of the host LBA (block+page+sector). An end pointer is appended after the data to indicate the availability of the page FIG. 13A-B show a FAT access to the super-endurance flash drive. In FIG. 13A, the host reads or writes to the FAT's logical address range that is determined by the original formatting of the SSD. When the host writes, step 440, FIG. 13B is followed, for host reads, FIG. 13A continues with step 442, where the logical address is compared to the range of addresses of the FAT1 and FAT2 address spaces. When the logical address is within the FAT1 space (in the first half of the FAT area), then the page offset is calculated as the LBA from the host minus the starting address of the FAT1 area, step 444. The FAT entry is read in step 446 from SSS DRAM buffer 20 at an address equal to the FAT beginning address in SSS DRAM buffer 20 (which may not be the same as the FAT address in the logical address space) plus the page offset calculated in step 444. This FAT data is returned to the host to complete the read.

When the logical address is within the FAT2 space (in the second half of the FAT area), then the page offset is calculated as the LBA from the host minus the starting address of the FAT2 area, step 448. The FAT entry is read in step 446 from SSS DRAM buffer 20 at an address equal to the FAT beginning address in SSS DRAM buffer 20 (which may not be the same as the FAT address in the logical address space) plus the page offset calculated in step 448. This FAT data is returned to the host to complete the read. Note that as single FAT entry is stored in SSS DRAM buffer 20 and used for both FAT1 and FAT2 accesses from the host.

In FIG. 13B, the host writes to the FAT. When the logical address is within the FAT1 space (the first half of the FAT area), step 450, then the page offset is calculated as the LBA from the host minus the starting address of the FAT1 area, step 452. The FAT entry from the host is written in step 454 to SSS DRAM buffer 20 at an address equal to the FAT beginning address in SSS DRAM buffer 20 plus the page offset calculated in step 452. The FAT flash status bits in FAT sub-mapping table 202 are updated to 10 to indicate that FAT1 has been updated by the host but FAT2 has not yet been updated, and the FAT1 data in flash memory 30 are stale, step 456. The sub-mapping entry in FAT sub-mapping table 202 is accessed using the page offset calculated in step 452.

When the logical address is within the FAT2 space (the second half of the FAT area), step 450, the host data for FAT2 is ignored. The single FAT entry stored in SSS DRAM buffer 20 has already been written in a prior host access. The FAT flash status bits in FAT sub-mapping table 202 are updated to 11 to indicate that FAT1 and FAT2 have been updated by the host, and the FAT1 and FAT2 data in flash memory 30 are stale, step 458. The sub-mapping entry in FAT sub-mapping table 202 is accessed using the page offset calculated in step 453.

The status bits can be used to backup the dirty FAT contents from SSS DRAM buffer 20 to flash memory 30 either periodically or at power off/loss. The two status bits of FAT sub-mapping table 202 may be examined.

Figure 14:
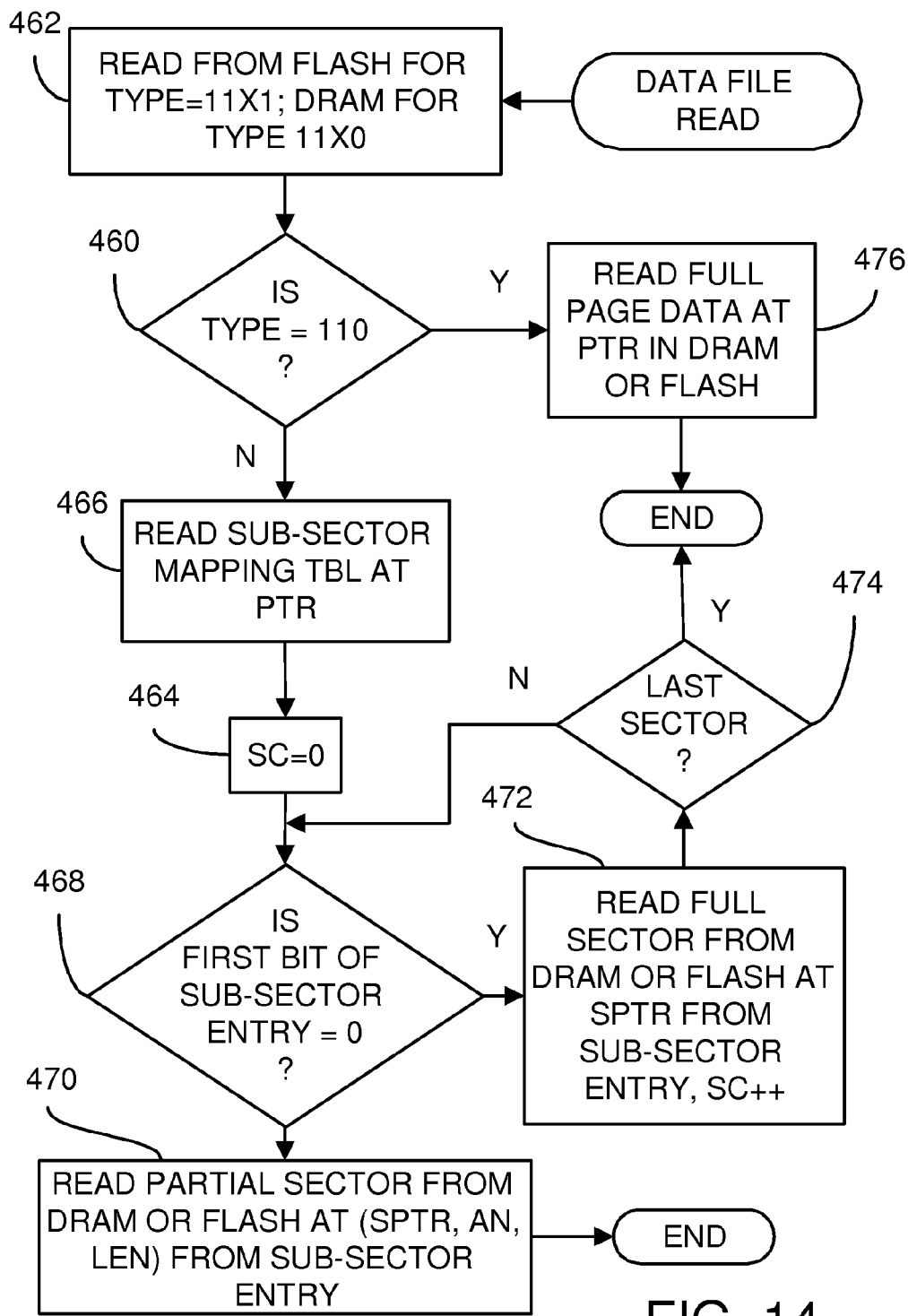
FIG. 14 shows the super-endurance flash drive processing a host read of a user data file.

FIG. 14 shows the super-endurance flash drive processing a host read of a user data file. User data can include data a user of the host stores, or data stored by an application that thus user is executing on the host, but excludes temporary files, paging files, FAT and FDB entries, etc., since these are screened out by prior steps in FIG. 10 before data file process 320. When data file process 320 is called, and the host is requesting a read, the process of FIG. 14 is called. When data file process 320 is called, and the host is requesting a write, the process of FIG. 15 is called.

The logical address from the host request is used to locate a matching entry in unified mapping table 192. The first few bits of the matching entry are read for the data-type bits. When the data-type bits are 11X1, the old data for the matching entry is stored in flash memory 30, so the read will be performed from flash memory 30. When the data-type bits are 11X0, the matching entry refers to data stored in SSS DRAM buffer 20, so DRAM will be accessed for the host read data, step 462.

When the data-type bits are 110, step 460, the data is stored as a full page, and a full page is read from SSS DRAM buffer 20, step 476, using the pointer PTR from the matching entry to located the read data. If the host is requesting only a few sectors from the page, these sectors are extracted from the full page and sent to the host. If the data was identified as being stored in flash memory 30 in step 462, then flash memory 30 is read using the pointer PTR rather than SSS DRAM buffer 20.

When the data-type bits are not 110, step 460, the data was stored as a partial page (PP). The pointer PTR read from the matching entry in unified mapping table 192 is used to locate sub-sector mapping table 194 for reading, step 466. The current sector is initialized to zero, step 464, or to some other value that the host is requesting. The entry in sub-sector mapping table 194 for the current sector is read. When the first bit of this entry is 0, step 468, then the entry points to a full sector. The pointer SCTR is read from the current entry in sub-sector mapping table 194 and used to locate the read data, either in SSS DRAM buffer 20 or in flash memory 30, depending on the result of earlier step 462. The current sector is incremented, step 472. The process loops back to step 468 is the current sector is not the last sector, step 474. The process ends for the last sector.

When the first bit of the entry in sub-sector mapping table 194 for the current sector entry is 1, step 468, then the entry points to a partial sector. The partial sector data is read from a grouping page in either DRAM or flash, depending on the result of earlier step 462, using the pointer, SPTR, the starting byte offset within the grouping page, A(N), and the length of the partial sector data and the header, LEN(N), that are read from the current entry in sub-sector mapping table 194. This partial sector data is sent to the host, along with any earlier full sector data from step 472. The read process ends since only one partial sector is allowed per host request.

FIG. 15A-I shows the super-endurance flash drive processing a host write of a user data file for both frequent and non-frequently accessed areas. User data can include data a user of the host stores, or data stored by an application that thus user is executing on the host, but excludes temporary files, paging files, FAT and FDB entries, etc., since these are screened out by prior steps in FIG. 10 before data file process 320. When data file process 320 is called, and the host is requesting a read, the process of FIG. 14 is called. When data file process 320 is called, and the host is requesting a write, the process of FIG. 15 is called.

Figure 15A:
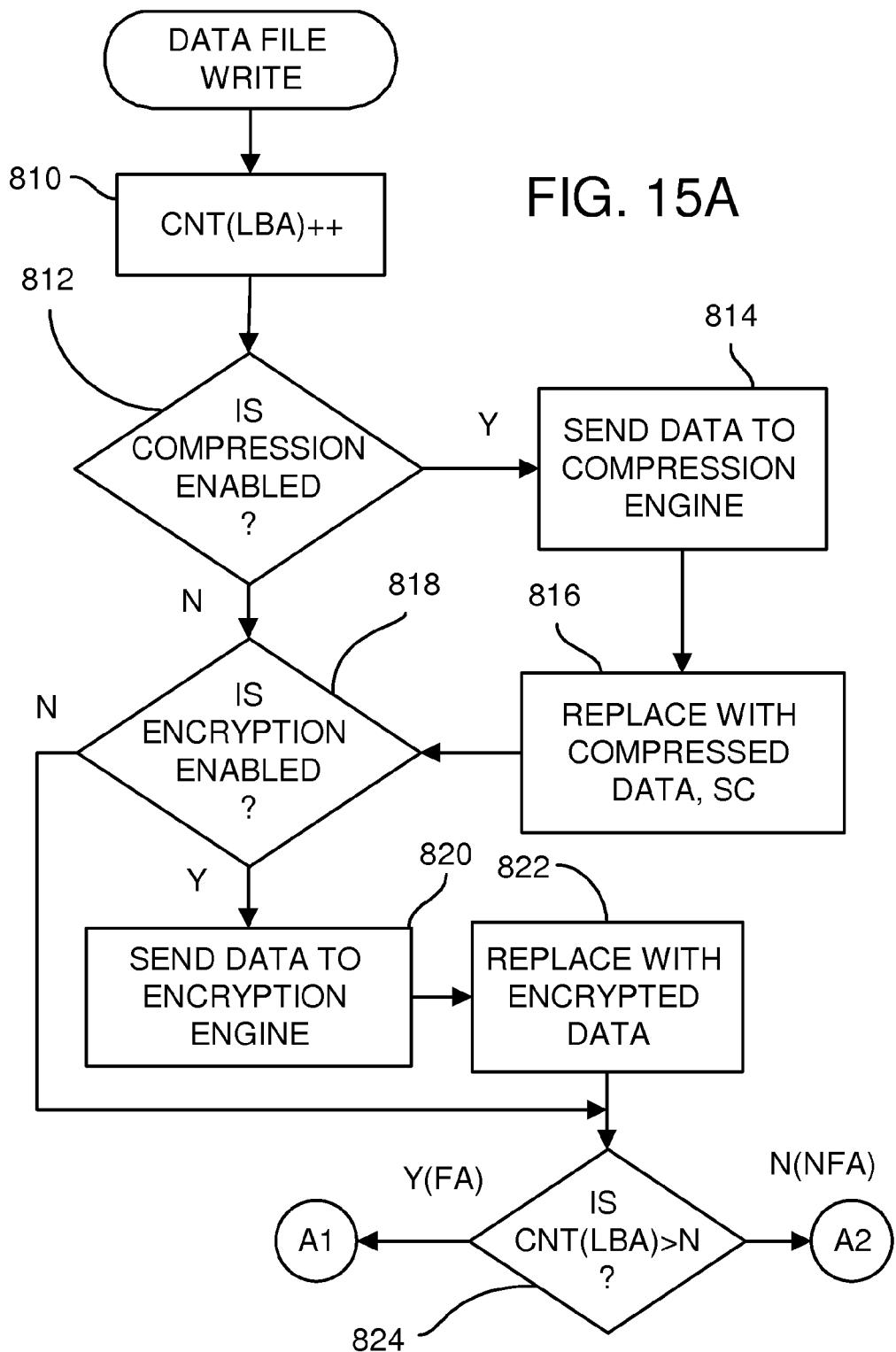

In FIG. 15A, an access counter for the current LBA is incremented, step 810. This access counter is used to distinguish Frequently-Accessed (FA) and Non-Frequently-Accessed (NFA) areas, which are stored in separate FA cache and NFA cache areas of DRAM buffer 20.

When compression is enabled, step 812, the host data is sent to the compression engine, step 814. The compressed data with a new header is usually smaller and this has a new, smaller sector count SC, which is calculated. If compression does not result in a reduced data size, such as due to an added compression header, the controller may select not to perform the compression. The compression entries and mapping tables, such as LBA table 210 and compressed LBA table 212 in FIG. 9A, are populated with entries. The compressed data and new SC then replaces the original host data and SC, step 816.

When encryption is enabled, step 818, the host data or compressed data is sent to the encryption engine, step 820. The encrypted data replaces the original data and has the same size, step 822.

When the access counter has a count greater than threshold N, step 824, the access is to a Frequently-Accessed (FA) LBA, and the flow continues on FIG. 15B. When the access counter has a count less than threshold N, step 824, the access is to a non-Frequently-Accessed (NFA) LBA, and the flow continues on FIG. 15C.

In FIG. 15B, when the host writes a new full page of FA data, step 480, the process of FIGS. 15B, D is executed. The logical address from the host is used to locate a matching entry in unified mapping table 192. When the data-type bits of the matching entry are 000, step 482, there was no prior write by the host to this address. The process jumps to FIG. 15D.

When the data-type bits in the matching entry are 111, step 484 (earlier tests eliminate other possible combinations of the data-type bits), the old page was a partial page (PP). Old sector cleanup process 490 (FIG. 16) is executed to release old partial-page data and the old sub-sector mapping table 194. Then the process continues on FIG. 15D.

When the data-type bits in the matching entry are 110, step 484, the old page was a full page (FP). When the data-type bits were 1101, step 486, the old data was stored in flash memory 30. The old flash data pointed to by the pointer PTR read from the matching entry in unified mapping table 192 is put into the garbage collector for later cleanup and reuse, step 461. Then the process continues on FIG. 15D.

When the data-type bits were 1100, step 486, the old data was stored in SSS DRAM buffer 20. Jumping to FIG. 15D, step 492, the new host data is written to SSS DRAM buffer 20 at a location pointed to by the pointer PTR read from the matching entry in unified mapping table 192. No change in the matching entry is needed.

Figure 15C:
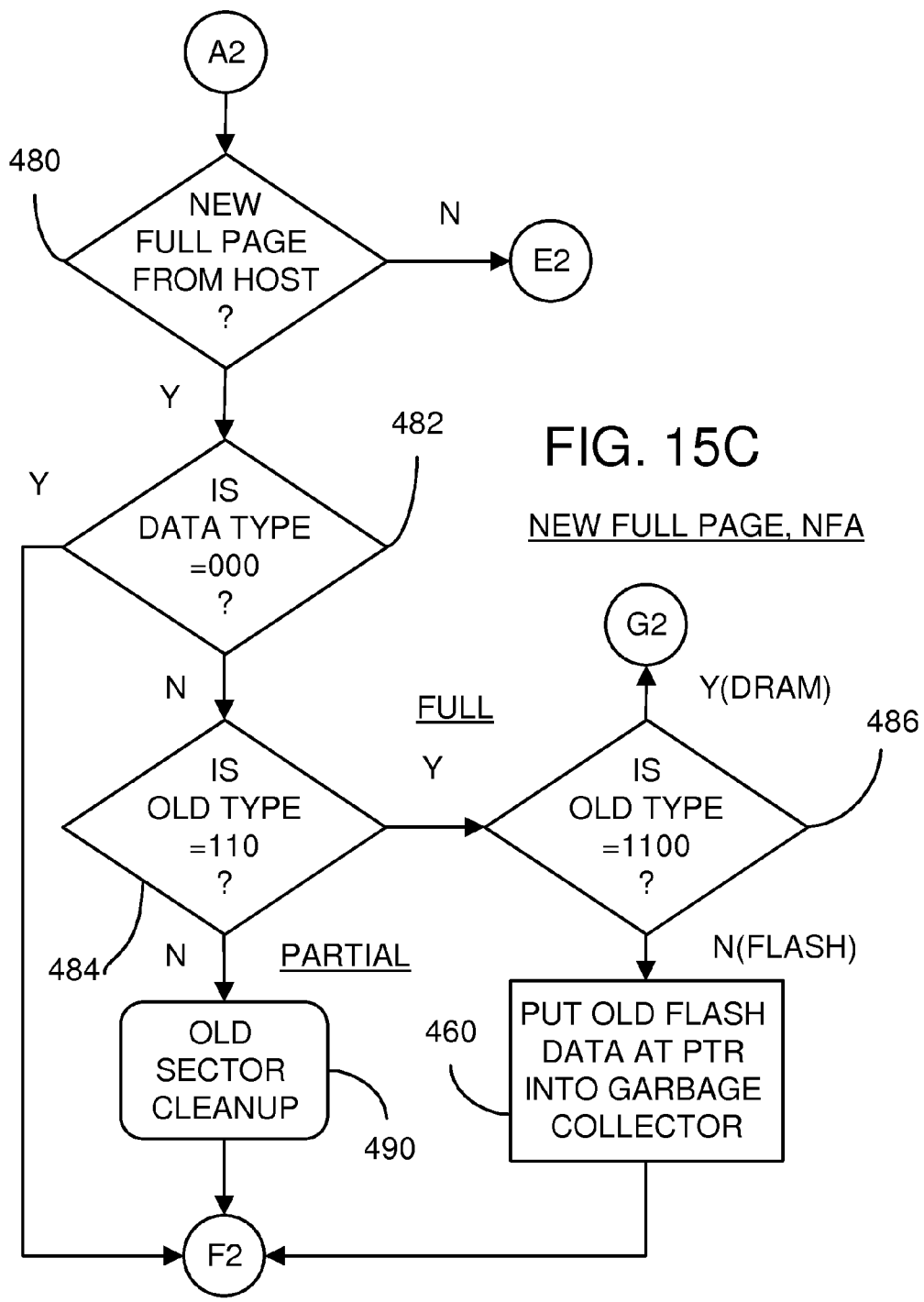
Figure 15D:
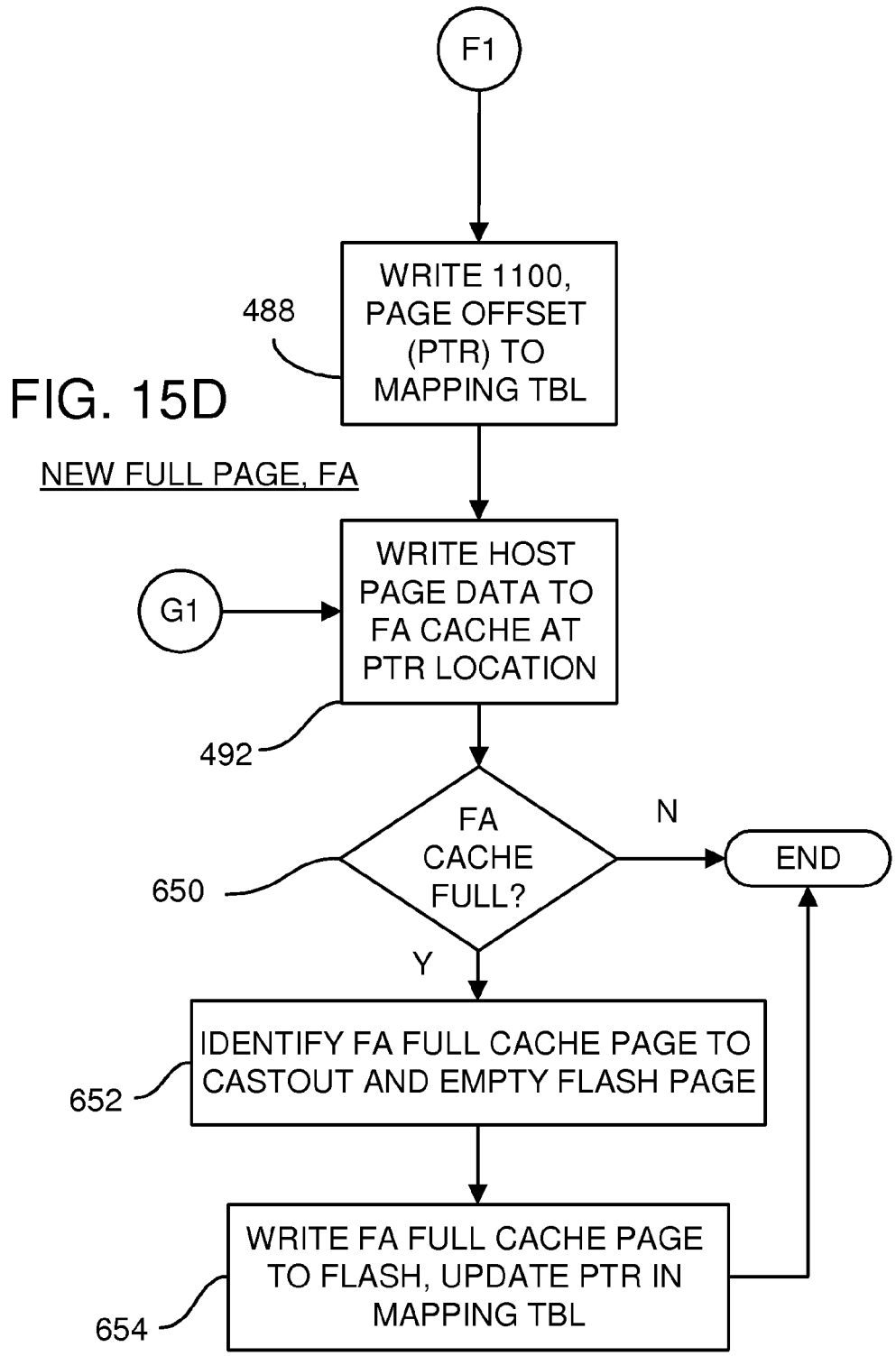

For all other flows into FIG. 15D, the matching entry in unified mapping table 192 is written with data-type bits 1100, and the pointer PTR to a location in SSS DRAM buffer 20 that is selected to receive the host write data, step 488. Data-type bits 1100 indicate a user file of a full page of data store in DRAM. Then the host data is written to that location in DRAM, step 492. When the data write FA cache in SSS DRAM buffer 20 is full or nearly full, step 650, then additional space in the cache is created by a castout. A full FA cache page or full FA cache block to castout is identified, step 652, such as by searching for a Least-Recently-Used (LRU) page. An empty page in flash memory is also located. The FA LRU cache page is copied to the empty page in flash to castout the FA full page, step 654. The castout page's pointer is changed to point to the new location in flash memory, rather than the old location in DRAM. The write process ends.

When the host writes a new partial page of data, step 480 (FIG. 15B), the process continues at FIG. 15F.

In FIG. 15F, when the data-type bits of the matching entry are 000, step 502, there was no prior write by the host to this address. There is no matching entry, or the matching entry is un-assigned to a data type. There is no need to cleanup from an old matching entry, so the process jumps to step 514. Otherwise, the process continues with step 504.

When the data-type bits in the matching entry are 111, step 504 (earlier tests eliminate other possible combinations of the data-type bits), the old page was a partial page (PP). The old partial-page sector data is sent to the garbage collector for sectors stored in flash memory 30 that are being over-written with new host data, step 512. Then the process continues on FIG. 15H.

When the data-type bits in the matching entry are 110, step 504, the old page was a full page (FP). When the data-type bits were 1101, step 506, the old data was stored in flash memory 30. The old flash data pointed to by the pointer PTR read from the matching entry in unified mapping table 192 is put into the garbage collector for later cleanup and reuse, step 510.

When the data-type bits were 1100, step 506, the old data was stored in SSS DRAM buffer 20. The old full page of data pointed to by pointer PTR from the matching entry in unified mapping table 192 and stored in SSS DRAM buffer 20 is released for other use, step 508.

The matching entry in unified mapping table 192 is written with data-type bits 1100, and a new pointer PTR to a location in SSS DRAM buffer 20 that is selected to receive the host write data, step 514. Data-type bits 1100 indicate a user file of a full page of data store in DRAM.

The current sector count is initialized to sector 0, step 516. In step 518, a new sub-sector mapping table 194 is created in SSS DRAM buffer 20 at a location pointed to by the new pointer PTR that was written into the matching entry in the earlier step 514.

In FIG. 15H, when the host is sending a full sector for the current sector count, step 324, the entry in sub-sector mapping table 194 that is selected by the current sector count is written with 00, SPTR, SC, step 326. The type bits 00 indicate a full sector stored in the FA cache in DRAM, while SPTR is a pointer to the FA data in SSS DRAM buffer 20, and SC is the current sector count. The full sector from the host is written to the FA cache in SSS DRAM buffer 20 at the page pointed to by SPTR, and at the sector pointed to by SC, step 330.

When the current sector count is not the last sector on a page, step 332, then the current sector count is incremented, step 334, and the process loops back to step 324 to process the next sector from the host.

When the host is sending a partial sector for the current sector count, step 324, a header is generated and packed together with the partial sector data from the host into a grouping page that is collecting partial sectors for FA user-data accesses, step 322. Type bits 10, the pointer to this grouping page, SPTR, the starting byte offset within the grouping page, A(N), and the length of the partial sector data and the header, LEN(N), are written to a new sub-sector entry in sub-sector mapping table 194, step 329. The type bits 10 indicate a partial sector stored in FA cache area of DRAM. The process ends since only one partial sector can be received from the host per host request.

When the data write FA cache in SSS DRAM buffer 20 is full or nearly full, step 656, then additional space in the cache is created by a castout. A cache page of sector data to castout is identified, such as by searching for a Least-Recently-Used (LRU) page. An empty page in flash memory is also located. The LRU cache page is copied to the empty page in flash to castout the partial page. The castout page's pointer is changed to point to the new location in flash memory, rather than the old location in DRAM. The write process ends. Before the castout happens, multiple writes of data with the same LBA are not written to flash memory 20 to the reduce writes and flash wear.

Figure 15E:
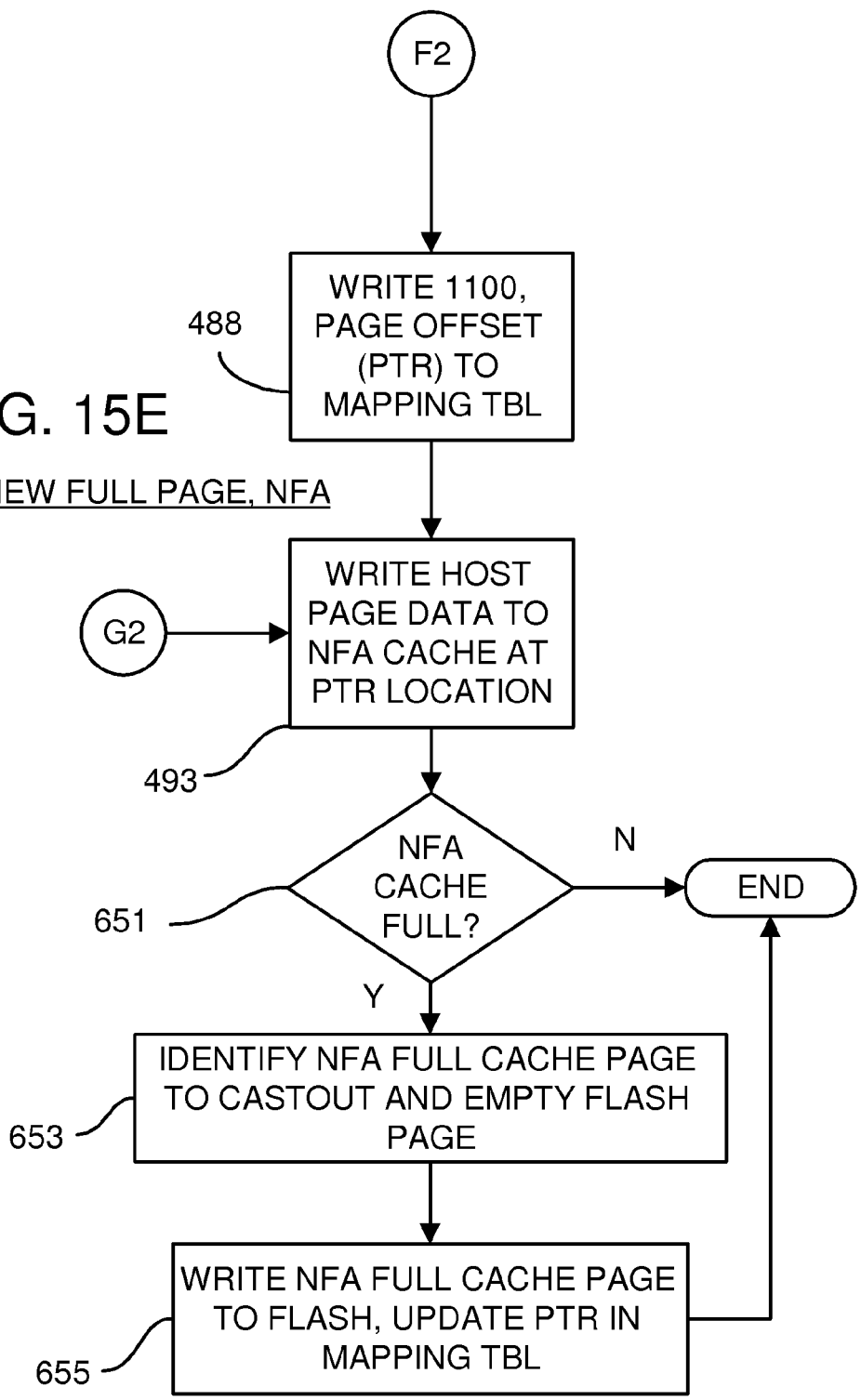

The flows for FA accesses is shown in FIGS. 15B, D, F, H while the flows for NFA accesses is shown in FIGS. 15C, E, G, I. In FIG. 15E, step 651 examines the NFA cache rather than the FA cache in FIG. 15D step 650, and operations are performed on the NFA cache rather than the FA cache. Likewise, in FIG. 15I, partial sectors are packed using the NFA cache in step 323 while full sectors are packed using the NFA cache in step 331. Otherwise, the flows for FA and NFA are quite similar.

Figure 16:
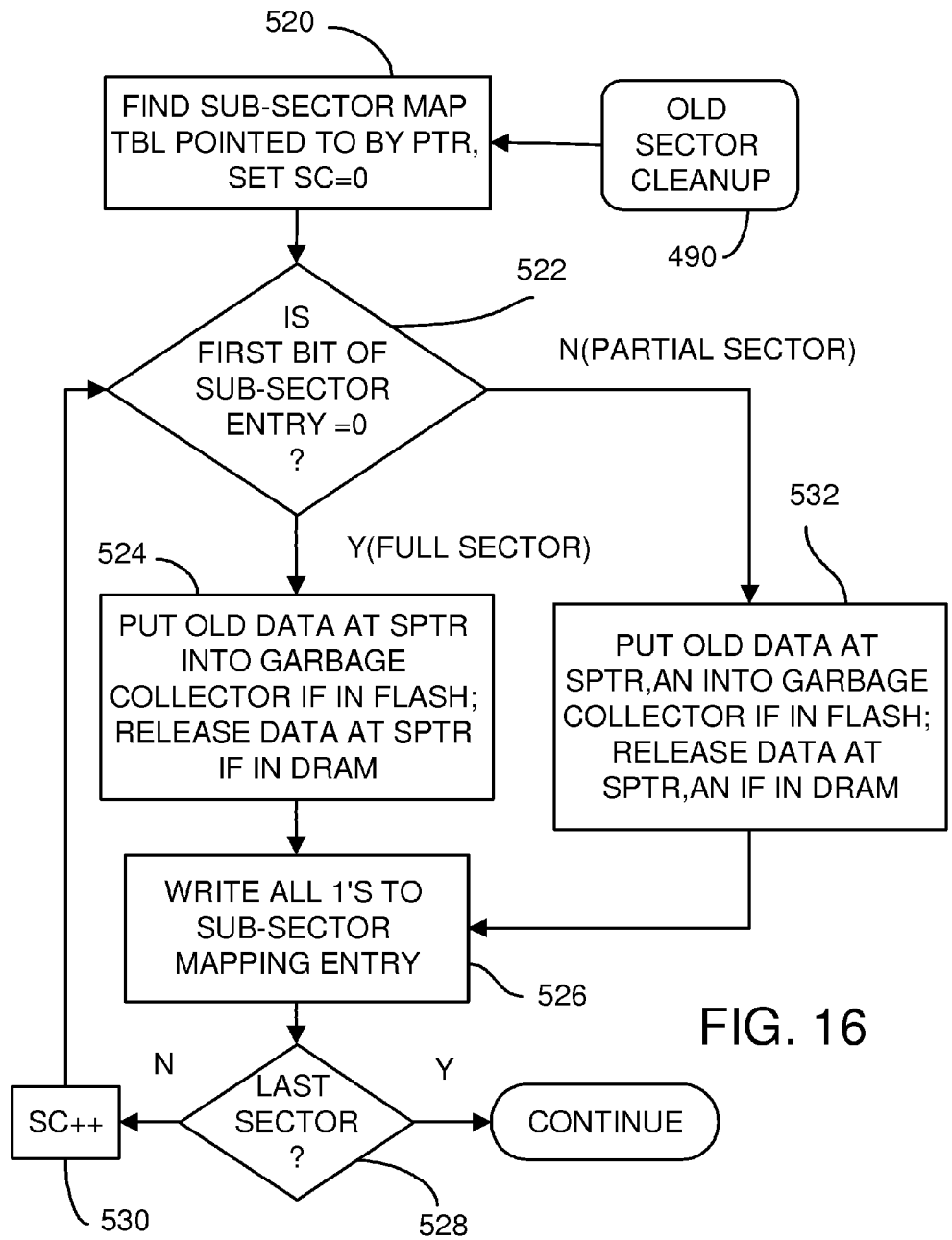
FIG. 16 is a flowchart of an old sector cleanup process.

FIG. 16 is a flowchart of an old sector cleanup process. Old sector cleanup process 490 is called to clean up old entries in sub-sector mapping table 194. Sub-sector mapping table 194 is located using pointer PTR read from the matching entry in unified mapping table 192. The current sector count is initialized to 0, step 520.

When the first bit of the current entry in sub-sector mapping table 194 pointed to by the current sector count is 0, step 522, the entry is for a full sector. The old data pointed to by SPTR read from the current entry is put into the garbage collector for erasure and reuse if in flash (the second bit in the current entry is 1), or is released for use by another process if in SSS DRAM buffer 20 (the second bit in the current entry is 0), step 524.

The current entry in sub-sector mapping table 194 is over-written with all 1's to indicate that the entry is not valid, step 526. When the current sector count is not the last sector in a page, step 528, then the current sector count is incremented, step 530, and the process repeats from step 522.

When the first bit of the current entry in sub-sector mapping table 194 pointed to by the current sector count is 1, step 522, the entry is for a partial sector. The old data pointed to by SPTR read from the current entry is put into the garbage collector for erasure and reuse if in flash (the second bit in the current entry is 1), or is released for use by another process if in SSS DRAM buffer 20 (the second bit in the current entry is 0), step 524. Since the partial sector is in a grouping page, only a portion of a page is released, starting at byte A(N) for length LEN(N), read from the current sector's entry.

The current entry in sub-sector mapping table 194 is over-written with all 1's to indicate that the entry is not valid, step 526. When the last sector is reached, step 528, old sector cleanup process 490 ends and control returns to the calling process.

Figure 17A:
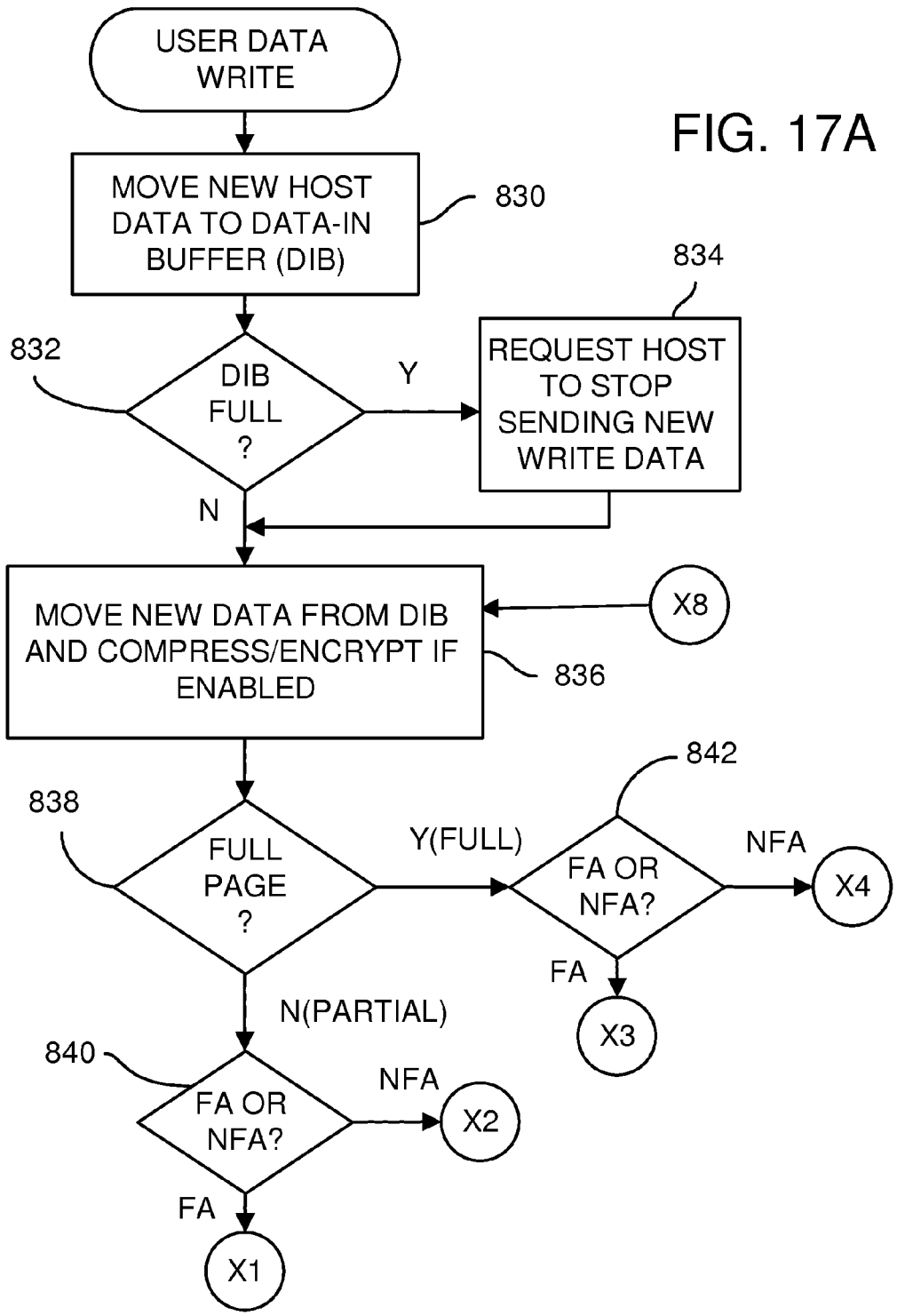

FIGS. 17A-E are a flowchart of user data processing using FA and NFA caches for full and partial pages. In FIG. 17A, the host data is identified as user data. The write data from the host is moved to the Data-In Buffer (DIB), step 830. When the DIB is full, step 832, then the controller sends a request back to the host to request that the host stop sending new write data, step 834. The new write data is then read from the DIB and compressed and/or encrypted if enabled, step 836. The user data is categorized as full or partial page data, step 838, and FA or NFA data, step 840, 842.

Figure 17B:
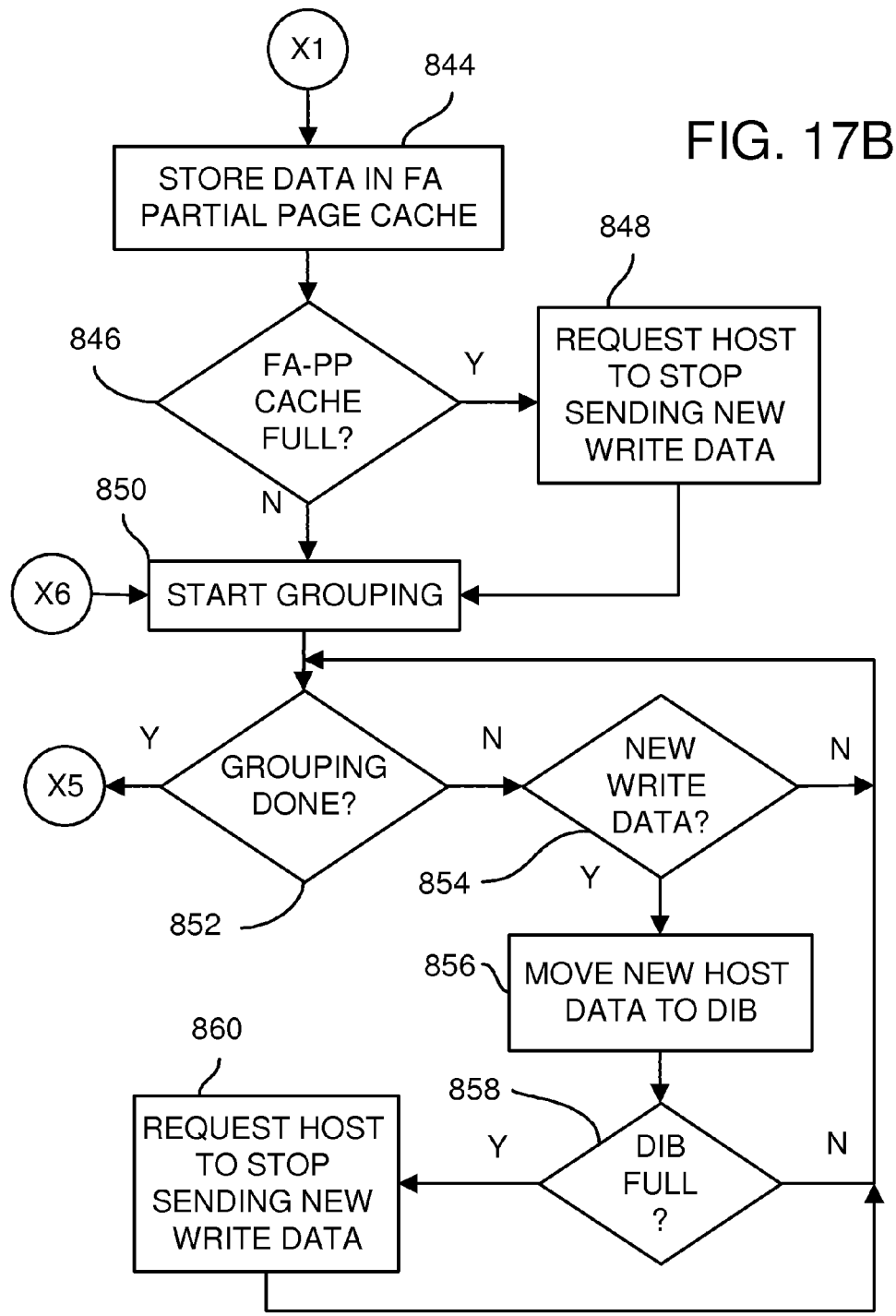

In FIG. 17B, partial page FA user data is processed. The data is stored in the FA partial page (FA-PP) cache in DRAM, step 844. When the FA-PP cache is full, step 846, then the host is requested to stop sending more data, step 848. The partial page data is grouped together with other partial page data from other host writes, step 850. This grouping operation may require several cycles. When the grouping operation is completed, step 852, then the process continues on FIG. 17E. When grouping is not yet completed, step 852, and new write data from the host is received, step 854, this new data is moved to the DIB, step 856. When the DIB is full, step 858, then the controller sends a request back to the host to request that the host stop sending new write data, step 860. The process continues until grouping is completed, step 852.

Figure 17C:
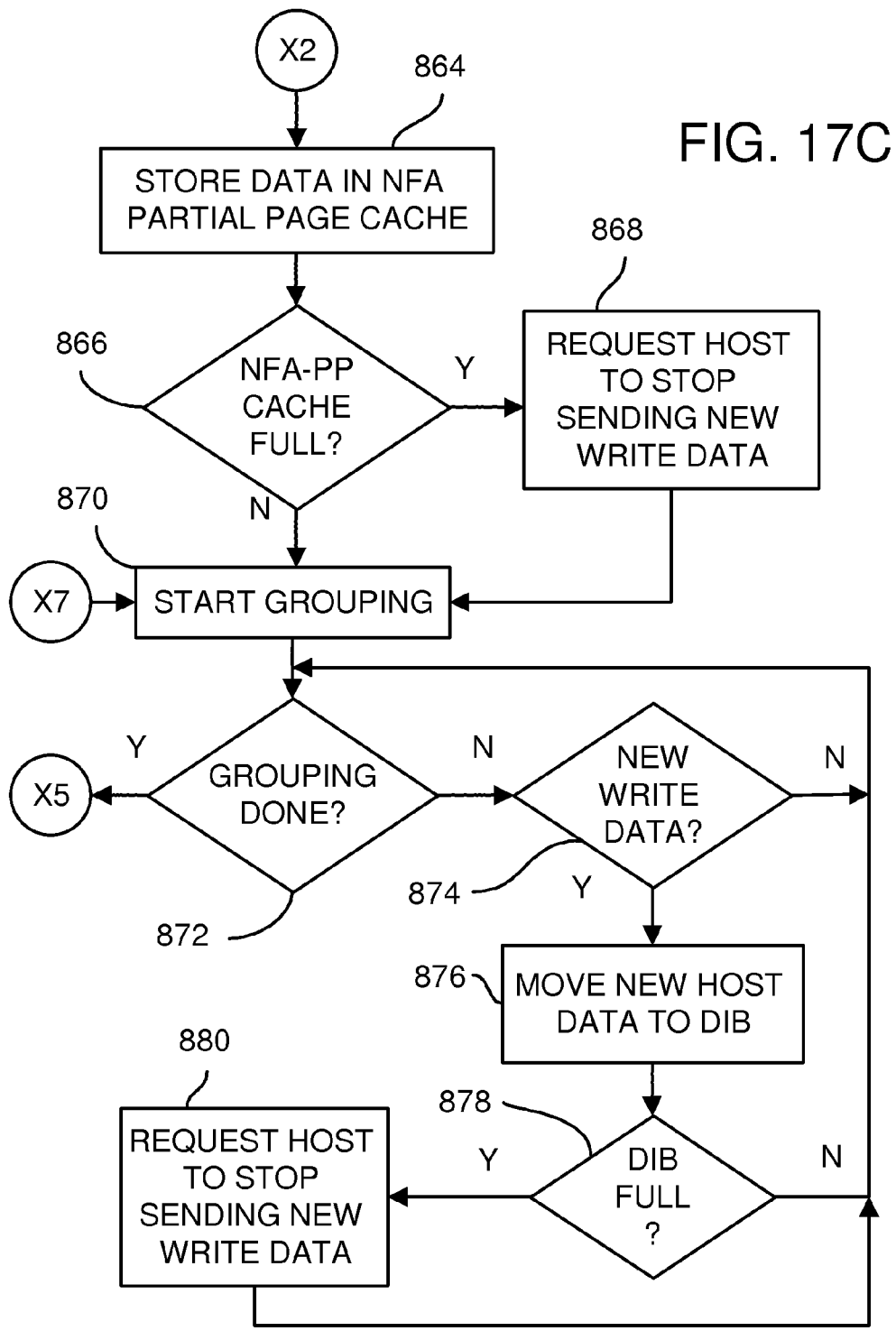

In FIG. 17C, partial page NFA user data is processed. The NFA data is stored in the NFA partial page (NFA-PP) cache in DRAM, step 864. When the NFA-PP cache is full, step 866, then the host is requested to stop sending more data, step 868. The partial page data is grouped together with other partial page data from other host writes, step 870. This grouping operation may require several cycles. When the grouping operation is completed, step 872, then the process continues on FIG. 17E. When grouping is not yet completed, step 872, and new write data from the host is received, step 874, this new data is moved to the DIB, step 876. When the DIB is full, step 858, then the controller sends a request back to the host to request that the host stop sending new write data, step 880. The process continues until grouping is completed, step 872.

Figure 17D:
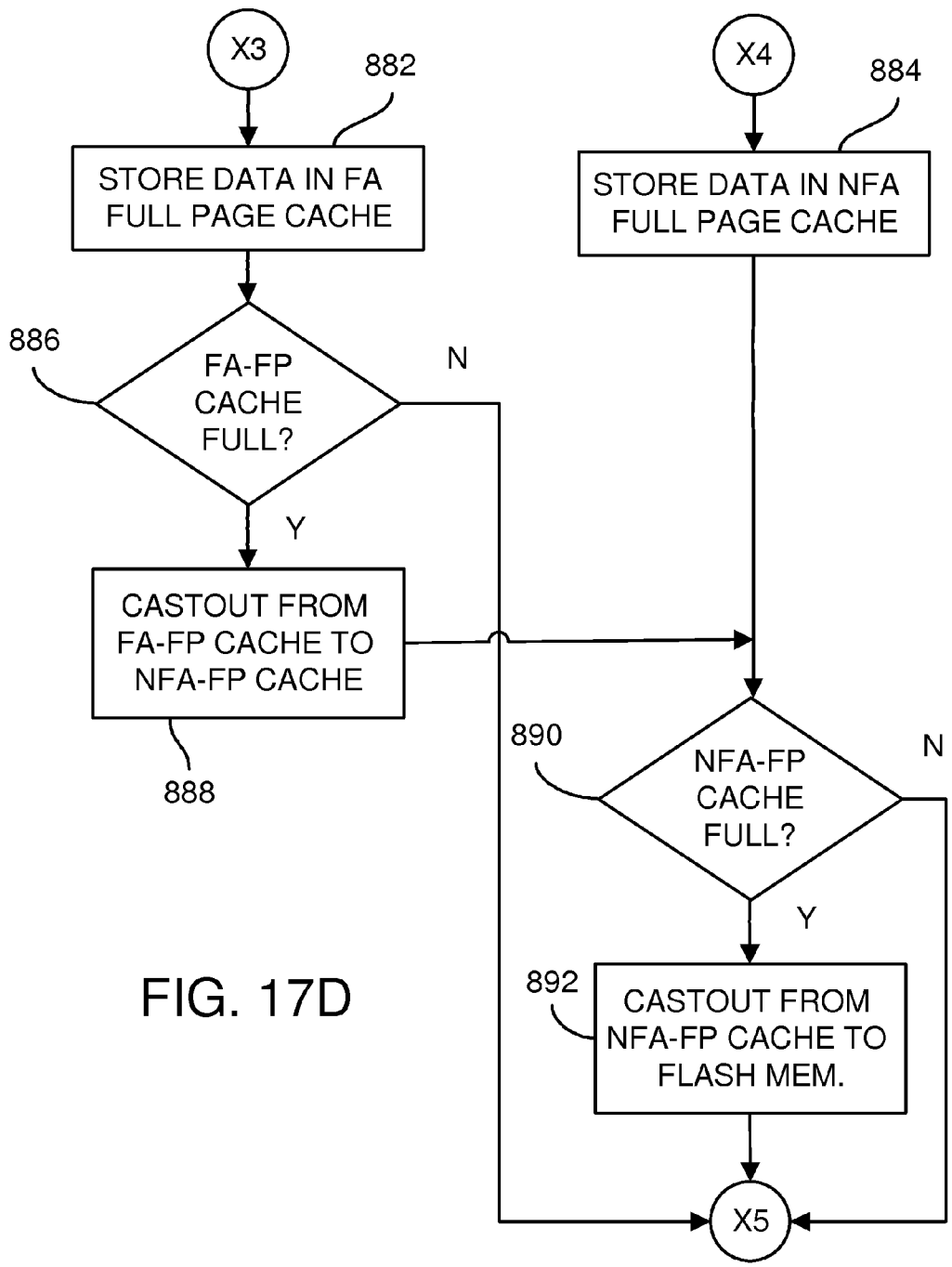

In FIG. 17D, full page FA user data is stored in the FA full page (FA-FP) cache in DRAM, step 882. When the FA-FP cache is full, step 886, then a LRU page in the FA-FP cache is castout to the NFA-FP cache, step 888. This may cause the NFA-FP cache to become full, so the NFA-FP cache is checked for full status, step 890.

Full page NFA use data is stored in the NFA full page (NFA-FP) cache in DRAM, step 884. When the NFA-FP cache is full, step 890, then a LRU page in the NFA-FP cache is castout to the flash memory, step 892.

In FIG. 17E, when the DIB is full, step 894, the process loops back to FIG. 17A, step 836, where new write data is read from the DIB and compressed and/or encrypted if enabled. When the DIB is not full, step 894, the host is allowed to send new write data, step 896. When new write data is received from the host and loaded into the DIB, step 898, the process loops back to FIG. 17A, step 836, where new write data is read from the DIB and compressed and/or encrypted if enabled.

When there is new data in the FA-PP cache, step 902, the process loops back to FIG. 17B, step 850, where new write data is grouped with other partial page FA data. When there is new data in the NFA-PP cache, step 904, the process loops back to FIG. 17C, step 870, where new write data is grouped with other partial page NFA data.

Figure 18A:
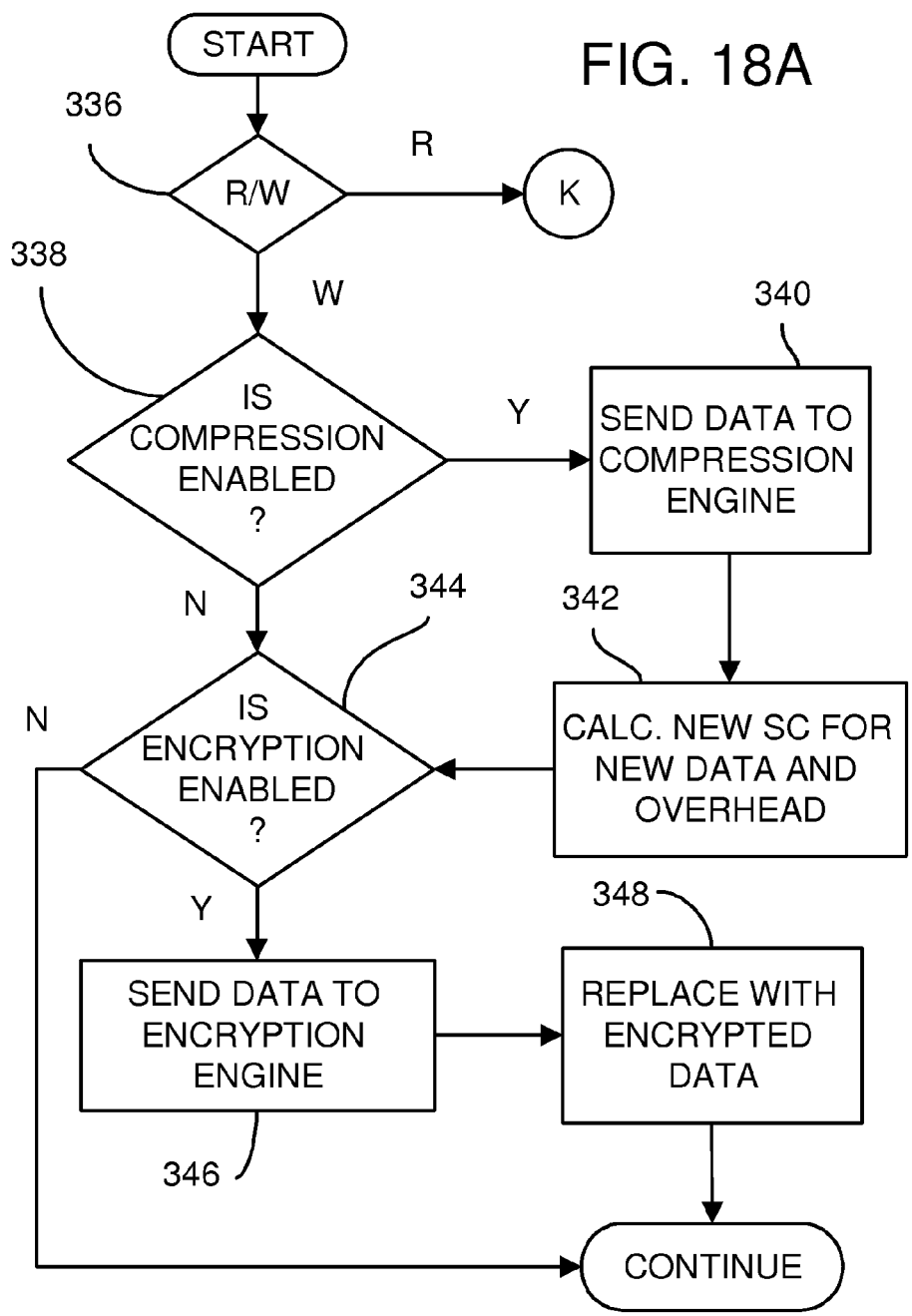

FIG. 18A-B shows processing encrypted and compressed pages. In FIG. 18A, when the host is writing to the flash drive, step 336, when compression is enabled, step 338, the host data is sent to the compression engine, step 340. The compressed data with a new header is usually smaller and this has a new, smaller sector count SC, which is calculated in step 342. The compression entries and mapping tables, such as LBA table 210 and compressed LBA table 212 in FIG. 9A, are populated with entries. The compressed data then replaces the original host data.

When encryption is enabled, step 344, the host data or compressed data is sent to the encryption engine, step 346. The encrypted data replaces the original data and has the same size, step 348. The higher-level process can then continue.

In FIG. 18B, a host read occurs. When encryption is enabled for this data location, step 360, the data read from flash memory 30 or from SSS DRAM buffer 20 is sent to the decryption engine, step 350. The decrypted data replaces the encrypted data, step 352. When compression is enabled for this data location, step 354, then read data or decrypted data is sent to the decompression engine, step 356. The compression entries and mapping tables, such as LBA table 210 and compressed LBA table 212 in FIG. 9A, are consulted to locate the start of the compressed data segment, and its total size. The actual sectors being requested by the host are extracted from the compressed data segment, step 358, and this data returned to the host.

Compression to reduce the data size may use many different techniques for different types of data such as video, audio, etc. Each different type of data needs a specific data compression algorithm to achieve the maximum size reduction. The adaptive compression algorithm will select an algorithm for best results. The header added to the compression data includes the algorithm used by the compression engine.

Another compression technique reduces the number of writes to flash. The flash controller looks for the contents of the data set. If there is a similar one then instead of writing the whole contents to flash, the controller only writes the pointer to the existing compressed data set plus a difference of the current data set and the existing data set if there is a delta between them. If the occurrence is repeated then the number of flash writes can be reduced more.

A process for tracking block read errors from flash memory may be included. Such a process may be useful for collecting statistics for S.M.A.R.T.—Self-Monitoring, Analysis and Reporting Technology. S.M.A.R.T. is a standard set, may be expanded by collecting other important data from the SSD and then using a Vendor command to analyze the data for debugging, statistics, etc.

The collectable data may include: power cycle count, abnormal power cycle count, bad block count at power up, accumulated bad block count, block with bad page count at power up, accumulated block with bad page count, bad page count at power up accumulated bad page count, extra ECC protection needed page count at power up, accumulated extra ECC protection page count, ECC read error count at power up, accumulated ECC read error count, extra ECC protection read error count, accumulated extra ECC protection read error count, fatal ECC read error count at power up, accumulated ECC fatal error count, host LBA read count at power up, accumulated Host LBA read count, host LBA write count at power up, accumulated host LBA write count, flash page read count at power up, accumulated page read count, flash page write count at power up, accumulated flash page write count, smallest block erase count at power up, largest block erase count at power up, total power on time at power up, accumulated power on time.

Useful SSD health information can be derived from the collectable data. For example, compare Host LBA write count and Flash page write count can give a write amplification indication. The Flash page write count, the total power on time, power cycle count, and abnormal power cycle count can give the life status of SSD 102. A vendor may have a practical warranty based on either how many years (such as 3 years) the customer purchased or as the total host write number of the flash drive. The extra provided information can be used for a better warranty policy other than only the years of use purchased. The warranty can be based on the total host write number of the flash drive. The nominal write/erase endurance number of a flash memory chip used to multiply the capacity of the flash device is defined as the total host write numbers of the flash drive. The remaining SSD life can be derived from the nominal write/erase endurance number of the flash memory chip used, and the calculation of an actual erase counter of each individual block.

SSD Life Used/Life Left can be determined by the following factors: 1. averaging a write/erase count over a nominal block write/erase count. 2. Total-Data-Write-Count from Host over total data write of a flash device. 3. Write Amplification (WA). 4. Spare blocks to capacity ratio. In order to derive all the necessary information, the flash device controller needs to manage some of the S.M.A.R.T. functions.

For factor 1, block erase count table 164 maintains a write/erase counter and a status for each block. The averaging counts can be derived by adding all the non-bad blocks then dividing by the number of non-bad blocks. A nominal write/erase number related to the flash type is also needed. For example, when the averaging write erase count is 1000 and the nominal write/erase count is 5000 for MLC, the SSD Life Used is 20% and SSD Life Left is 80%.

For factor 2, the flash device controller needs to manage the accumulated life time Total-Data-Write-Count from the host and the total data writes for the flash device (both in sector units). For example, when the accumulated Total-Data-Write-Count is 100,000 and the total data write for the device is 500,000, then the SSD Life Used is 20% and SSD Life Left is 80%.

For factor 3, Write Amplification (WA) can be derived from accumulated life time Total-Data-Write from Host (data in sector unit), a number of sectors per page related to the flash type, and the accumulated flash page write count (data in page unit). Together with factor 2, it can provide more accurate life status of the flash device. For example, when the accumulated Total-Data-Write-Count is 100,000 (sector), 16 sectors/page, and the accumulated flash page write count is 3,000 (page), then the WA can be calculated as 3000*16/100,000=0.48. Write Amplification smaller than 1 means the overall flash device algorithm improves the write efficiency and the Life of SSD flash device. It can be expressed as either the accumulated Total-Data-Write-Count affected by multiply with WA or the total data write for the flash device affected by divide with WA. WA together with the example in factor 2, the SSD Life Used is 9.6% and SSD Life Left is 90.4%.

For factor 4, the flash device needs to track the ever growing bad block number. A flash device at manufacturing production will have a capacity such as 90% of flash implemented. The flash device system will use a fixed portion for its running codes. Some fixed portion is for its meta tables/S.M.A.R.T. function data collection. Some fixed portion is for the already existed manufacturing bad blocks. The rest of the blocks will serve as spare blocks. Spare/swap areas to merge valid data in flash memory and new data are then written back to flash memory to use fewer spare blocks. Over provisioning size increased. When time passes, the bad blocks increase. The number of useful spare blocks decreases. When the number of spare blocks approaches 0, it will impact the performance due to not enough empty blocks to write new data and more frequent garbage collection activity. If the number of spare blocks is down to zero, theoretically, the available space is smaller than the capacity it claimed, and the flash device can be claimed dead. Instead of claiming the flash device is dead, in the case of when the flash device's capacity is not all used, the flash device controller can decrease the capacity by decreasing the total number of sectors in a partition of a 16-byte partition record of the Master Boot Record (MBR). If LBA addresses above the new shrinking capacity exist, the flash device controller will check the FAT and FDB, then modify all related FAT, FDB, and LBA data for the new LBA address within the new capacity limit.

A more complicated SSD Life Used/Life Left can be combined with all four factors listed above.

The total data write for a flash device is dependent on the capacity (P, such as 90% of total memory implemented) of the device and flash type. The total memory implemented is based on the number of chips (N) used and the size of chip (the number of blocks in the flash (J), and the size of Mega bytes in a block (K)). The flash type determines how many program/erase cycles (H, 5000 for MLC) each flash block can sustain. The total data write for a flash device can be represented as N*J*K*H*P. For example, a device has 4 MLC chips, 8,192 blocks per chip, 2 Mbytes per block and 90% used as capacity. The total data write for the flash device is 4*8,192*2 M*5,000*90%=294,912,000 Mbytes (or 576,000 sectors write).

The total writes expected from a flash device is dependent on the size of the device (how many flash chips used (N), how many Blocks in the flash (J), and how many Mega bytes in a block (K)), and what kind of flash used (such as MLC for 5000 program/erase cycle (H)). The total life in hours the flash device is expected to sustain is based on the user usage such as how many Mega bytes are written to flash per day (G, the write amplification included in the formula). So the expected working hours will be N*J*K*H*24/G. As an example, a 64 GB flash device (N=4, J=8,192, K=2) with MLC (H=5,000) in a working environment with 8000 Mega bytes write per day (G=8,000) will result in 1,069,400 hours (44,558 days or 122 years) of expected life. In reality the percentage of life of the SSD used can be calculated by bad blocks number versus total block numbers, averaging block write/erase count versus flash's write/erase count specifications, etc. This kind of information can give user a head up status to do the necessary steps to avoid down time.

The implemented data collection features can help the user and firmware engineer to evaluate how well the firmware is doing for the super-endurance SSD. By comparing with the number of writes to the device and the number of writes to flash, realistic write amplification can be realized. By calculating each block's write/erase count, the minimum/maximum/average count can show how well the wear-leveling algorithm is (both dynamic and static wear leveling).

Mean Time Before Failure (MTBF) value prediction is an important element in the development of products. It is defined by the sum of the operational periods divided by the number of observed failures. Each operational period is defined by down time (unplanned) minus the up time (after repair). All the efforts described in this application such as Compression, Data Write Cache, ECC, Bad Page Management, Endurance Spare/Swap, various tables, etc. that can prolong the operational period may result in increasing of MTBF value.

Some blocks may have already had some read errors when the first level of ECC was used. A more robust ECC using more ECC bits may be used for these blocks.

When a read error occurs that is not correctable using the more robust second level of ECC, then a fatal read error counter is incremented. These ECC error counters may be used by block management routines to decide when to increase the number of ECC bits used for each page in a block to the second level of ECC, or when to mark the block as a bad block and remove the physical block from further use.

S.M.A.R.T. data collector 170 may need one or two pages of memory space. The controller maps the page usage by using an LBA page address that is beyond the LBA range of the host.

Figure 19A:
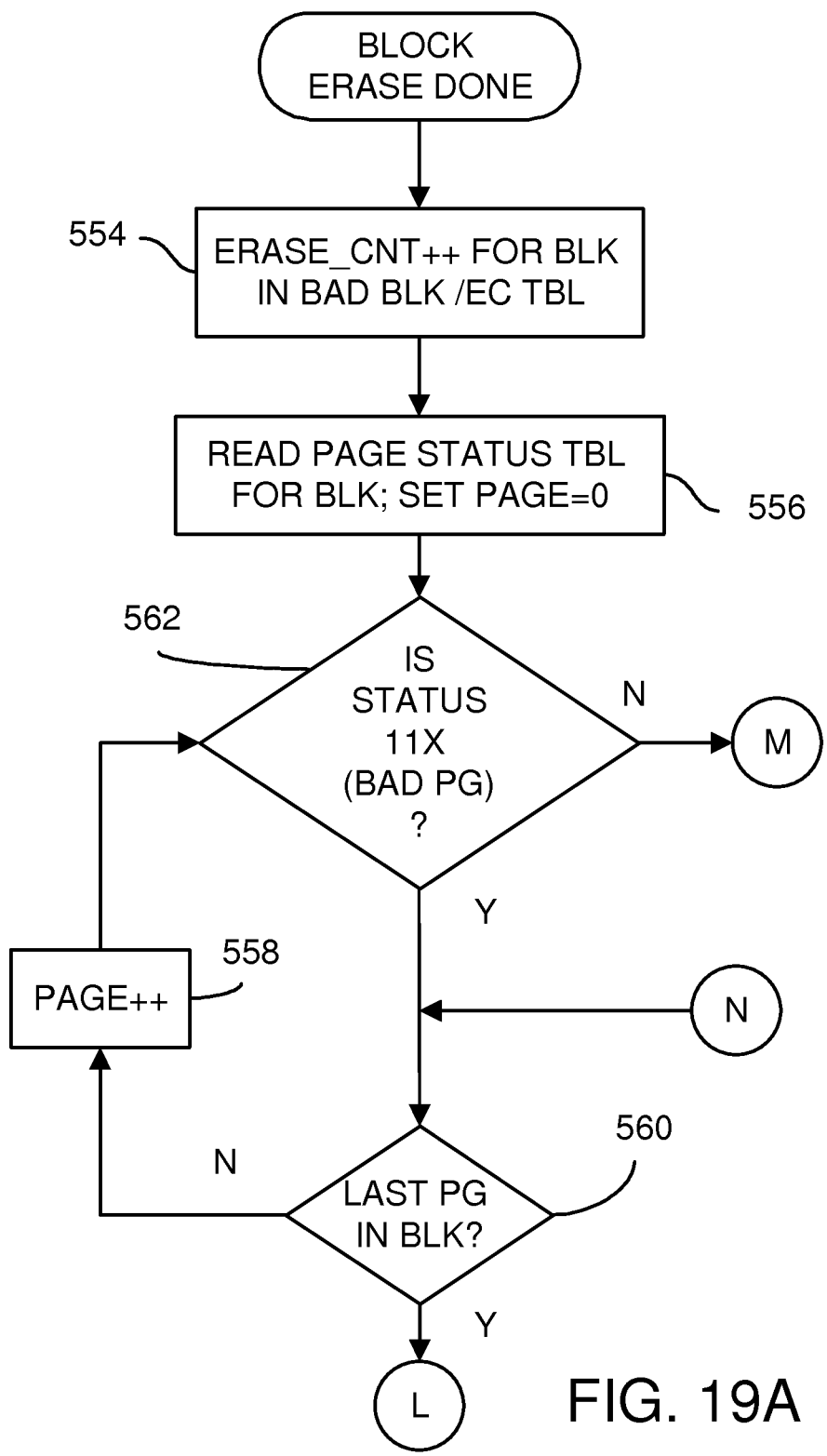

FIG. 19A-D show a process for detection and handling of bad pages and bad blocks. In FIG. 19A, once a block in flash memory 30 has been erased, the erase counter for that physical block is incremented and the block status is changed to either empty block (000) or empty block with bad pages (100), depending on the previous block status and current page status, step 554. Block erase count table 164 (FIG. 3) is stored in SSS DRAM buffer 20 and backed up to flash memory 30 is there is not sufficient space in DRAM. Block erase count table 164 includes an erase counter for each physical block, and a status for that block. The block status can be a three-bit value, with 000 indicating an empty good block, 011 and 111 indicating a bad block, and 100 indicating a partially-bad block that has some bad pages and some good pages.

Block erase count table 164 may also include page status tables that track bad pages within a block. A value of 000 for the page status indicates a good page, 001 indicates a protected page that uses a 100-bit second-level ECC rather than a 25-bit first level ECC, 010 indicates the page was used, 110 indicates the page has garbage/trimmed data, and 11X indicates a bad page.

After the block is erased, the status of each page in that block is checked. The page status table for the physical block is read, step 556, and the current page is initialized to page 0. When the status for the current page is 11X, step 562, the current page has already been marked as a bad page. No further processing for this page is needed. When the current page is not beyond the last page in the block, step 560, the current page is incremented to the next page in the block, step 558, and the process repeats for the next current page at step 562.

Figure 19B:
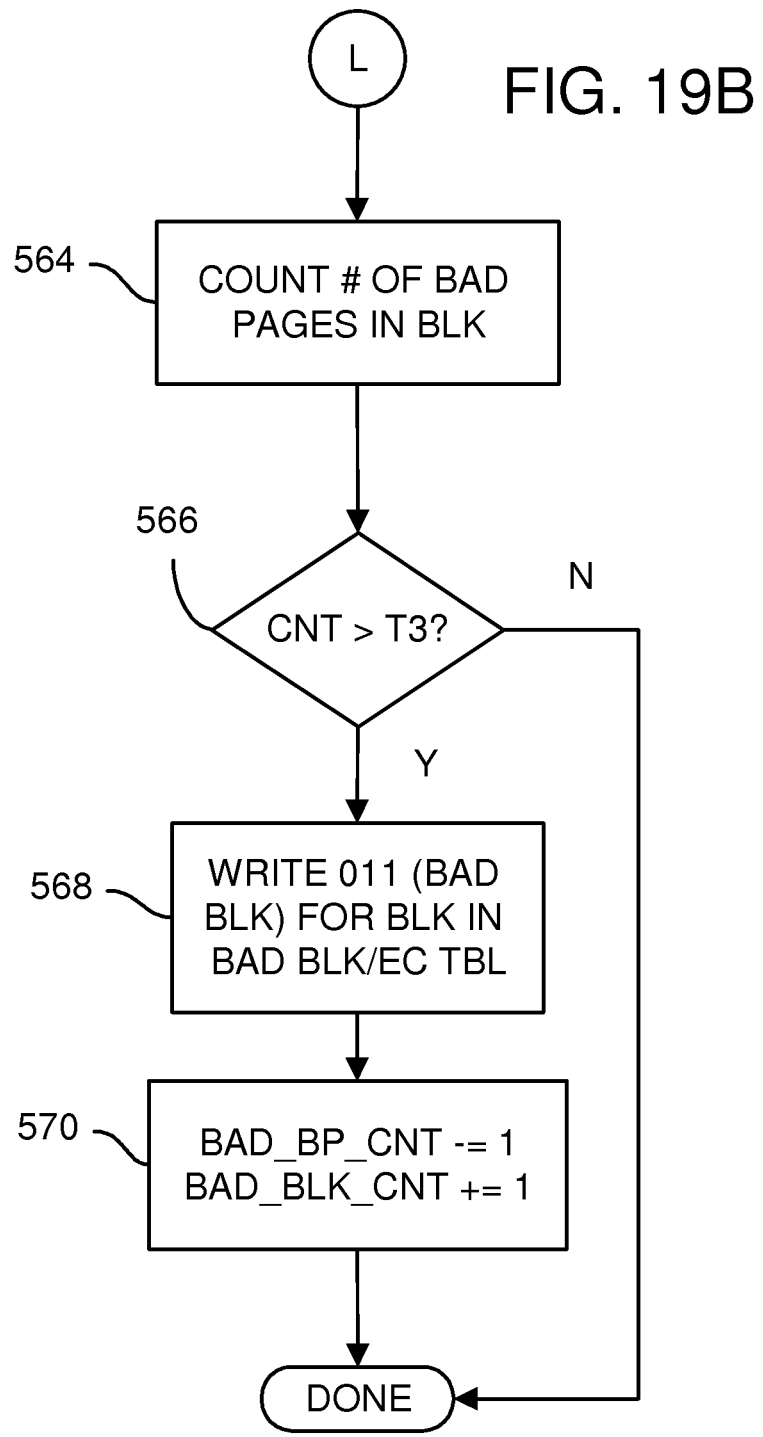

In FIG. 19B, all pages in the physical block have been processed. The number of bad pages in the block is determined, step 564. When the count of bad pages in the block exceeds threshold T3, step 566, the block is declared a bad block. The block status for this physical block is changed to 011 in block erase count table 164, step 568. The physical block is no longer used. The partially-bad block counter (BAD_BP_CNT) is decremented and the bad block counter is incremented, step 570.

In FIG. 19C, the current page had not previously been marked as a bad page, step 562 (FIG. 19A). The erase operation erases all bits in the page to an erased value, such as 1. The bits in the current page are read to see if all the bits are erased. A count is obtained, step 574, of the number of bits in the page that are in the un-erased state, such as 0 bits. These are faulty bits. However, ECC may be able to correct these errors, so the page may still be usable if the number of bit error is small.

When the un-erased bit count is less than a first threshold T1 (indicating too many error bits, increasing the risk to use this page even with the extra software ECC protection), step 572, and the current page status is page need protection (XX1), step 576, then the page is already marked as needing protection by second-level ECC. The page status is changed to empty page needing protection (001), step 582. The next current page is processed by returning to FIG. 19A.

When the un-erased bit count is less than the first threshold T1, step 572, and the current page status is not a page needing protection (XX1), step 576, then the page is not yet protected by second-level ECC. When the un-erased bit count is greater than a second threshold T2 (indicating a level of error bits that may result in future fatal errors and needing extra software ECC help to correct the errors), step 578, The second-level ECC page counter is incremented, step 584 and the page status is changed to 001, step 582, and the second-level ECC will be used in the future when host data is stored in this physical page. The next current page is processed by returning to FIG. 19A.

When the page is not yet protected by second-level ECC, step 576, and the un-erased bit count is not greater than the second threshold T2, step 578, the page status is good. The first-level ECC is sufficient to correct the expected errors in this current page. The page's status is changed to 000, step 580, if it is not already marked as a good page. The next current page is processed by returning to FIG. 19A.

Figure 19D:
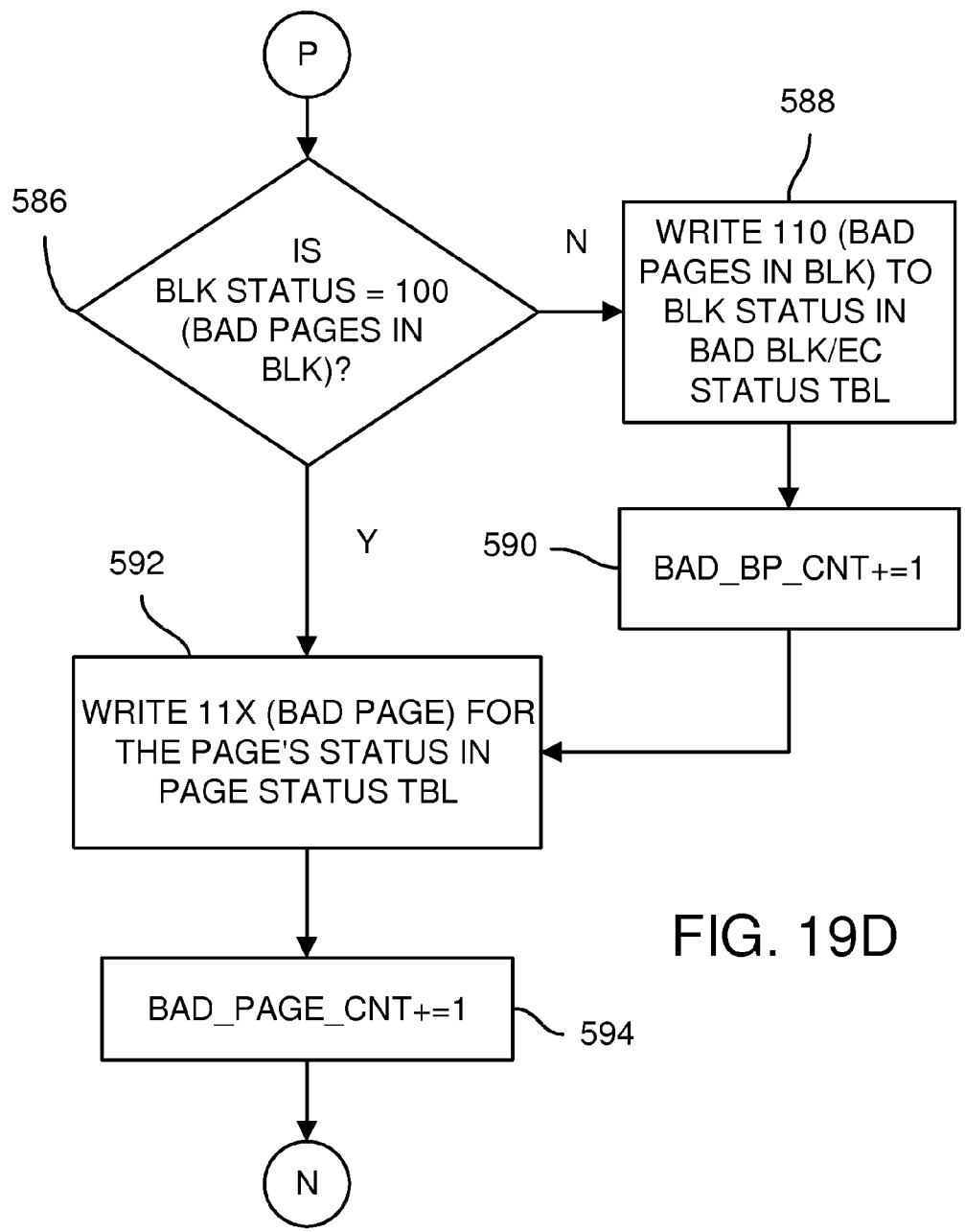

In FIG. 19D, the current page has more than the first threshold T1 of un-erased bits, step 572 (FIG. 19C). Exceeding the T1 threshold indicates that the page has more un-erased bits than can be corrected by the second-level of ECC. The page is bad and cannot be safely used.

When the status for the physical block is bad pages in block (1xx), step 586, the block has already been marked as a bad-page block in block erase count table 164. There were other bad pages in this block, no block status change is needed. However, the current page is marked as a bad page by changing the page status to 110 in the page status table, step 592. The bad page counter is incremented, step 594, before the next current page is processed by returning to FIG. 19A.

When the status for the physical block is not 1xx, step 586, the block has not yet been marked as a partially-bad block in block erase count table 164. There have been no other bad pages in this block. The block's status is changed to empty block with bad pages (100) in block erase count table 164, step 588. The partially-bad block counter (BAD_BP_CNT) is incremented, step 590. Also, the current page is marked as a bad page by changing the page status to 110 in the page status table, step 592. The bad page counter is incremented, step 594, before the next current page is processed by returning to FIG. 19A.

The SSD may contain many flash memory chips (such as 16 flash memory chips). Some special situations may be encountered, such as when one plane of the flash chip is bad or the whole chip is bad. If over provisioned, the flash capacity of the SSD can absorb the loss of capacity of one full plane or the whole flash memory chip. Special algorithms of the device controller can be used to bypass the losses, such as to recover the data and then adjust the stripe-ready unit size of the flash devices to avoid the faulty plane or chip. Over-provisioning also can be done by using idle chips for the replacement of the failed chip.

Figure 20A:
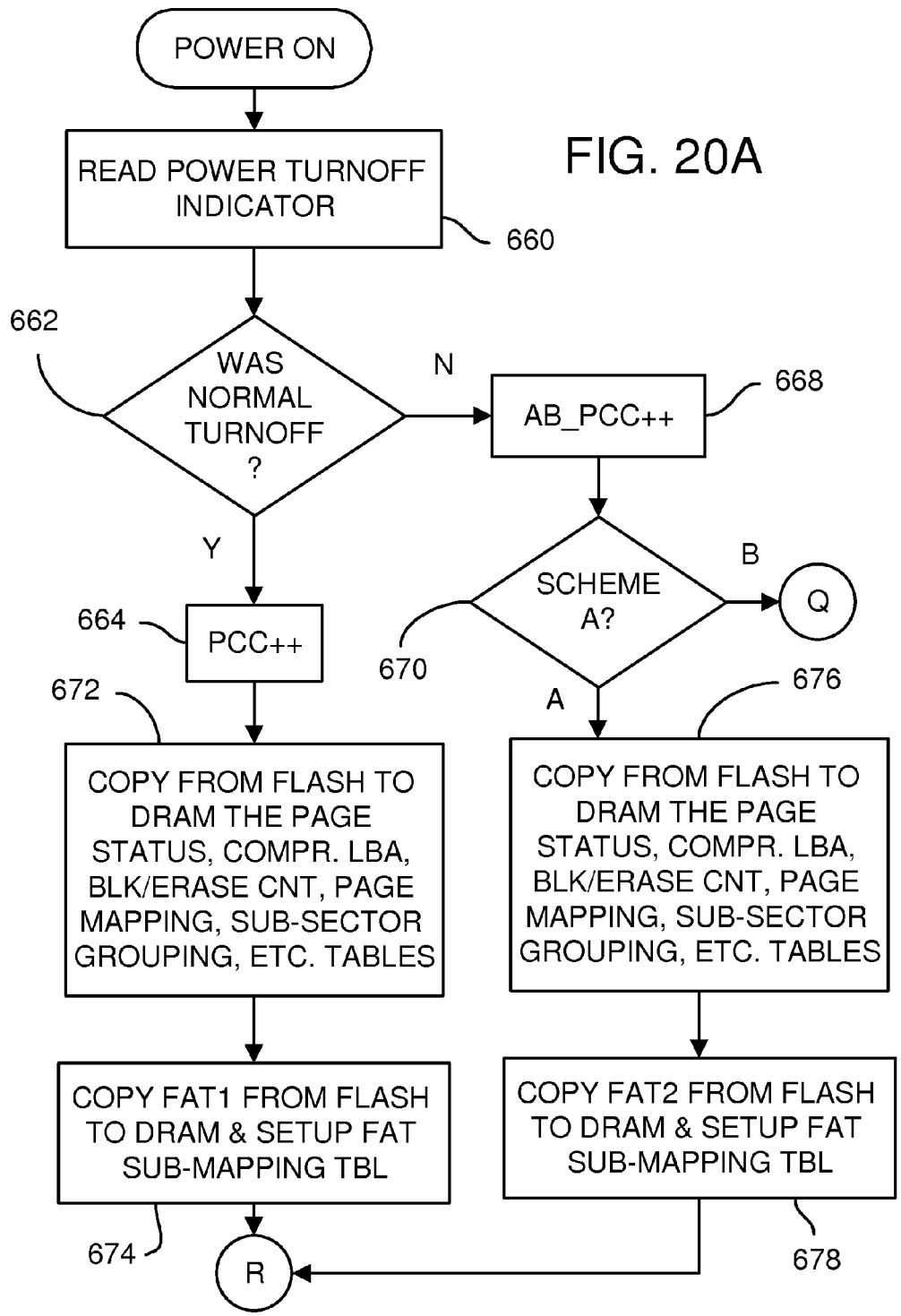
FIG. 20A-C show a power-on process for initializing the mapping tables and other areas of DRAM.
Figure 20B:
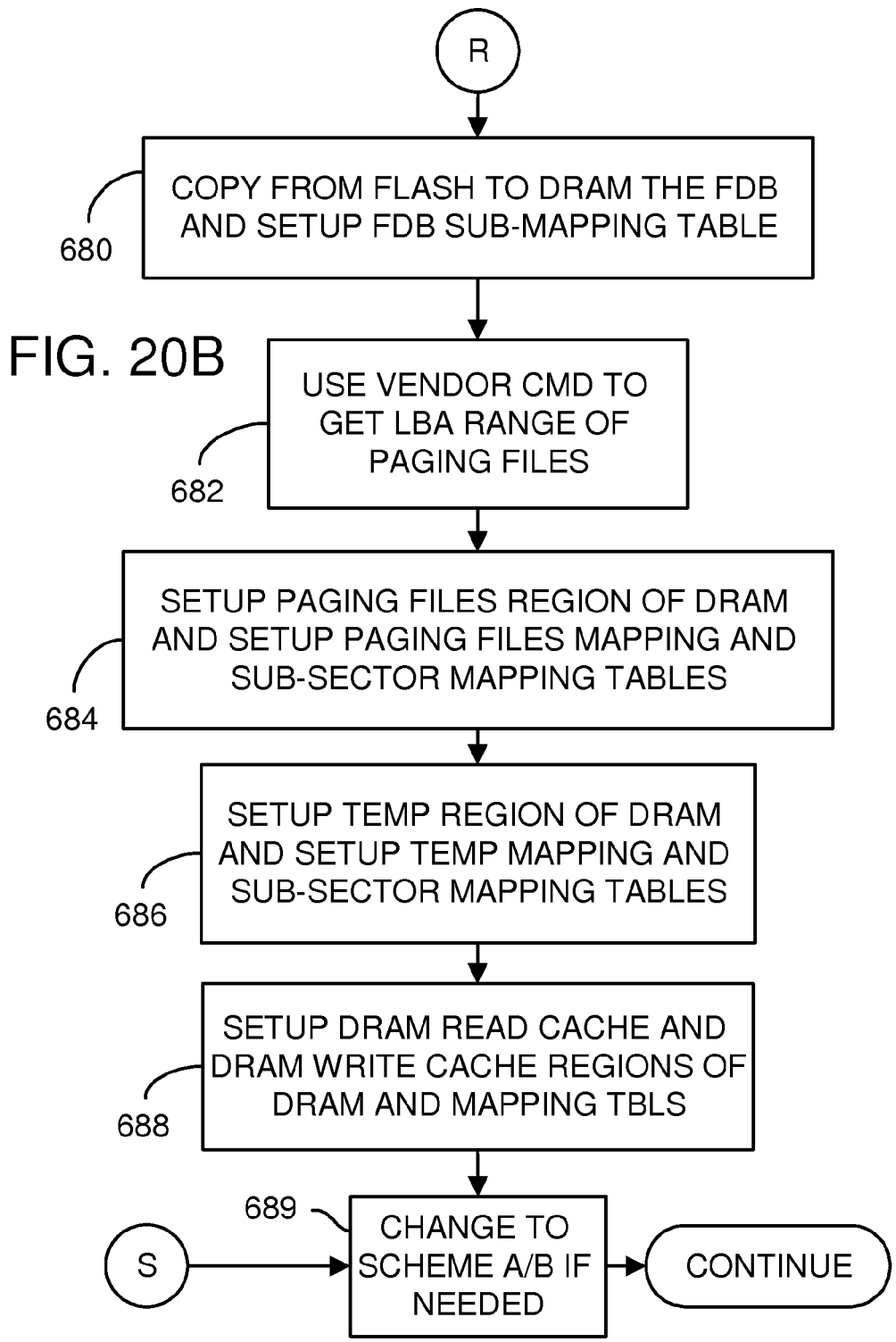
Figure 20C:
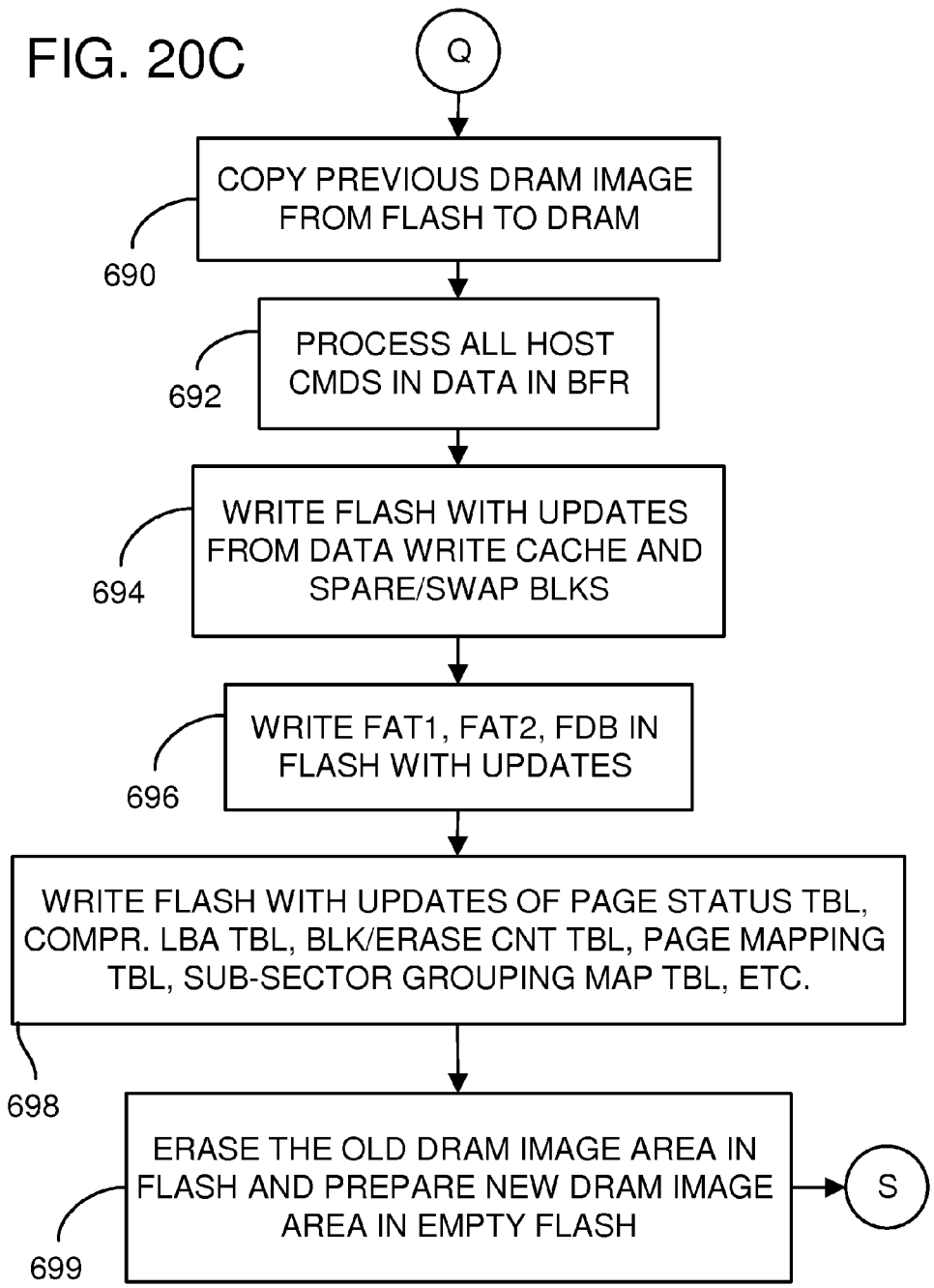

FIG. 20A-C show a power-on process for initializing the mapping tables and other areas of DRAM. In FIG. 20A, when power is applied to the SSD, a power-turnoff indicator is read from flash, step 660. This power-turnoff indicator was set during the last power disconnect. When the power-turnoff indicator was normal, step 662, then the power cycle count PCC is incremented, step 664. Otherwise, the abnormal power cycle count AB_PCC is incremented, step 668.

There are two possible schemes in this embodiment. Scheme A updates the flash during power off while Scheme B copies an image of the DRAM to flash on power off. When scheme A is indicated, step 670, and the abnormal power off detected, various tables are copied from DRAM buffer 20 to flash memory 30, such as the page status table, the compressed LBA table, the block/erase count table, page mapping and sub-sector mapping tables and grouping tables, step 676. The stored FAT2 table is copied from flash memory to the FAT area of DRAM buffer 20, step 678, and the FAT sub-mapping tables are set up in DRAM.

When a normal power off is detected, step 662, the various tables are copied from DRAM buffer 20 to flash memory 30, such as the page status table, the compressed LBA table, the block/erase count table, page mapping and sub-sector mapping tables and grouping tables, step 672. However, the stored FAT1 table is copied from flash memory to the FAT area of DRAM buffer 20, step 674, and the FAT sub-mapping tables are set up in DRAM. Thus FAT2 is selected for abnormal turn off while FAT1 is selected for normal turn off, since the host writes FAT1 before FAT2, and the host may not have had time to write FAT2 during an abnormal power failure.

Continuing in FIG. 20B, the FDB entries are copied from flash to DRAM and the FDB sub-mapping tables are set up in DRAM, step 680. A vendor command is used to get the LBA range for the paging files from the host, step 682. The paging files region of DRAM buffer 20 is setup, step 684, as are the mapping and sub-mapping tables for paging files.

The temp file region in the DRAM buffer is set up, step 686, and the mapping and sub-mapping tables for temp files are setup. Temp files are not copied from flash to DRAM on power on, since the temp files are deleted at power off and not copied to flash.

The DRAM read cache and DRAM write cache are setup in DRAM buffer 20, step 688, and any associated mapping tables. When the user or firmware changes the scheme to A or B, the scheme indicator bit is changed, step 689.

The read cache and write cache in the DRAM buffer is small compared to the flash memory. There are many ways to manage the usage of the read cache. One usage depends on the phase of operation such as power up initialization to preload (defined by the user) some portion of codes from flash to speed up the initialization and removed after the initialization. Another usage is dependent on the user application and forces allocation of a portion of the read cache to be used by the application and removed after the application exited. The application may be time related such as back up at midnight and in the morning log in events. An algorithm can be used to perform the inspection of the read cache traffic of a particular application; this can eliminate the problem of a large application or files being unnecessarily occupying a large area of read cache; only a fraction of them can be left on the read cache area. This can leads a more efficient use of the read cache. Yet another usage is using algorithms to monitor and analyze the read data to stay in read cache which is most recently or more frequently used. In case of not enough space for read cache, those not most recently and less frequently used will be overwritten.

In a multi-channel controller structure, if the current access is not a cache-hit, the device controller reads data from flash memory 30 and goes through the multi-channel structure to read cache and mapping table 151. The data can be original, compressed, encrypted, grouped, or a combination of the above. The controller retrieves the original data from the read cache based on the recorded indications in the various mapping tables and then sends the data back to host 100.

In FIG. 20C, for an abnormal power off using scheme B, the previous DRAM image that was saved prior to power off is copied from flash to DRAM buffer 20, step 690. The DRAM image includes many of the tables and buffers in DRAM buffer 20. Any host commands that were still pending in the Data In buffer are processed, step 692. The flash memory is written with any updates for dirty lines in the data write cache or in the endurance spare/swap block areas of DRAM, step 694. Any updated FAT or FDB entries from the DRAM image are copied to the FAT1, FAT2, or FDB areas of flash memory, step 696. The flash memory is also written with any updates from the page status table, the compressed LBA table, the block/erase count tables, the page mapping tables, or any sub-sector or grouping tables, step 698. The old DRAM image in flash memory is erased and a new area in flash memory is set aside for the next DRAM image in case of an abnormal power off, step 699.

Figure 21:
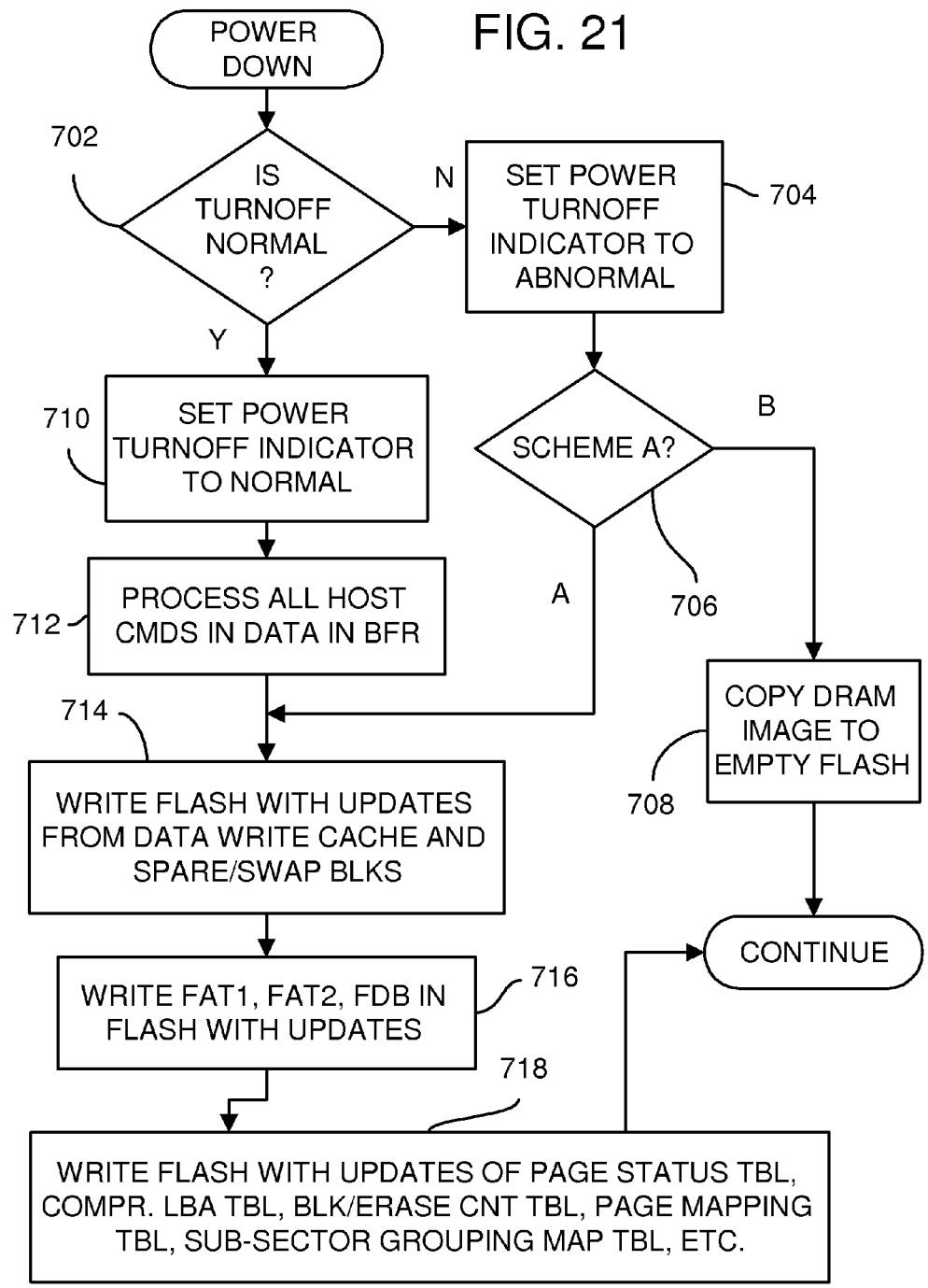
FIG. 21 is a flowchart of a power down process.

FIG. 21 is a flowchart of a power down process. When the power turnoff was normal, step 702, then the power turnoff indicator is set to normal, step 702. All host commands pending in the Data In buffer are processed, step 712, using power from the battery or other backup.

A normal power turnoff is a command received from host. A voltage monitor or comparator may detect the power voltage dropping suddenly and trigger an interrupt to the SSD controller. The interrupt routine may then set up a power down flow procedure. When power turnoff is not normal, step 702 the power turnoff indicator is set to abnormal, step 704. When scheme B is indicated, step 706, then the contents of DRAM buffer 20 is copied to an empty area of flash memory, step 708. All of DRAM buffer 20 could be copied, or only selected regions. DRAM regions could be copied in a prioritized order or sequentially.

Scheme A is different from normal turnoff in that scheme A will give up the data in data in buffer 152. When scheme A is used, or a normal turnoff has finished processing host commands, the flash memory is written with any updates for dirty lines in the data write cache or in the endurance spare/swap block areas of DRAM, step 714. Any updated FAT or FDB entries from the DRAM image are copied to the FAT1, FAT2, or FDB areas of flash memory, step 716. The flash memory is also written with any updates from the page status table, the compressed LBA table, the block/erase count tables, the page mapping tables, or any sub-sector or grouping tables, step 718.

A multi-level power outage protection scheme can ensure that the data is protected. Backup power 41 of the host provides power to the whole system when the main power source fails. It gives SSD device 102 plenty of time to backup the data from DRAM Buffer 20 to flash memory 30. In the case of SSD 102 losing power from the host, power backup 42 has an extra capacity of capacitors or supercapacitors to ensure that even if some of them failed, they still have enough power to backup the data from DRAM Buffer 20 to flash memory 30.

In case the system is rebooted, the device will go through the same sequence as of power off then power on. For a logout from the computer, the user account is closed but the computer remains on for easy access the next time a user logs on. In case of logout, the dirty data and meta table will be updated to flash memory 30 the same as for power off.

For a portable device with a battery such as a smart phone, tablet, notebook etc., the device will detect the low level of battery power and turn the device off. Before the power off, the device controller will turn off its peripheral devices such as SSD device 102. At that situation, the power comes from the battery of portable device.

Another way to insure the data of interest in ETL of the DRAM is by copying to the MLC. In case of power off, a valid copy of data in ETL can be kept in MLC. At power up, the data in ETL can be loaded back to DRAM from MLC. The copying method can be modified by recording minor differences, which will reduce the amount of copying data and therefore reduce the writes to MLC.

For the advanced ECC protection System, the following algorithm is discussed. The first level protection is the built-in ECC protection circuit (such as a 24-bit ECC) which uses the spare bytes in each page to store the generated protection data. If the first protection failure bits reach the predefined level (such as 12-bit), an optional second level software ECC generator will be used to generate Software ECC (such as 50-bit) for further protection. In case the first level ECC fails to correct the data, then the second level software ECC will be used to restore the correct data. The second level software ECC generated protection data and tracking table will be stored in DRAM buffer 20, and copied to flash memory 30 according to a policy (such as based on time elapsed, capacity allocated, etc.) or upon power off or power failure.

Another way is using Low Density Parity Check code (LDPC) which is a linear error correcting code. This can add extra error correction capability other than the first level ECC protection.

A third level ECC can be implemented by either RAIDS-like parity for all stripping data or by generating parity data for a stripe of block that needs extra protection. The third level stripping parity ECC generated protection data and tracking table will be stored in DRAM buffer 20, and copied to the flash memory 30 according to a policy (such as based on time elapsed, capacity allocated, etc.) or upon power off or power failure.

If the second level Software ECC fails to protect the data, the third level stripping parity ECC will be used in case only one unit of the stripping data fails at the second level software ECC.

If second and third level ECC cannot restore the bad data, a fourth level of reference voltage adjustments can be used in case the flash memories can accept a special command to shift the reference voltage higher or lower. After a flash memory cell is written, any write or read to the adjacent cells will cause interference to the written cell. The interference will either add or remove electrons from the floating gate of the cell. Once the number of electron causes the output voltage to shift across the boundary of the reference voltage, the read will be wrong. Depending on the flash memory design, the reference voltage adjustment may have certain number of adjustments (such as 3 for higher levels and 3 for lower levels). The tryout of each process starts by one particular level determined by the flash chips used and the accumulated knowledge of read errors. If the data cannot be restored, then the next reference voltage level is tried until all possible levels are tested. If the data restores successfully, the reference voltage level can be used to start the next reference voltage adjustment test. If all reference voltage levels cannot restore the data, the fifth level will be used.

There may be counters for every reference voltage level. When restore data is successful, a corresponding counter will be incremented. These counters can help find out that which level is best to solve the problem.

A fifth level of ECC protection is provided by collecting all the read results of the various reference voltages. An algorithm such as Partial Response Most Likelihood (PRML) may be used to analyze the data and restore the original data.

Alternatively, higher ECC protection can be provided by host 100. The host generates higher ECC protection data and link information. Then using vendor commands to store the ECC data and its links to the DRAM buffer 20, eventually it will move to the spare block area of flash memory 30.

Figure 22A:
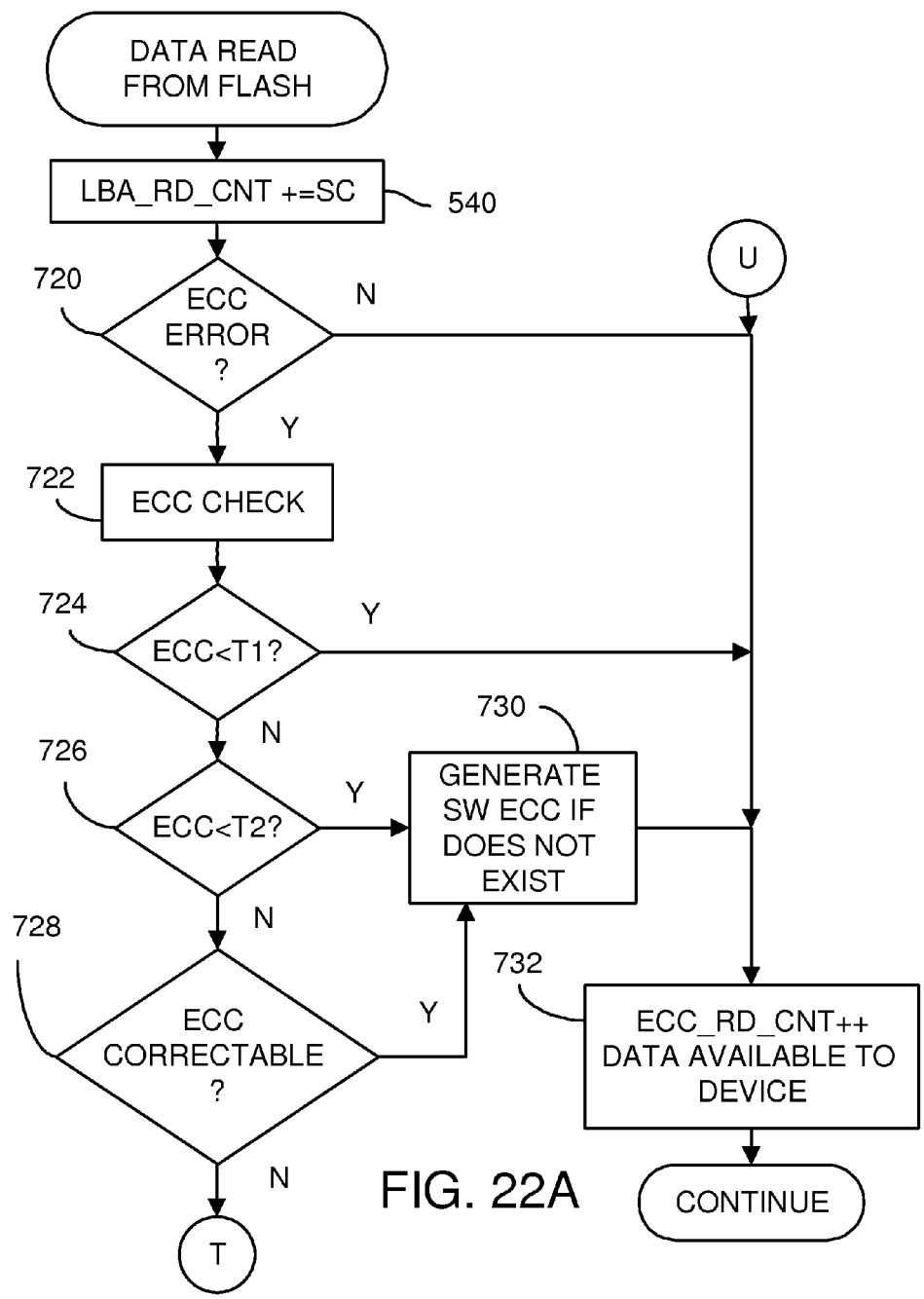
FIGS. 22A-B show a multi-level ECC read routine.
Figure 22B:
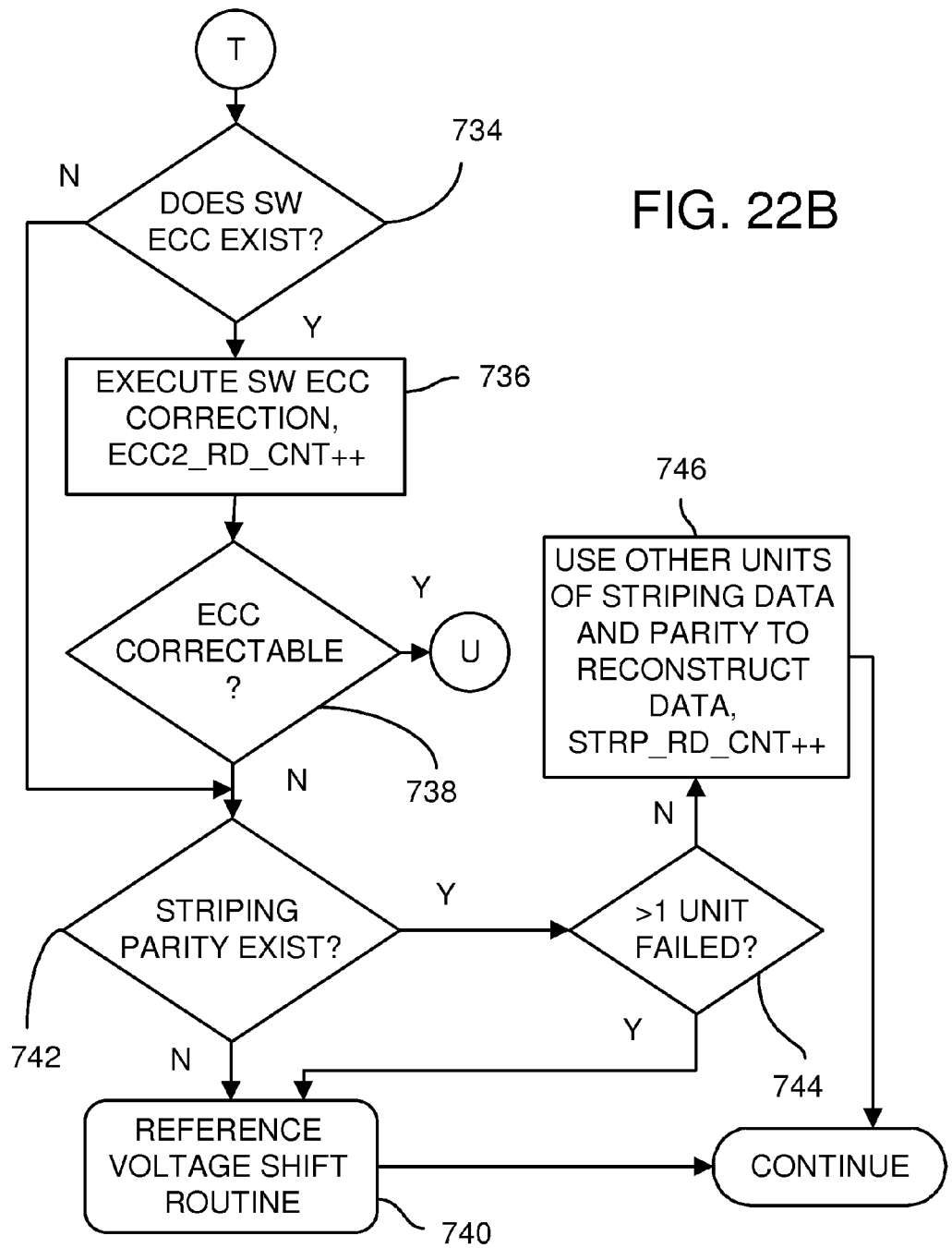

FIGS. 22A-B show a multi-level ECC read routine. In FIG. 22A, each time that a physical block in flash memory 30 is read, a read counter LBA_RD_CNT for that block is incremented by the sector count SC, step 540. When an ECC error occurs during a read, step 720, then ECC check 722 is performed. When the ECC errors are above a first threshold T1, step 724, and above a second threshold T2, step 726, but still correctable, step 728, then the data is corrected and made available, step 732, and ECC read counter ECC_RD_CNT is incremented. When errors are above T1 but below T2, then a third-level of ECC, or software ECC, is generated if it does not yet exist, step 730. The generated software ECC is stored in DRAM buffer 20 and managed by SSS 40. Depending on the policy, that information will be stored into the flash memory 30.

In FIG. 22B, for uncorrectable errors, when software ECC already exists, step 734, then the software ECC is used to correct the errors, step 736. An ECC2 read counter ECC2_RD_CNT is incremented. When the errors are corrected, step 738, then the data is made available, step 732.

When the software ECC has failed, but striping parity exists, step 742, and no more than 1 unit stripping data has failed, step 744, then the data can be reconstructed using other units of striping and the parity, step 746. A striping read counter STRP_RD_CNT is incremented. Otherwise reference voltage shift routine 740 is called.

Figure 23A:
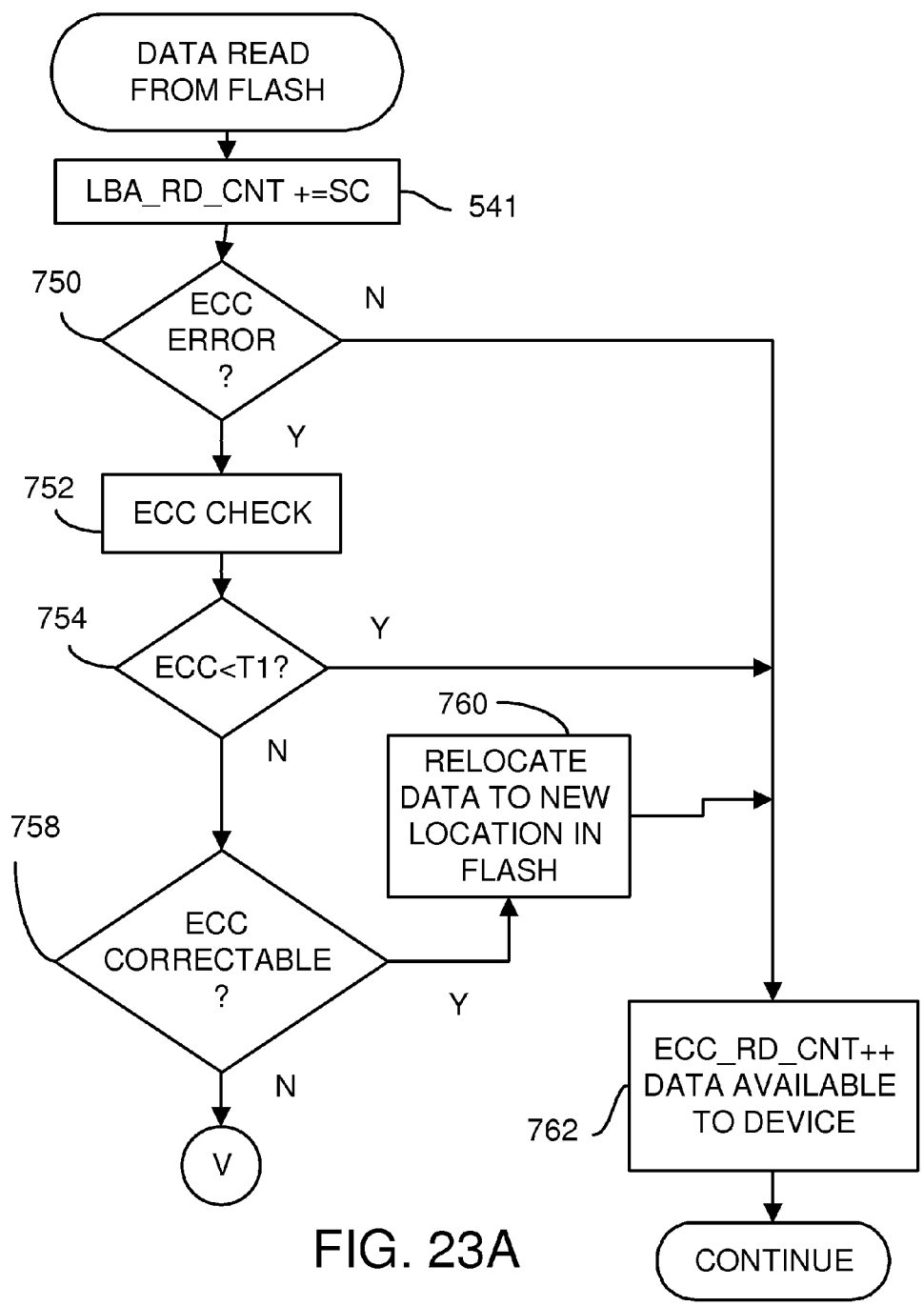
FIGS. 23A-B show a simplified multi-level ECC read routine.
Figure 23B:
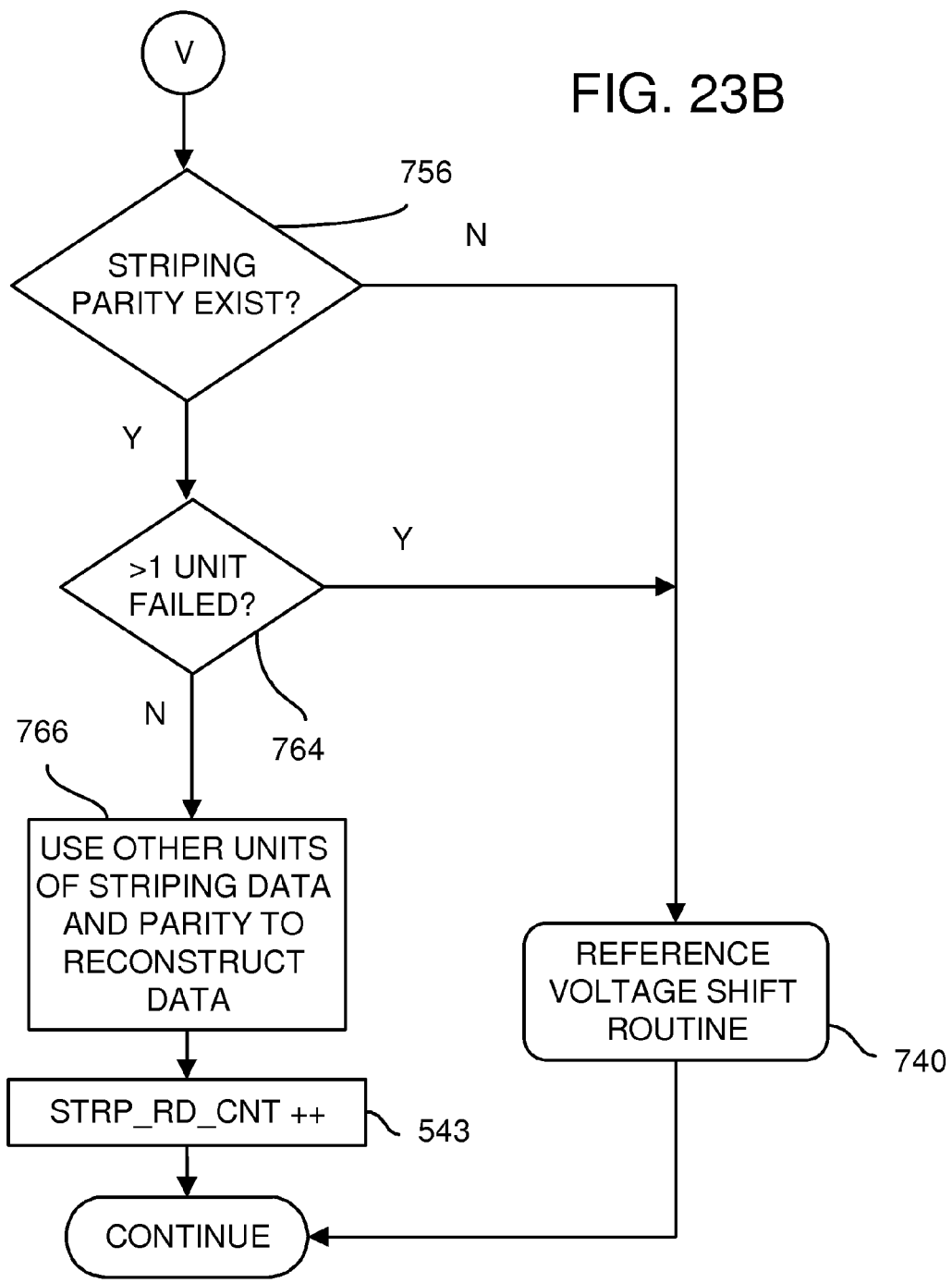

FIGS. 23A-B show a simplified multi-level ECC read routine. In FIG. 23A, each time that a physical block in flash memory 30 is read, a read counter LBA_RD_CNT for that block is incremented by the sector count SC, step 541. When an ECC error occurs during a read, step 750, then ECC check 752 is performed. When the ECC errors are above a first threshold T1, step 754, but still correctable, step 758, then the data is relocated to a different location in flash, step 760, and the data is made available, step 762, and an ECC read counter ECC_RD_CNT is incremented.

In FIG. 23B, when striping parity exists, step 756, and no more than 1 unit has failed, step 764, then the data can be reconstructed using other units of striping and the parity, step 766. A striping read counter STRP_RD_CNT is incremented. Otherwise multi-level reference voltage shift routine 740 is called.

Figure 24A:
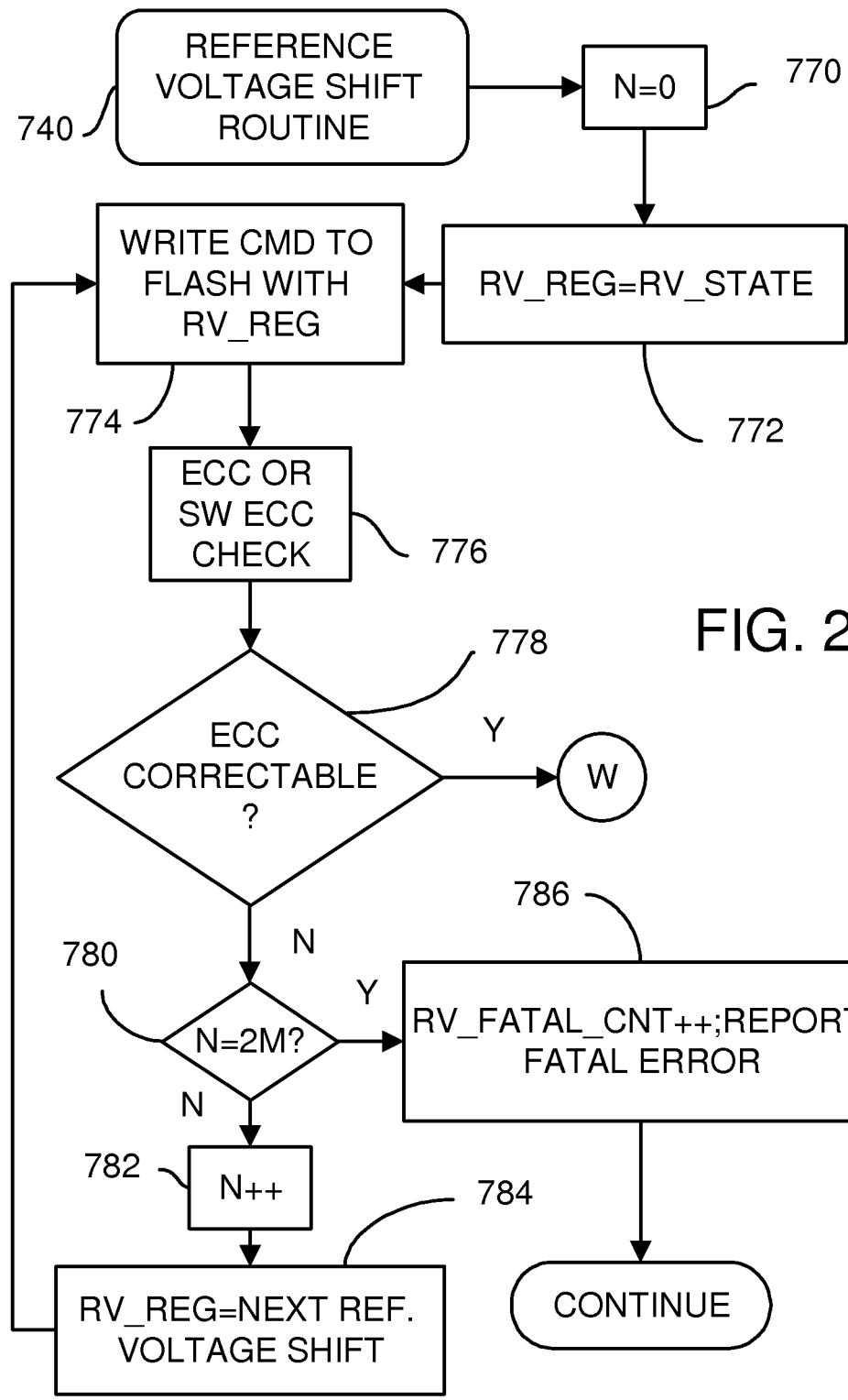
FIGS. 24A-B show a reference voltage shift routine.
Figure 24B:
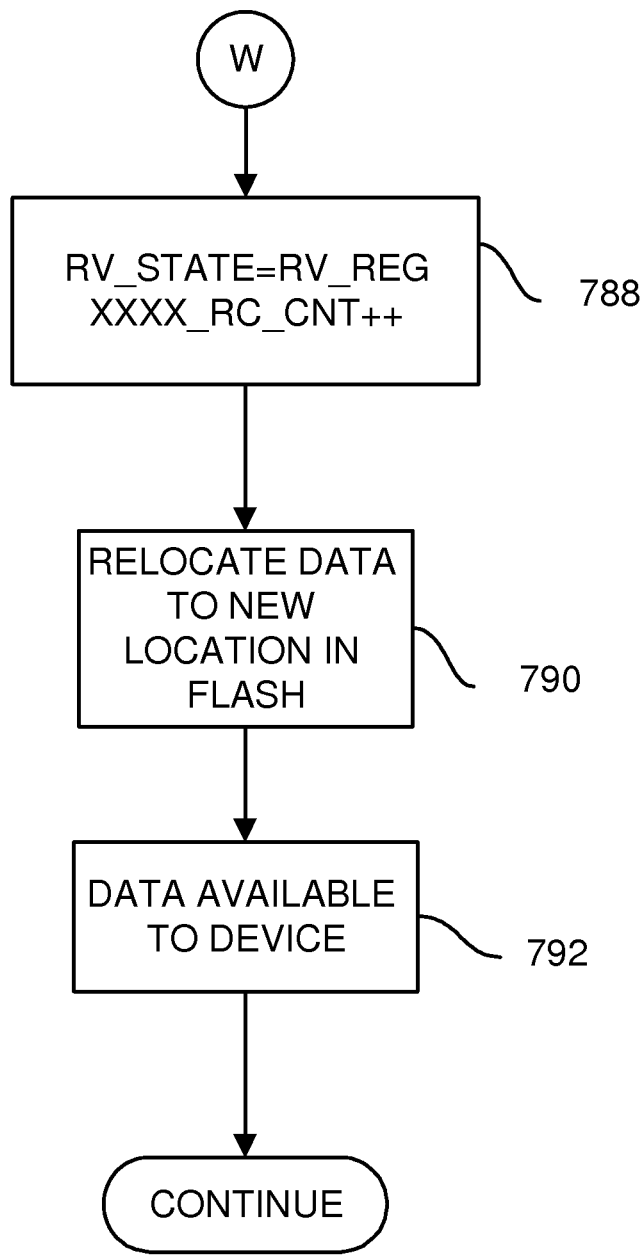

FIGS. 24A-B show a Multi-Level reference voltage shift routine. When reference voltage shift routine 740 is called, parameter N is set to zero, step 770, and the current state of the reference voltage registers, RV_STATE, is copied to the current RV register settings, RV_REG, step 772. A command is written to flash memory using these reference voltage settings, step 774, and an ECC check is made, step 776. When the errors are not correctable, step 778, and the iteration parameter N has reached its maximum, 2M, step 780, then a fatal count is incremented, step 786. Reference voltage shift routine 740 failed. The reference voltage adjustments are either higher or lower compared with the nominal reference voltage. There are M levels for each higher or lower adjustment, for a 2M maximum.

Otherwise, iteration parameter N is incremented, step 782, and the next settings to try for the reference voltages are applied, step 784, and the routine performs the next iteration.

When the errors are correctable, step 778, in FIG. 24B the current iterations reference voltage settings RV_REG are copied and reference counters incremented, step 788. The data is relocated to a different location in flash, step 790, and the data is made available, step 792. When the data is corrupt according to a predefined level, it is moved to a new location to refresh the data to endure a next round of read/write interference time elapse. XXXX_RC_CNT is the reference voltage recovery count counter for each level of the flash memory, such as RVH1_RC_CNT, RVLm_RC_CNT, etc.

Figure 25:
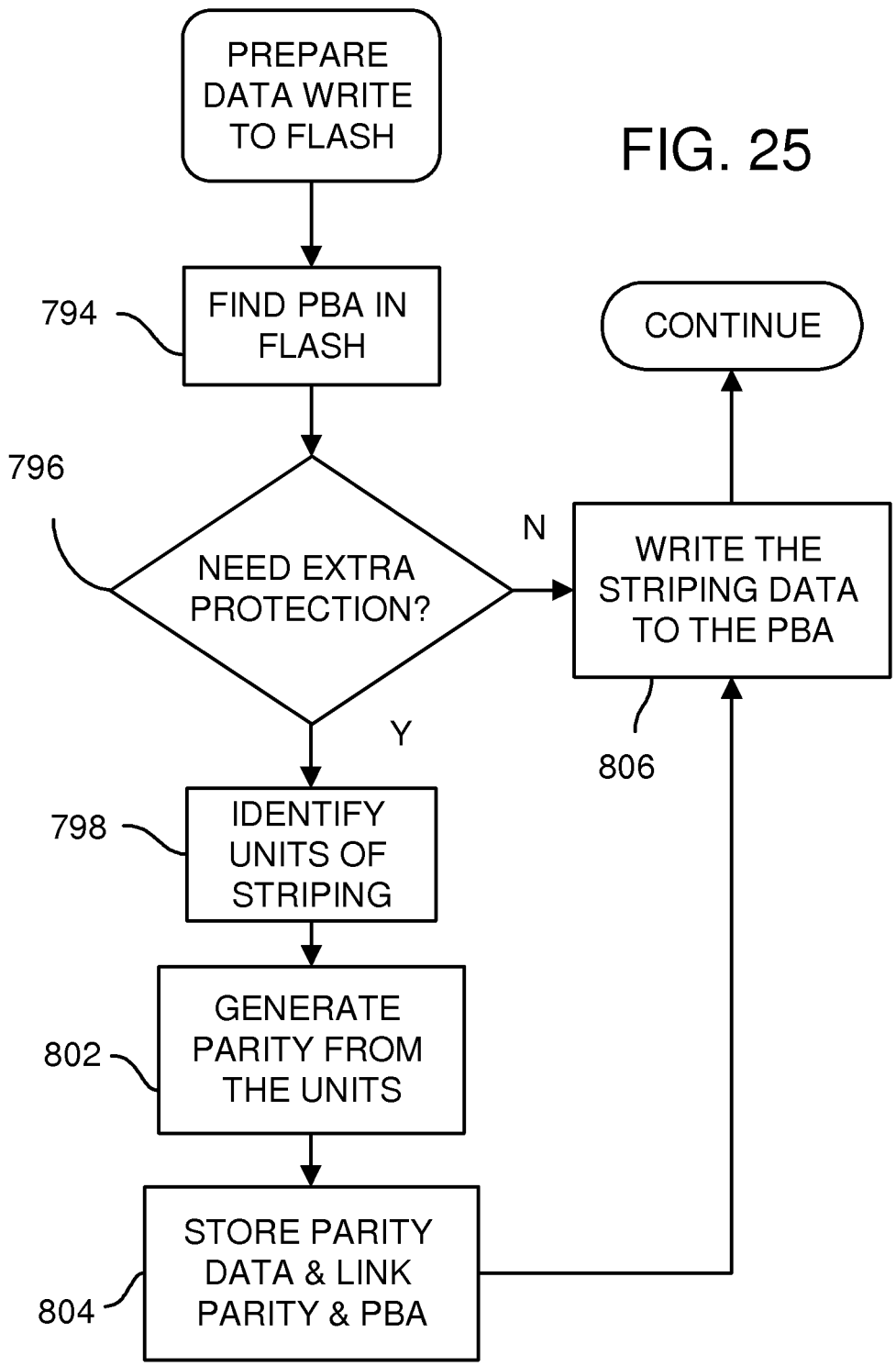
FIG. 25 shows a data write to flash with increased protection.

FIG. 25 shows a data write to flash with increased protection. The physical block PBA is located for the write data, such as by using lookup tables, step 794. When extra protection is needed, step 796, the units of striping are identified, step 798, and parity is generated from the striping data, step 802. The parity is stored and linked to the data, step 804. The striping data is then written to the PBA, step 806.

ALTERNATE EMBODIMENTS

Several other embodiments are contemplated by the inventors. For example, many encodings of the data-type bits and other status fields, pointers, etc. are possible. The data-type status bits do not need to be the first bits in an entry. Entries could be linked to entries in other tables, such as having a separate table for tags or valid bits. Temporary files could have a variety of extensions, and new extensions could be added to the list to search for. Temporary files created by well-known programs such as word processors and internet browsers have well-known files extensions, but additional extensions may be added at any time. These additional file extensions could be added through firmware updates to the control software for SSS controller 40.

The size of DRAM buffer used by each part of ETL may be fixed by the firmware of the SSD controller. The each part of ETL also can be dynamically adjusted by the controller firmware automatically or manually based on the usage or preference of the user. Due to the limited size of DRAM buffer 20, not all ETL functions may be accommodated in it at the same time. The various ETL functions may be adaptive to the real working environment. The controller may adjust the size used by each ETL to optimize the DRAM buffer. The adaptive adjustment can be done periodically based on the usage patterns of the device.

For a TLC flash device, the DRAM buffer can be substituted with NVRAM such as phase-change memory (PCM), ferroelectric random-access memory (FRAM), Magnetoresistive RAM (MRAM), Memristor, PRAM, Resistive RAM (RRAM), Racetrack memory, and nano RAM (NRAM) etc. The advantage of NVRAM is that all the ETL supported tables etc. may remain in NVRAM (no need to put in the flash memory) and other flash memory destined data (such as data write cache etc.) is retained even with power off, so the backup power circuit is no longer needed even when power is turned off suddenly. Tmp Etc. & Mapping table 140, and Read Cache & Mapping table 151 can be optionally discarded at the power down or at the next power up initialization. Other than MLC, the disadvantage of NVRAM is the cost. For MLC, the disadvantage is slow speed and limitations on write/erase times. The MLC can be derived from TLC by allocating part of TLC that only has strong pages programmed. Some of the ETL functions may be implemented in an SRAM in Smart Storage Switch Controller 40.

In the TLC flash device, the DRAM buffer also can be substituted with combinations such as DRAM+SRAM, DRAM+MLC, DRAM+PCRAM or DRAM+MRAM. When combinations of DRAM buffering is used such as DRAM+MLC, the ETL supported functions are managed in DRAM but some of them are stored in MLC. Some of the data in the DRAM buffer can be discarded eventually such as Tmp. Etc. & mapping table 140, read cache & mapping table 151, that are not moved to MLC when power is off. Tables and data that need to be kept when power is off such as block erase count table 164, Page Status Table 162, S.M.A.R.T. Data Collector 170 etc. need to be stored to MLC when power is turned off suddenly. Copying to MLC is faster compared to TLC flash memory. In case of server applications, Tmp Etc. & Mapping table 140, to Read Cache & Mapping table 151 cannot be discarded; those areas will be stored to MLC using power backup when power is turned off suddenly. Another way is to insure the data of interest in ETL of DRAM is copied to the MLC. In case of power off, a valid copy of data in ETL can be kept at MLC. At power up, those data in ETL can be loaded back to DRAM from MLC. The copying method can be modified by recording the minor differences which will reduce the amount of copying data and therefore reduce the writes to MLC.

DRAM+MLC or DRAM+SLC are not necessary to use different types of SLC/MLC/TLC. Instead, the MLC can be derived from the TLC by allocating a part of TLC that only has strong pages programmed. The SLC can be derived from MLC or TLC by allocating part of the MLC or TLC that only has strong pages programmed.

The endurance technologies described herein attempt to solve the endurance issues of NAND flash memory. There are several non-volatile memories, such as MRAM, PCM, RRAM, Memristors, NRAM, etc. which are using competing technologies to replace NAND flash memory.

The super-endurance flash drive can be combined with a Hard Disk Drive (HDD), with a super-endurance flash drive as the cache and HDD as storage. The super-endurance flash drive is of high endurance and is a better fit as a cache. The overall performance may improve for this hybrid device. Another way to insure the data of interest in ETL of DRAM is copying to the HDD. In case of power off, a valid copy of data in ETL can be kept in HDD. At power up, those data in ETL can be loaded back to DRAM from HDD. The copying method can be modified by recording the minor differences which will reduce the amount of copying data and therefore reduce the writes to HDD.

The boot image of the OS can be preloaded to the DRAM buffer to speed up the host boot up. Once the boot up process ends, the DRAM buffer is released for later normal operation.

The dirty DRAM buffer must be written to flash memory when the host is in sleep or stand-by mode. The dirty DRAM buffer can be written to flash memory when the user of the host is logged out.

The grouping of write data is not limited to a page as a unit. Grouping data can be in a larger unit such as multiple-pages and whole block, etc.

While categorization of the data-type of a host access has been described as comparing the logical address from the host to one or more address ranges, this compare may compared only a portion of the logical address to ranges that represent the address ranges. Data types could also be identified by parsing the host write data for certain formats, such as a FAT format or a FDB format. Earlier host writes in a sequence could also be checked for their data formats. The FAT file system has been used as an example. FDB/FAT are the meta data of the FAT file system. Other file systems such as LINUX, Apple OS, and Android etc., have their own meta data with different names but are equivalents.

Each block may be divided into multi-page zones. For example, a block may have 16 pages and 4 zones, with 4 pages per zone. Some of the mapping may be for zones rather than for individual pages or blocks in this alternative embodiment. Alternatively, in a special case, there can be one page per zone. Fewer mapping entries are needed with zone-mode than for page-mode, since each zone is multiple pages.

The upper bits of the logical-sector address (LSA) from the host may select a cluster or district. All of the entries in a mapping table may be for the same district. When the district number from the LSA matches the district number of all the entries in the mapping table, the LBA from the LSA selects an entry in the mapping table. Hybrid or multi-level mapping tables may also be used. Since the LBA ranges for the FAT1/2 are known, the table contents data type bits "100" can be omitted. The Mapping table can have a granularity of block or page.

Copying of blocks for relocation is less frequent with page mapping since the sequential-writing rules of the non-SLC flash are violated less often in page mode than in block mode. This increases the endurance of the flash system and increases performance.

The mapping tables may be located in an extended address space, and may use virtual addresses or illegal addresses that are greater than the largest address in a user address space. Pages may remain in the host's page order or may be remapped to any page location. In another embodiment such as for data center applications, the paging and temporary files can be treated as normal user data to simplify the controller operation but with the expense of flash endurance. The endurance spare/swap area can provide extended over-provisioning by using DRAM buffer 20 as endurance spare/swap buffer instead of using flash memory 30. The compression function can be optionally turned off in situations when the host is already providing a compression function. In other embodiments, the controller can treat the paging file as user data file to simplify the controller function.

Many variations of the block diagrams are possible. A ROM such as an EEPROM could be connected to or part of a controller and be dedicated to storing firmware for a virtual storage processor. This firmware could also be stored in the main flash modules. The Host interface bus can be a Serial AT-Attachment (SATA) bus, a Peripheral Components Interconnect Express (PCIe) bus, a compact flash (CF) bus, or a Universal-Serial-Bus (USB), a Firewire 1394 bus, a Fibre Channel (FC) bus, Thunderbolt, etc. Internal buses may use standards such as for a Serial AT-Attachment (SATA) bus, an integrated device electronics (IDE) bus, a Peripheral Components Interconnect Express (PCIe) bus, a compact flash (CF) bus, a Universal-Serial-Bus (USB), a Secure Digital (SD) bus, a Multi-Media Card (MMC) bus, a Firewire 1394 bus, a Fibre Channel (FC) bus, various Ethernet buses, etc. SCFD can include SLC or MLC flash only or can be combined SLC/MLC flash.

The flash memory may be embedded on a motherboard or SSD board or could be on separate modules. Capacitors, buffers, resistors, and other components may be added. The smart storage switch controller may be integrated on the motherboard or on a separate board or module. Flash memory can be integrated with the smart storage switch controller or with raw-NAND flash memory chips as a single-chip device or a plug-in module or board.

Using multiple levels of controllers, such as in a president-governor arrangement of controllers, the controllers in the smart storage switch may be less complex than would be required for a single level of control for wear-leveling, bad-block management, re-mapping, caching, power management, etc. Less expensive hardware may be used in the smart storage switch controller, such as using an 8051 processor for a controller or a virtual storage processor or a smart storage transaction manager, rather than a more powerful processor core such as a an Advanced RISC Machine ARM-9 CPU core. For a certain applications, a more powerful processor is considered.

Different numbers and arrangements of flash storage blocks can connect to the smart storage switch. Rather than use a LBA storage bus interface or differential serial packet buses, other serial buses such as synchronous Double-Data-Rate (DDR), ONFI, Toggle NAND, a differential serial packet data bus, a legacy flash interface, etc.

Mode logic could sense the state of a pin only at power-on rather than sense the state of a dedicated pin. A certain combination or sequence of states of pins could be used to initiate a mode change, or an internal register such as a configuration register could set the mode. A multi-bus-protocol chip could have an additional personality pin to select which serial-bus interface to use, or could have programmable registers that set the mode to hub or switch mode.

A transaction manager, controllers, processes, and functions can be implemented in a variety of ways. Functions and processes can be programmed and executed by a CPU or other processor, or can be implemented in dedicated hardware, firmware, or in some combination. Many partitionings of the functions can be substituted. The smart storage switch controller may be hardware, or may include firmware or software or combinations thereof.

Overall system reliability is greatly improved by employing Parity/ECC with multiple flash channels, and stripping data segments into a plurality of NVM blocks. For example, a ninth flash chip can be used with the flash memory interface. The Parity of the other eight flash chips is written to this ninth flash chip to provide extra protection of data in case one of the eight flash chips encounters a fatal read error. However, it may require the usage of a CPU engine with a DDR/SDRAM cache in order to meet the computing power requirement of the complex ECC/Parity calculation and generation. Another benefit is that, even if one flash block or flash module is damaged, data may be recoverable, or the smart storage switch can initiate a "Fault Recovery" or "Auto-Rebuild" process to insert a new flash module, and to recover or to rebuild the "Lost" or "Damaged" data. The overall system fault tolerance is significantly improved.

The flash cell's floating gate is programmed by injection of electrons into it. The flash memory controls the injection of electrons at page write so that it stays within two reference voltage levels. The NAND flash structure's bit-lines are connected to a string of 32 cells and each cell is also connected to 32 different word-lines. After a cell is written with data, any write and read to the adjacent cells will cause interference to the cell. The interference will either inject or remove electrons from the floating gate of the cell. A long period of time will also affect the number of electrons in the floating gate of the cell. Due to the changing of the quantity of electrons in the floating gate, the output voltage level will shift accordingly when read. If the output voltage level shifts across the reference voltage boundary, the read result will be wrong.

Wider or narrower data buses and flash-memory chips could be substituted, such as with 16 or 32-bit data channels. Alternate bus architectures with nested or segmented buses could be used internal or external to the smart storage switch. Two or more internal buses can be used in the smart storage switch to increase throughput. More complex switch fabrics can be substituted for the internal or external bus.

Data striping can be done in a variety of ways, as can parity and error-correction code (ECC). Packet re-ordering can be adjusted depending on the data arrangement used to prevent re-ordering for overlapping memory locations. The smart switch can be integrated with other components or can be a stand-alone chip.

Additional pipeline or temporary buffers and FIFO's could be added. For example, a host FIFO in smart storage switch controller 40 may be part of controller 40, or may be stored in buffer RAM. Separate page buffers could be provided in each channel. A clock source could be added.

A single package, a single chip, or a multi-chip package may contain one or more of the plurality of channels of flash memory and/or the smart storage switch. The invention is not limited to the usage of SCFD. SCFD can be replace with any kind of nonvolatile device with nonvolatile flash memory and a controller.

A MLC-based flash device may have four MLC flash chips with two parallel data channels, but different combinations may be used to form other flash modules, for example, four, eight or more data channels, or eight, sixteen or more MLC chips. The flash devices and channels may be in chains, branches, or arrays. For example, a branch of 4 flash devices could connect as a chain to the smart storage switch. Other size aggregation or partition schemes may be used for different access of the memory.

The host can be a PC motherboard or other PC platform, a mobile communication device, a personal digital assistant (PDA), a digital camera, a production tool or tester, a combination device, or other device. The host bus or host-device interface can be SATA, PCIE, Thunderbolt, SD, USB, eMMC, iSSD, or other host bus, while the internal bus to a flash module can be PATA, multi-channel SSD using multiple SD/MMC, compact flash (CF), USB, or other interfaces in parallel. A flash module could be a standard PCB or may be a multi-chip modules packaged in a TSOP, BGA, LGA, COB, PIP, SIP, CSP, POP, or Multi-Chip-Package (MCP) packages and may include raw-NAND flash memory chips or raw-NAND flash memory chips may be in separate flash chips, or other kinds of NVM flash memory. The internal bus may be fully or partially shared or may be separate buses. The SSD system may use a circuit board with other components such as LED indicators, capacitors, resistors, etc. Power management may be added at one or more levels.

Directional terms such as upper, lower, up, down, top, bottom, etc. are relative and changeable as the system or data is rotated, flipped over, etc. These terms are useful for describing the device but are not intended to be absolutes.

NVM flash memory may be on a flash module that may have a packaged controller and flash die in a single chip package that can be integrated either onto a PCBA, or directly onto the motherboard to further simplify the assembly, lower the manufacturing cost and reduce the overall thickness. Flash chips could also be used with other embodiments including the open frame cards.

Rather than use smart storage switch controller 40 only for flash-memory storage, additional features may be added. For example, a music player may include a controller for playing audio from MP3 data stored in the flash memory. An audio jack may be added to the device to allow a user to plug in headphones to listen to the music. A wireless transmitter such as a BlueTooth transmitter may be added to the device to connect to wireless headphones rather than using the audio jack. Infrared transmitters such as for IrDA may also be added. A BlueTooth transceiver to a wireless mouse, PDA, keyboard, printer, digital camera, MP3 player, or other wireless device may also be added. The BlueTooth transceiver could replace the connector as the primary connector. A Bluetooth adapter device could have a connector, a RF (Radio Frequency) transceiver, a baseband controller, an antenna, a flash memory (EEPROM), a voltage regulator, a crystal, a LED (Light Emitted Diode), resistors, capacitors and inductors. These components may be mounted on the PCB before being enclosed into a plastic or metallic enclosure.

The size of data such as sectors, pages, and blocks may vary. A sector may have 512 bytes, a page may have 16 sectors, and a block may have 128 pages as one of many examples.

The write data in the ETL alternatively can be packed and logged one-by-one to the data write cache as a page unit by the flash controller. The packed data size from the host can be either a large size such as more than a stripe-ready unit or a small size such as less than a sector. A header is added the show the relation of the data to the LBA from host. A separate packed table maps the LBA from the host to the offset location of the data and header in the stripe-ready unit of the data write cache. The data write cache can have a capacity of more than two stripe-ready units in size. When the data write cache is full or an elapsed time is reached, a selected stripe-ready unit will be moved to the flash memory from the data write cache. The packed table maps the LBA from the host to the offset location of the data and header in the stripe-ready unit of the flash memory. In the case of overwriting old data from host, if the packed data is still in the data write cache, the old data can be discarded by moving the packed data up and appending the new updated data into the data write cache and updating the packed table. Otherwise, if the packed data is in the flash memory, the new and old data will be compared and a delta data will be generated to show the difference. The delta data and its header will be appended to the data write cache. The new header will also include the previous old data location. The packed table will map the LBA to the delta data position.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An Endurance Translation Layer (ETL) method to increase endurance of a flash memory that has a specified erase-cycle lifetime comprising:

creating an ETL in a dynamic-random-access memory (DRAM) buffer that is controlled by a controller and using the ETL to provide temporary storage to reduce flash wear;
creating a spare/swap area in the DRAM buffer;
operating a controller to use the spare/swap area in the DRAM buffer to merge valid data in a flash memory with new data to generate combined data; and
writing the combined data to the flash memory;
creating a page status table in the DRAM buffer;
operating the controller to use the page status table in the DRAM buffer to record the status of each flash page;
when a flash block is erased, setting the page status of each page in the flash block to an empty page;
when a page is written, changing the page status to a used page;
when the host data writes to a same Logical Page Address, writing data to a new flash page and setting the page status for an old page to a deleted/trimmed page;
when a trim command is received from the host, setting a corresponding page status to a deleted/trimmed page;
when the page is identified as a bad page, setting the page status to a bad page;
during a garbage collection process, not moving pages indicated as deleted/trimmed pages to a new flash block;
creating a spare/swap area in the DRAM buffer;
operating the controller to use the spare/swap area in the DRAM buffer to merge valid data in flash memory and new data to generate combined data;
wherein the page status of each page in a targeted block is examined from the page status table;
wherein valid data page has the page status indicating as a used page; the page status not indicating as a bad page, an empty page, or a trimmed page;
writing the combined data to the flash memory;
whereby a spare/swap function is performed by the controller using the DRAM buffer rather than the flash memory,
whereby a spare/swap function is performed by the controller using the DRAM buffer rather than the flash memory.

2. The Endurance Translation Layer (ETL) method of claim 1 further comprising:
providing wear-leveling control to flash blocks in the flash memory;
when the controller needs a flash block to write data to through a spare/swap area of the DRAM buffer, checking a block status/erase count table, and selecting a lowest erase count flash block from a list of blocks with an empty block status;
wherein a highest erase count flash block is not selected.

3. The Endurance Translation Layer (ETL) method of claim 1 further comprising:
providing wear-leveling control to flash blocks in the flash memory;
when a device is idle and a maximum erase count has reached a predetermined threshold, selecting a group of targeted used blocks with lowest erase counts and an equal number of targeted empty blocks with highest erase counts using a block status/erase count table, copying data from a lowest erase count flash block to a highest erase count flash block through a spare/swap area of the DRAM buffer, and erasing the lowest erase count flash block;
recycling the lowest erase count flash block;
minimizing a delta of an erase count of each block.

4. An Endurance Translation Layer (ETL) method to increase endurance of a flash memory that has a specified erase-cycle lifetime comprising:
creating an ETL in a dynamic-random-access memory (DRAM) buffer that is controlled by a controller and using the ETL to provide temporary storage to reduce flash wear;
creating a spare/swap area in the DRAM buffer;
operating a controller to use the spare/swap area in the DRAM buffer to merge valid data in a flash memory with new data to generate combined data; and
writing the combined data to the flash memory;
whereby a spare/swap function is performed by the controller using the DRAM buffer rather than the flash memory;
creating a plurality of sub-sector mapping tables stored in the DRAM buffer and accessed by the controller, each sub-sector mapping table comprising a plurality of sector entries selected by a sector number within a page;
wherein a sector entry comprises:
a partial-sector bit that indicates when the entry is a full-sector entry for a full sector of data for the host and when the entry is a partial-sector entry for a) partial sector of data from the host;
a page pointer that points to a page location in the DRAM buffer that stores the full sector of data or the partial sector of data;
when the entry is a full-sector entry, a sector identifier that identifies a sector within the page location;
when the entry is a partial-sector entry, a byte offset that identifies a starting byte location within the page location, and a length that indicates a length of the partial sector of data;
wherein full-sector entries and partial-sector entries are stored in the plurality of sub-sector mapping tables.

5. An Endurance Translation Layer (ETL) method to increase endurance of a flash memory that has a specified erase-cycle lifetime comprising:
creating an ETL in a dynamic-random-access memory (DRAM) buffer that is controlled by a controller and using the ETL to provide temporary storage to reduce flash wear;
creating a spare/swap area in the DRAM buffer;
operating a controller to use the spare/swap area in the DRAM buffer to merge valid data in a flash memory with new data to generate combined data; and
writing the combined data to the flash memory;
whereby a spare/swap function is performed by the controller using the DRAM buffer rather than the flash memory;
creating a mapping table;
wherein an entry in the mapping table comprises:
data-type bits that indicate a type of data stored for the logical address that selected the entry;
a pointer that points to a location in the DRAM buffer when a full page of host data is stored in the DRAM buffer, or points to a location in the flash memory when the full page of host data is stored in the flash memory, wherein the pointer points to a location in the DRAM buffer that stores a sub-sector mapping table in the plurality of sub-sector mapping tables when the host data is a partial page of data;
wherein the data-type bits indicate a data type that is selected from the group consisting of:
a File Allocation Table (FAT) entry;
a File Descriptor Block (FDB) entry;

a paging file created by a memory manager on the host that swaps data from a main memory on the host to a flash drive;

a temporary file identified by a file extension in a FAT entry that indicates a temporary file created by a program executing on the host, the temporary file being deletable upon power off/loss; and a user file that stores user or application data for a user of the host;

wherein the controller allows user files to be copied to the flash memory but prevents temporary files from being written to the flash memory, whereby flash wear is reduced by preventing temporary files from being written to the flash memory.

6. An Endurance Translation Layer (ETL) method to increase endurance of a flash memory that has a low specified erase-cycle lifetime comprising:

creating an ETL in a dynamic-random-access memory (DRAM) buffer that is controlled by a controller and using the ETL to provide temporary storage to reduce flash wear;

creating a spare/swap area in the DRAM buffer;

operating a controller to use the spare/swap area in the DRAM buffer to merge valid data in a flash memory with new data to generate combined data; and writing the combined data to the flash memory;

whereby a spare/swap function is performed by the controller using the DRAM buffer rather than the flash memory;

activating a bad block manager when a block in the flash memory is erased to generate an erased block:

counting a number of un-erased bits in a page in the erased block;

when the number of un-erased bits exceeds a lower threshold and does not exceed a higher threshold, marking the page as a protected page and increasing a number of error-correction code (ECC) bits stored for the protected page;

when the number of un-erased bits exceeds the higher threshold, marking the page as a bad page and not storing host data in the bad page;

repeating the counting and the page marking for all pages in the erased block;

counting a number of bad pages in the erased block;

when the erased block has a number of bad pages that exceeds a block threshold, marking the erased block as a bad block and not storing host data in any pages in the bad block.

7. The Endurance Translation Layer (ETL) method of claim 6 further comprising:

using a data split manager to identify a data-type to be a non-temporary data-type or a temporary data type; and using a backup power supply to power the DRAM buffer and the flash memory and the controller when power is lost, the backup power supply having a sufficient capacity for the controller to copy non-temporary data in the ETL to the flash memory according to a policy.

8. The Endurance Translation Layer (ETL) method of claim 6 further comprising:

controlling various functions using a packed manager;

managing a data write cache stored in the DRAM buffer;

writing a first write data from the host and a header to a beginning of the data write cache;

writing a new write data from the host and a header next to a previous data in the data write cache;

wherein when an updated write data is received from the host and an old data is in the data write cache, the controller discarding the old data and its header and moving a dirty data behind a location that stored the old data and then appending the updated write data and its header;

wherein when the dirty data has a size of more than a stripe-ready unit and the data write cache is full, the controller writing the stripe-ready unit to the flash memory.

9. The Endurance Translation Layer (ETL) method of claim 6 further comprising:

creating a data write cache area in the DRAM buffer;

recording an access frequency for each Logical-Block Address (LBA);

wherein when the access frequency is larger than a predefined value, the LBA is categorized as a Frequent Accessed (FA), otherwise the LBA is categorized as a Non-Frequent Accessed (NFA);

when the accessed LBA is categorized as a FA, storing data in a FA cache area;

when the accessed LBA is categorized as a NFA, storing data in a NFA cache area;

wherein the NFA cache area has a higher priority to be written to the flash memory and to be overwritten by other FA or NFA LBA accesses.

10. An Endurance Translation Layer (ETL) method to increase endurance of a flash memory that has a low specified erase-cycle lifetime comprising:

creating an ETL in a dynamic-random-access memory (DRAM) buffer that is controlled by a controller and using the ETL to provide temporary storage to reduce flash wear;

creating a spare/swap area in the DRAM buffer;

operating a controller to use the spare/swap area in the DRAM buffer to merge valid data in a flash memory with new data to generate combined data; and writing the combined data to the flash memory;

whereby a spare/swap function is performed by the controller using the DRAM buffer rather than the flash memory;

using the controller to manage a data write cache stored in the DRAM buffer;

operating an in-line compression circuit and compressing the host writes, for adding a header to compressed data, and updating a compressed mapping table;

wherein the controller further comprises various compress algorithms;

selecting an adequate algorithm to compress write data based on type of data set;

when a data set has an identical data set existing, using the compressed mapping table and pointing to the same compressed data set;

when a data set has a similar data set existing, using the compressed mapping table and pointing to the same compressed data plus using a pointer to point to the delta data;

when a data set has no similar data set existing, moving the compressed data to the DRAM buffer and updating a pointer in the compressed mapping table;

when a data size is not reduced after compression, retaining the original data;

whereby a size of write data is reduced, resulting in fewer writes to the flash memory to prolong flash endurance.

* * * * *